(12) United States Patent
Hayashi

(10) Patent No.: US 9,786,738 B2
(45) Date of Patent: Oct. 10, 2017

(54) SEMICONDUCTOR DEVICE WITH WELL RESISTOR AND ALTERNATED INSULATING AND ACTIVE REGIONS BETWEEN INPUT AND OUTPUT TERMINALS

(71) Applicant: Renesas Electronics Corporation, Kanagawa (JP)

(72) Inventor: Kiyoshi Hayashi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/807,757

(22) Filed: Jul. 23, 2015

(65) Prior Publication Data

US 2016/0049470 A1     Feb. 18, 2016

(30) Foreign Application Priority Data

Aug. 13, 2014  (JP) .................................. 2014-164811

(51) Int. Cl.
*H01L 27/08* (2006.01)
*H01L 27/06* (2006.01)
(Continued)

(52) U.S. Cl.
CPC .... *H01L 29/0653* (2013.01); *H01L 21/76224* (2013.01); *H01L 27/0629* (2013.01);
(Continued)

(58) Field of Classification Search
None
See application file for complete search history.

(56) References Cited

U.S. PATENT DOCUMENTS

| 7,557,429 B2 * | 7/2009 | Suzuki | ............. H01L 21/76229 257/536 |
| 7,898,032 B2 * | 3/2011 | Suzuki | ................ H01L 27/0629 257/350 |

(Continued)

FOREIGN PATENT DOCUMENTS

| JP | 2006-13233 A | 1/2006 |
| JP | 2008-21962 A | 1/2008 |

*Primary Examiner* — Marc Armand
*Assistant Examiner* — Younes Boulghassoul
(74) *Attorney, Agent, or Firm* — McDermott Will & Emery LLP

(57) ABSTRACT

A semiconductor device including a well resistance element of high accuracy and high withstand voltage and a method of manufacturing the semiconductor device are provided. The semiconductor device includes a semiconductor substrate, a well region, an input terminal, an output terminal, a separation insulating film, and an active region. The input terminal and the output terminal are electrically coupled to the well region. The separation insulating film is arranged to be in contact with the upper surface of the well region in an intermediate region between the input terminal and the output terminal. The active region is arranged to be in contact with the upper surface of the well region. The separation insulating film and the active region in the intermediate region have an elongated shape in plan view. In the intermediate region, a plurality of separation insulating films and a plurality of active regions are alternately and repeatedly arranged.

11 Claims, 55 Drawing Sheets

(51) Int. Cl.
*H01L 29/06* (2006.01)
*H01L 29/10* (2006.01)
*H01L 29/417* (2006.01)
*H01L 21/762* (2006.01)
*H01L 49/02* (2006.01)

(52) U.S. Cl.
CPC .......... *H01L 28/20* (2013.01); *H01L 29/0692* (2013.01); *H01L 29/1095* (2013.01); *H01L 29/41758* (2013.01)

(56) References Cited

U.S. PATENT DOCUMENTS

| | | | |
|---|---|---|---|
| 7,944,000 B2 * | 5/2011 | Ohtsuka | H01L 27/0802 257/344 |
| 8,691,673 B2 * | 4/2014 | Chuang | H01L 21/31055 257/E21.057 |
| 2015/0187583 A1 * | 7/2015 | Montgomery | H01L 21/266 438/238 |
| 2016/0276287 A1 * | 9/2016 | Iwabuchi | H01L 23/5223 |

\* cited by examiner

SEMICONDUCTOR DEVICE WITH WELL RESISTOR AND ALTERNATED INSULATING AND ACTIVE REGIONS BETWEEN INPUT AND OUTPUT TERMINALS

CROSS-REFERENCE TO RELATED APPLICATION

The disclosure of Japanese Patent Application No. 2014-164811 filed on Aug. 13, 2014 including the specification, drawings and abstract is incorporated herein by reference in its entirety.

BACKGROUND

The present invention relates to a semiconductor device and a method of manufacturing the same, and more particularly to a semiconductor device including a resistance element formed by a well region and a separation insulating film and a method of manufacturing the same.

RELATED ART

A resistance element, in particular, a well resistance element including a well region is used in many semiconductor integrated circuits as a high resistance element. For example, Japanese Patent Laid-Open No. 2008-21962 (Patent Literature 1) discloses a well resistance element having a structure in which a separation insulating film having a so-called STI (Shallow Trench Isolation) structure is formed on a main surface of a semiconductor substrate and a well region is formed immediately below the separation insulating film.

Further, for example, Japanese Patent Laid-Open No. 2006-13233 (Patent Literature 2) discloses a well resistance element having a structure in which a separation insulating film having the STI structure which is partially removed in a lattice shape in plan view is formed on a main surface of a semiconductor substrate and a well region is formed immediately below the separation insulating film.

SUMMARY

For example, if an area of the separation insulating film of the well resistance element having a configuration of Patent Literature 1 increases, when the upper surface of the separation insulating film is polished by CMP (Chemical Mechanical Polishing) to form the separation insulating film, flatness of the surface of the separation insulating film after polishing degrades due to a difference of polishing rate between an insulating film that forms the separation insulating film and an insulating film that forms a mask pattern to form the separation insulating film. If the surface of the separation insulating film after polishing has a curved shape by dishing, the depth of the well region immediately below the separation insulating film varies and the variation of resistance value of the well resistance element increases. Therefore, it is difficult to improve accuracy of the well resistance element.

Further, for example, in Patent Literature 2, the separation insulating film is partially removed in a lattice shape, so that the continuous length of the separation insulating film in a direction along the main surface of the semiconductor substrate is short. Therefore, it is considered that in Patent Literature 2, the occurrence of dishing after the polishing as in Patent Literature 1 is suppressed.

However, in Patent Literature 2, an electric current flowing from one terminal of a pair of terminals from which a voltage is applied to the well resistance element to the other terminal through the inside of the well resistance element enters into the high resistance separation insulating film, so that the electric current may alternately flow through the separation insulating film and a low resistance active region. Thereby, the current density in the well resistance element becomes partially uneven, so that there is a possibility that the electric current partially meanders or a partial concentration of electric field occurs and the withstand voltage of the well resistance element decreases. This may reduce the reliability of the well resistance element that is expected to function as a high resistance element for high voltage.

The other purposes and new features will become clear from the description of the present specification and the accompanying drawings.

A semiconductor device according to an embodiment includes a semiconductor substrate, a well region, an input terminal and an output terminal, a separation insulating film, and an active region. The input terminal and the output terminal are arranged over the semiconductor substrate so as to be electrically coupled to the well region formed in the semiconductor substrate. The separation insulating film is arranged to be in contact with the upper surface of the well region in an intermediate region between the input terminal and the output terminal in a direction along the main surface. The active region is arranged to be in contact with the upper surface of the well region in the semiconductor substrate. The separation insulating film and the active region in the intermediate region have an elongated shape in plan view. In the intermediate region, a plurality of separation insulating films and a plurality of active regions are arranged so that the separation insulating film and the active region are alternately and repeatedly arranged.

In a method of manufacturing a semiconductor device according to an embodiment, first, a plurality of grooves having an elongated shape in plan view is formed with a gap between them in a main surface of the semiconductor device by using a plurality of mask patterns. A separation insulating film is formed by burying an insulating film into the groove. A well region in contact with the lower surface of the separation insulating film in the semiconductor substrate and an active region in contact with the upper surface of the well region are formed. The input terminal and the output terminal are formed over the semiconductor substrate so as to be electrically coupled to the well region. In the intermediate region between the input terminal and the output terminal, the separation insulating film and the active region have elongated shapes in plan view. In the intermediate region, a plurality of separation insulating films and a plurality of active regions are formed so that the separation insulating film and the active region are alternately and repeatedly arranged.

According to an embodiment, it is possible to achieve high accuracy of a well resistance element by suppressing the dishing and stabilizing the resistance value of the well resistance element and to achieve suppression of decrease in withstand voltage due to electric field concentration of the well resistance element, so that it is possible to provide a semiconductor device including a well resistance element of high accuracy and high withstand voltage and a method of manufacturing the semiconductor device.

DETAILED DESCRIPTION

Hereinafter, embodiments will be described with reference to the drawings.

First Embodiment

First, a semiconductor device in a wafer state will be described as an embodiment.

Figure 1:
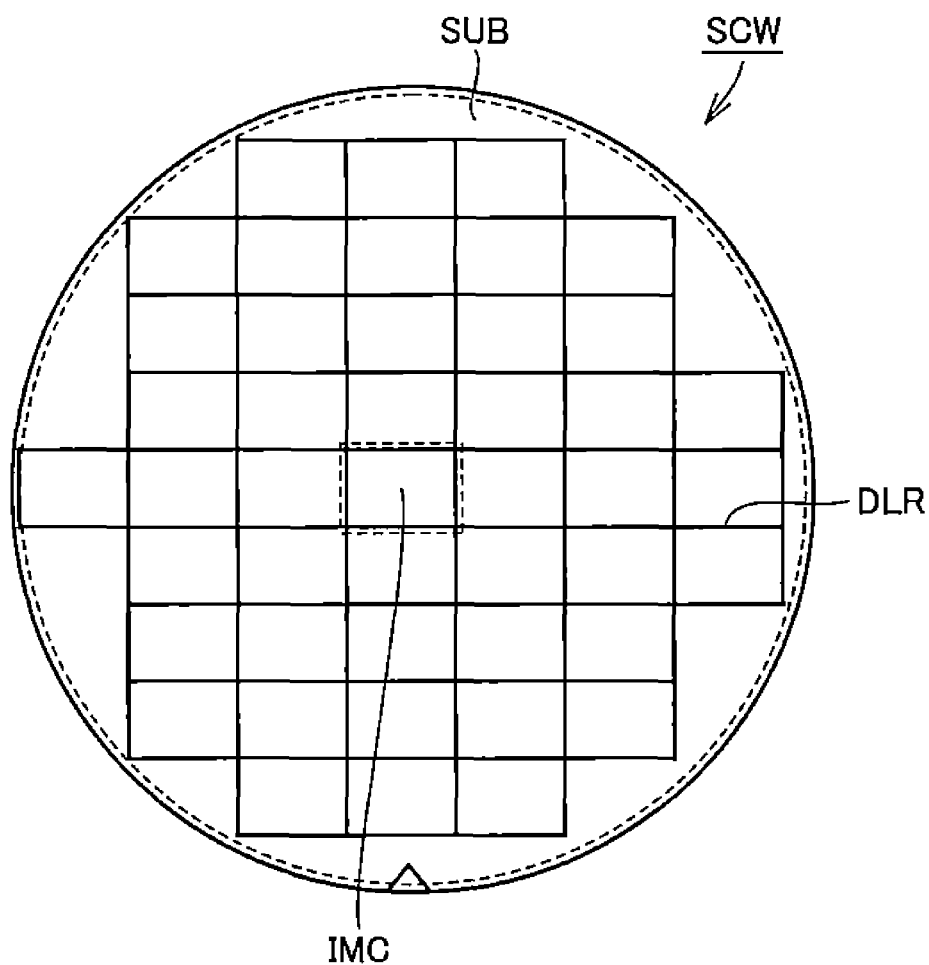
FIG. 1 is a schematic plan view showing a state of a wafer, which is a semiconductor device according to an embodiment.

With reference to FIG. 1, a plurality of chip regions IMC of an solid state image sensing element is formed in a semiconductor wafer SCW formed of a semiconductor substrate SUB. Each of the chip regions IMC has a rectangular planar shape and the chip regions IMC are arranged in a matrix shape. In the semiconductor wafer SCW, a dicing line region DLR is formed between the chip regions IMC. The semiconductor wafer SCW is diced by the dicing line region DLR, so that the semiconductor wafer SCW is divided into a plurality of semiconductor chips.

Figure 2:
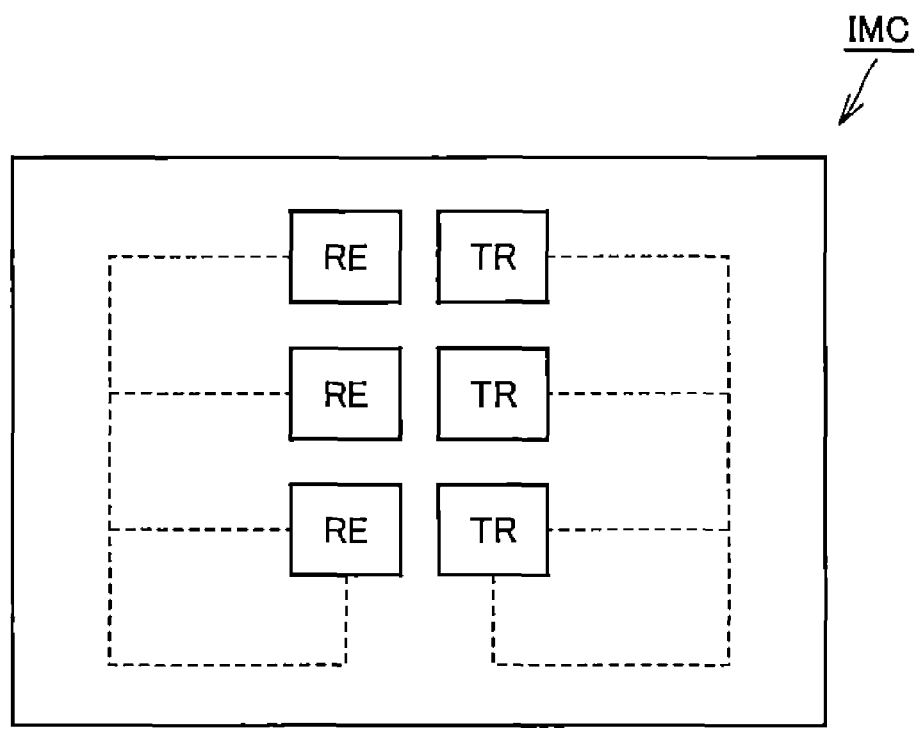
FIG. 2 is a schematic enlarged view of a region IMC surrounded by a dashed line in FIG. 1.

With reference to FIG. 2, in the chip region IMC that forms a divided semiconductor chip, for example, a resistance element region RE where a resistance element is arranged and a transistor region TR where a MOS (Metal Oxide Semiconductor) transistor used as a peripheral circuit is arranged are arranged. In FIG. 2, as an example, a plurality of resistance element regions RE and a plurality of transistor regions TR are arranged in different regions in a matrix shape. However, the arrangement is not limited to this.

Next, a well resistance element arranged in the resistance element region RE of the present embodiment will be described with reference to FIGS. 3 to 6.

With reference to FIGS. 3 to 6, the resistance element region RE of the present embodiment is formed in a silicon semiconductor substrate SUB containing, for example, p-type conductive impurities. The well resistance element in the resistance element region RE mainly includes a well region NWL, input-side contacts CT1 used as input terminals, output-side contacts CT2 used as output terminals, a separation insulating film SI, and active regions AR.

Figure 3:
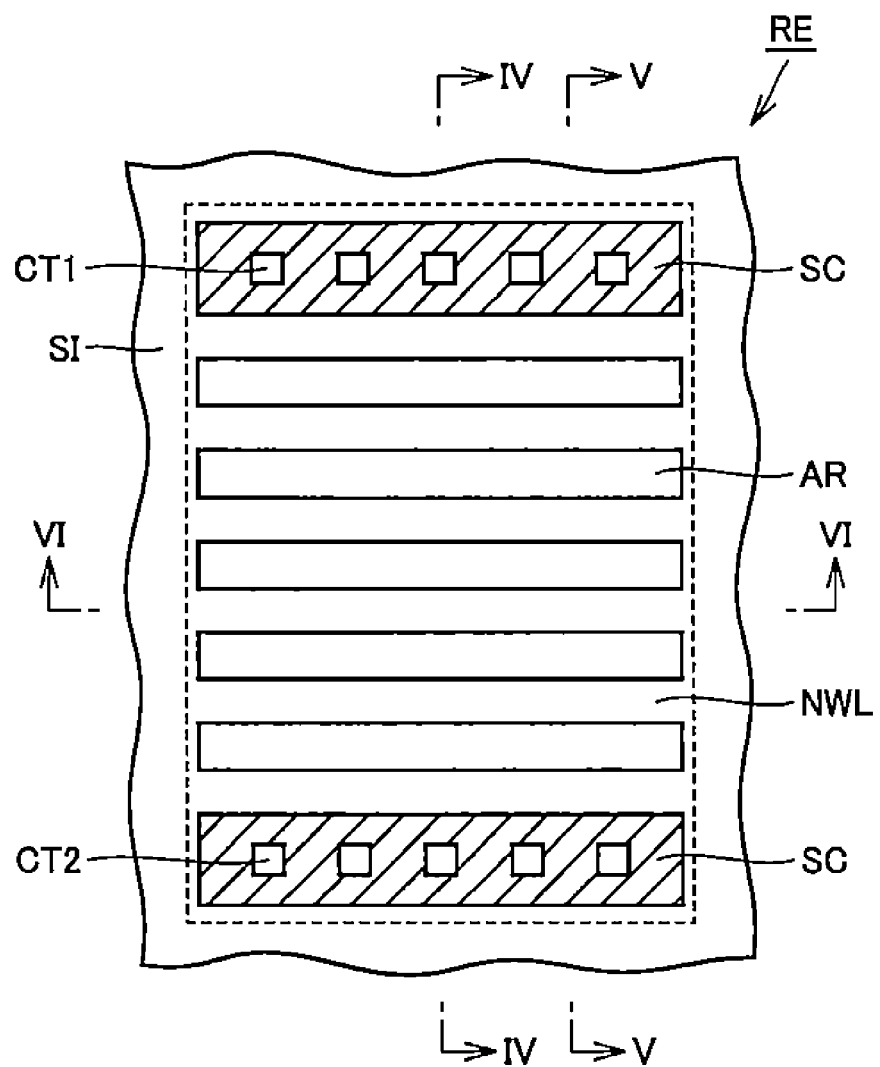
FIG. 3 is a schematic plan view showing a configuration of a resistance element region of a first embodiment.

The well region NWL is a region which is formed inside the semiconductor substrate SUB and which contains n-type conductive impurities. FIG. 3 shows that the well region NWL is formed to have a rectangular planar shape. However, the shape is not limited to a rectangular planar shape.

The input-side contact CT1 and the output-side contact CT2 are arranged over a main surface S1 of the semiconductor substrate SUB so as to be electrically coupled to the well region NWL. For example, a plurality of (here, five) input-side contacts CT1 and a plurality of (here, five) output-side contacts CT2 may be arranged in the horizontal direction of FIG. 3 with a gap between them. It is preferable that the number of the arranged input-side contacts CT1 and the number of the arranged output-side contacts CT2 are the same. Here, one of the input-side contacts CT1 and one of the output-side contacts CT2 are arranged to face each other in the vertical direction of FIG. 3. It is preferable that an electrical signal such as an electric current is transmitted and received between a pair of the input-side contact CT1 and the output-side contact CT2 that are arranged to face each other in the vertical direction of FIG. 3 in this way. However, it is not limited to this.

The separation insulating film SI is arranged around the well resistance element, so that the separation insulating film SI electrically separates the well resistance element from other elements around the well resistance element. Further, the separation insulating film SI is arranged in some regions in a central region (intermediate region) of the well resistance element between the input-side contact CT1 and the output-side contact CT2. Specifically, the separation insulating film SI in the intermediate region is arranged to be in contact with the upper surface of the well region NWL. A plurality of separation insulating films SI has an elongated shape (for example, a shape of a long rectangle) in plan view, which are arranged side by side with a gap between them. The separation insulating film SI in the intermediate region (in the well resistance element) is formed as the same layer as that of the separation insulating film SI around the well resistance element.

The active region AR is formed integrally with the well region NWL inside the semiconductor substrate SUB. In particular, the active region AR is a conductive region which contains n-type impurities and which extends upward above a boundary line indicated by a dotted line in FIGS. 4 and 5 and reaches the main surface S1 of the semiconductor substrate SUB. In other words, a conductive region containing n-type impurities above the boundary line is defined as the active region AR here, and a conductive region containing n-type impurities below the boundary line is defined as the well region NWL here.

For example, in the semiconductor substrate SUB immediately below the input-side contact CT1 and the output-side contact CT2, the active region AR is arranged through a silicide layer SC and a contact region CTR. The active region AR is arranged to be in contact with the upper surface of the well region NWL (because the active region AR is integrated with the well region NWL as described above).

The silicide layer SC and the contact region CTR are regions which are formed in regions close to the contact CT1 or CT2 (upper regions of FIGS. 4 and 5) in the active region AR and whose conductivity is increased. The silicide layer SC is a region which is formed on the uppermost surface of the active region AR (the uppermost surface of the semiconductor substrate SUB) in contact with the contact CT1 or CT2 and which is formed when a metallic material reacts with silicon included in the semiconductor substrate SUB. The contact region CTR is a region (n+ region) which is formed in a region immediately below the silicide layer SC in the active region AR so that the density of the n-type conductive impurities is increased. The contacts CT1 and CT2 are well electrically coupled with the well region NWL by the presence of the contact region CTR and the like whose conductivity is higher than that of the active region AR.

The active region AR in the intermediate region is arranged to be in contact with the upper surface of the well region NWL. A plurality of active regions AR has an elongated shape (for example, a shape of a long rectangle, in other words, a striped shape) in plan view, which are arranged side by side with a gap between them.

Therefore, in the intermediate region, a plurality of separation insulating films SI and a plurality of active regions AR, each of which has an elongated shape in plan view, are arranged so that the separation insulating film SI and the active region AR are alternately and repeatedly arranged in a direction perpendicular to a direction in which the separation insulating film SI and the active region AR extend. The separation insulating film SI and the active region AR, which are adjacent to each other in the direction in which the separation insulating films SI and the active regions AR are alternately arranged, are in contact with each other.

Although FIG. 3 shows that the length of the active region AR in the horizontal direction is substantially the same as that of the silicide layer SC, the active region AR may have any length. For example, the active region AR may be formed to have a length greater than that of the well region NWL in the horizontal direction.

In the present embodiment, in the region between the input-side contact CT1 and the output-side contact CT2, the separation insulating films SI and the active regions AR, which have a striped shape, are formed so that the heights of the uppermost surfaces of the separation insulating films SI and the active regions AR are substantially the same. In other words, in the region between the input-side contact CT1 and the output-side contact CT2, the separation insulating films SI and the active regions AR are formed so that the uppermost surfaces of the separation insulating films SI and the active regions AR form the same surface. The uppermost surface of the active region AR corresponds to the main surface S1 of the semiconductor substrate SUB, so that the separation insulating film SI is formed so that the uppermost surface of the separation insulating film SI is the same surface as the main surface S1 of the semiconductor substrate SUB (so that the uppermost surface of the separation insulating film SI and the main surface S1 of the active region AR (the semiconductor substrate SUB) are flush with each other).

In the present embodiment, in the region between the input-side contact CT1 and the output-side contact CT2, the separation insulating film SI and the active region AR are formed to extend in a direction (the horizontal direction of FIG. 3) perpendicular to a direction (the vertical direction of FIG. 3) connecting the input-side contact CT1 and the output-side contact CT2 in plan view.

The conductivity types of components included in the well resistance element described above may be reversed. For example, a well region containing p-type conductive impurities may be formed in a semiconductor substrate SUB containing n-type conductive impurities.

Here, a mechanism of the well resistance element, which functions as a resistance in the semiconductor device, will be described. When the well resistance element is driven, a voltage is applied between the input-side contact CT1 and the output-side contact CT2, so that an electric current flows from the input-side contact CT1 to the output-side contact CT2 mainly in the well region NWL. In particular, the present embodiment has a configuration in which the electric current passing through the silicide layer SC and the contact region CTR immediately below the input-side contact CT1 can automatically flow from the active region AR immediately below the contact region CTR into the well region NWL (because the circumference of the active region AR immediately below the contact region CTR is covered by the separation insulating film SI). The resistance value of the well resistance element depends in particular on the cross-sectional area and the shape of the well region NWL shown in the cross-sectional view in FIG. 6.

Next, a MOS transistor arranged in the transistor region TR will be described with reference to FIGS. 7 and 8.

Figure 7:
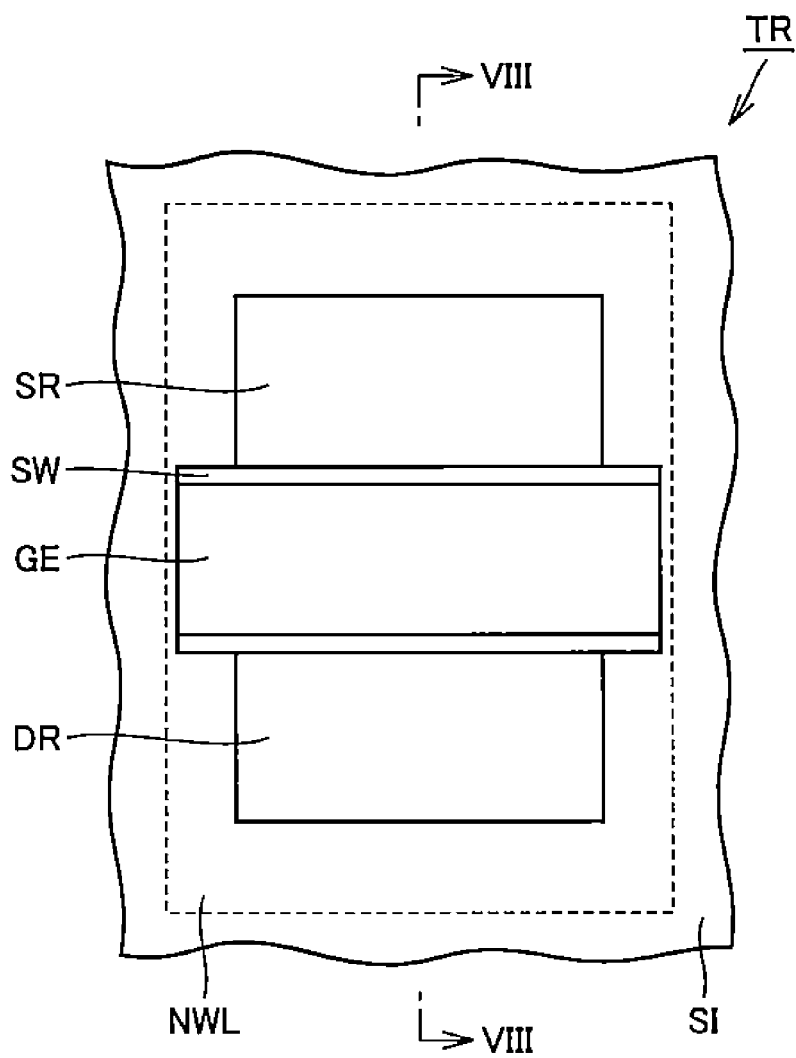
FIG. 7 is a schematic plan view showing a configuration of a transistor region of the first embodiment.
Figure 8:
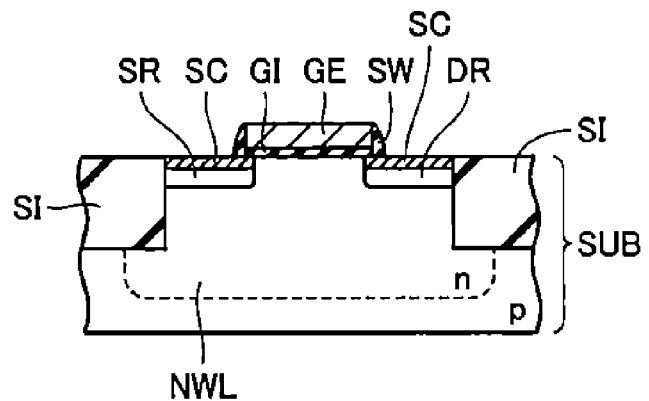
FIG. 8 is a schematic cross-sectional view taken along line VIII-VIII in FIG. 7.

With reference to FIGS. 7 and 8, the transistor region TR is also formed in the silicon semiconductor substrate SUB including, for example, p-type conductive impurities. The MOS transistor in the transistor region TR mainly includes a source region SR, a drain region DR, a gate insulating film GI, and a gate electrode GE. The source region SR and the drain region DR are arranged with a gap between them in the main surface of the semiconductor substrate SUB. Also in the transistor region TR, the well region NWL is formed inside the semiconductor substrate SUB, and the source region SR and the drain region DR are formed in the well region NWL. The silicide layer SC is formed on the surfaces of the source region SR and the drain region DR.

The gate electrode GE is formed over the main surface of the semiconductor substrate SUB, which is sandwiched by the source region SR and the drain region DR, through the gate insulating film GI. The MOS transistor is formed inside the separation insulating film SI which is the same layer as the separation insulating film SI in the resistance element region RE and which surrounds the circumference of the transistor region TR in plan view. A side wall insulating film SW is formed on a side wall of the gate electrode GE. The configuration of the MOS transistor formed in the transistor region TR described above is basically the same in each embodiment described below.

Next, a method of manufacturing a semiconductor device including the resistance element region RE and the transistor region TR of the present embodiment will be described with reference to FIGS. 9A to 17B.

Figure 9A:
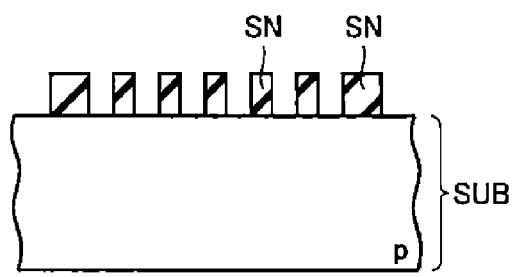
FIG. 9A is a schematic cross-sectional view showing a first process of a manufacturing method of the first embodiment in a region shown in the cross-sectional view in FIG. 4 in a region where a well resistance element should be formed.
Figure 9B:
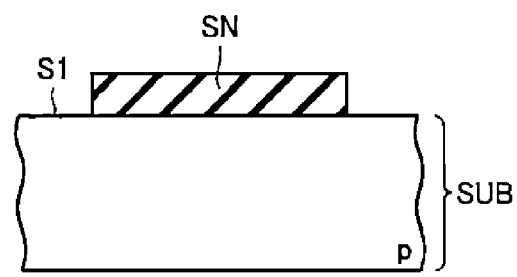
FIG. 9B is a schematic cross-sectional view showing the first process of the manufacturing method of the first embodiment in a region shown in the cross-sectional view in FIG. 8 in a region where a transistor should be formed.

With reference to FIGS. 9A and 9B, a thin film of, for example, a silicon nitride film to form a pattern is formed over, for example, the main surface S1 of the semiconductor substrate SUB which is formed of p-type silicon and which forms the chip region IMC (see FIG. 1). Next, the thin film of the silicon nitride film is formed as a plurality of mask patterns SN by a normal photoengraving technique (exposure and development) using photoresist as a photosensitizing agent not shown in the drawings and etching of the silicon nitride film. Here, basically, the mask pattern SN is formed immediately above a region where the active region AR is finally formed, and an opening of the mask pattern SN is formed immediately above a region other than the region where the active region AR is formed.

Figure 10A:
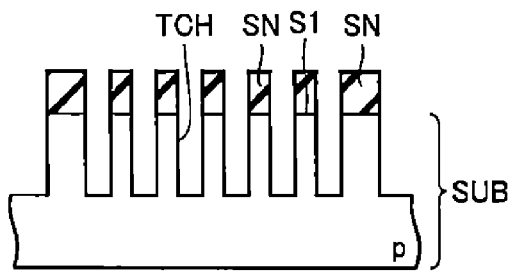
FIG. 10A is a schematic cross-sectional view showing a second process of the manufacturing method of the first embodiment in the region shown in the cross-sectional view in FIG. 4 in the region where the well resistance element should be formed.
Figure 10B:
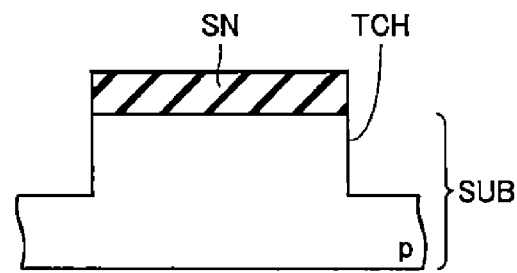
FIG. 10B is a schematic cross-sectional view showing the second process of the manufacturing method of the first embodiment in the region shown in the cross-sectional view in FIG. 8 in the region where the transistor should be formed.

With reference to FIGS. 10A and 10B, normal etching is performed by using the plurality of mask patterns SN as an etching mask. Thereby, the semiconductor substrate SUB is etched from the main surface S1 in the depth direction (the vertical direction in FIGS. 10A and 10B) of the semiconductor substrate SUB, so that a plurality of trenches TCH (grooves) is formed in the semiconductor substrate SUB. In particular, in the resistance element region RE shown in FIG. 10A, a plurality of the trenches TCH is formed with a gap between them in a direction along the main surface S1 (the horizontal direction in FIG. 10A). Therefore, a plurality of the trenches TCH having an elongated shape in plan view is formed with a gap between them in the same manner as a plurality of the separation insulating films SI, in particular, in the intermediate region in FIG. 3. The extending direction of the elongated shape of the trench TCH is a direction crossing a direction finally connecting the contact CT1 and the contact CT2. Also in the transistor region TR shown in FIG. 10B, a plurality of trenches TCH is formed in the semiconductor substrate SUB according to the shape of the mask pattern SN.

Figure 11A:
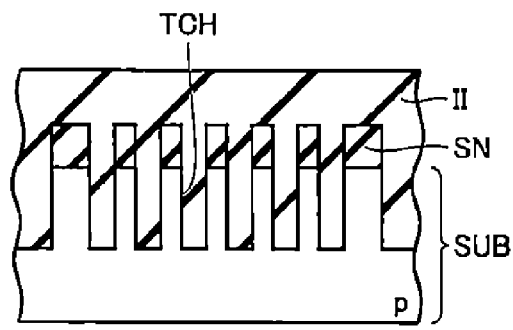
FIG. 11A is a schematic cross-sectional view showing a third process of the manufacturing method of the first embodiment in the region shown in the cross-sectional view in FIG. 4 in the region where the well resistance element should be formed.
Figure 11B:
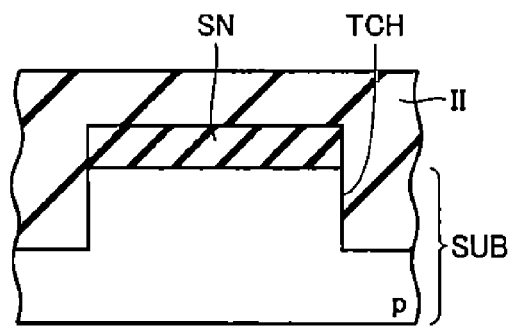
FIG. 11B is a schematic cross-sectional view showing the third process of the manufacturing method of the first embodiment in the region shown in the cross-sectional view in FIG. 8 in the region where the transistor should be formed.

With reference to FIGS. 11A and 11B, an insulating film II such as a silicon oxide film is formed by, for example, a normal CVD (Chemical Vapor Deposition) method over the main surface of the semiconductor substrate SUB so as to fill the inside of the trenches TCH and cover the surface of the mask patterns SN.

Figure 12A:
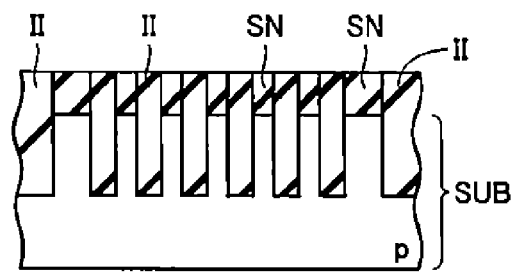
FIG. 12A is a schematic cross-sectional view showing a fourth process of the manufacturing method of the first embodiment in the region shown in the cross-sectional view in FIG. 4 in the region where the well resistance element should be formed.
Figure 12B:
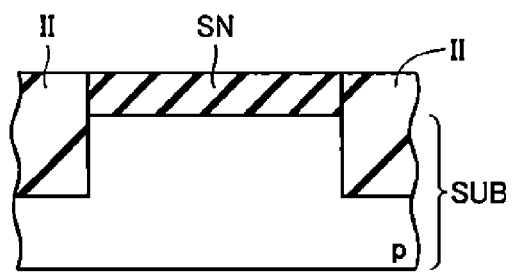
FIG. 12B is a schematic cross-sectional view showing the fourth process of the manufacturing method of the first embodiment in the region shown in the cross-sectional view in FIG. 8 in the region where the transistor should be formed.

With reference to FIGS. 12A and 12B, the insulating film II formed in the process of FIGS. 11A and 11B is removed, so that the upper surfaces of the mask patterns SN that have been covered by the insulating film II are exposed. Specifically, for example, the insulating film II is polished and removed by, for example, the CMP until the upper surfaces of the mask patterns SN are exposed and the upper surfaces of the exposed mask patterns SN and the insulating film II are flattened. When removing the insulating film II in the process described above, for example, normal etching using hydrofluoric acid may be performed instead of the polishing process described above.

Figure 13A:
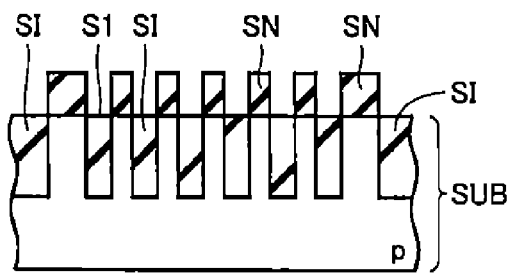
FIG. 13A is a schematic cross-sectional view showing a fifth process of the manufacturing method of the first embodiment in the region shown in the cross-sectional view in FIG. 4 in the region where the well resistance element should be formed.
Figure 13B:
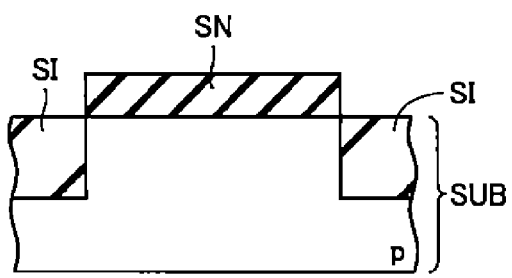
FIG. 13B is a schematic cross-sectional view showing the fifth process of the manufacturing method of the first embodiment in the region shown in the cross-sectional view in FIG. 8 in the region where the transistor should be formed.

With reference to FIGS. 13A and 13B, in regions whose vertical height in FIGS. 13A and 13B is the same as that of the mask patterns SN, the insulating film II adjacent to the mask pattern SN (in the horizontal direction in FIGS. 13A and 13B) is removed. Specifically, for example, in FIG. 13A, the insulating films II located between a plurality of mask patterns SN are removed. At this time, specifically, the insulating films II in the regions are removed by, for example, normal etching using hydrofluoric acid. In FIG. 13B, a pair of insulating films II adjacent to the central mask pattern SN is removed.

Thereby, the insulating films II become the separation insulating films SI whose uppermost surface has substantially the same height as the main surface S1 of the semiconductor substrate SUB (in the vertical direction of FIGS. 13A and 13B) and which are formed to fill the trenches TCH.

Figure 14A:
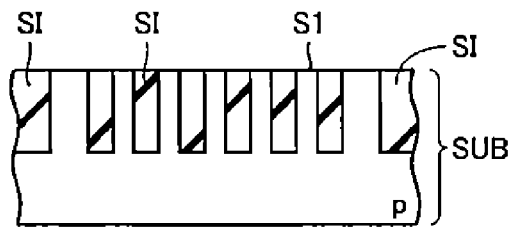
FIG. 14A is a schematic cross-sectional view showing a sixth process of the manufacturing method of the first embodiment in the region shown in the cross-sectional view in FIG. 4 in the region where the well resistance element should be formed.
Figure 14B:
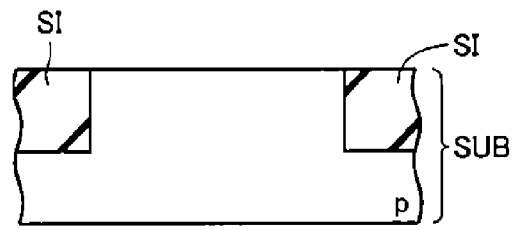
FIG. 14B is a schematic cross-sectional view showing the sixth process of the manufacturing method of the first embodiment in the region shown in the cross-sectional view in FIG. 8 in the region where the transistor should be formed.

With reference to FIGS. 14A and 14B, the mask patterns SN protruding above the separation insulating films SI are removed by the process of FIGS. 13A and 13B. Thereby, the separation insulating films SI and the semiconductor substrate SUB are formed so that the same surface, that is, the main surface S1, becomes the uppermost surface.

Figure 15A:
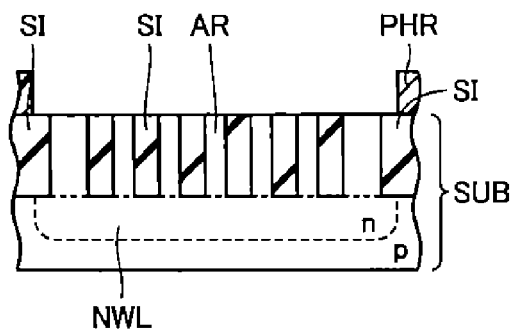
FIG. 15A is a schematic cross-sectional view showing a seventh process of the manufacturing method of the first embodiment in the region shown in the cross-sectional view in FIG. 4 in the region where the well resistance element should be formed.
Figure 15B:
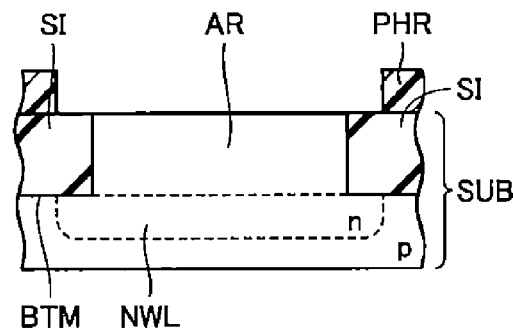
FIG. 15B is a schematic cross-sectional view showing the seventh process of the manufacturing method of the first embodiment in the region shown in the cross-sectional view in FIG. 8 in the region where the transistor should be formed.

With reference to FIGS. 15A and 15B, a pattern of photoresist PHR used as a photosensitizing agent is formed over the main surface S1 of the semiconductor substrate SUB by a normal photoengraving technique. It is preferable that the pattern of photoresist PHR is formed so as to cover a part of the upper surfaces of the separation insulating films SI, that is, substantially a region other than a region where the well region NWL is formed, or conversely so as to form an opening of the photoresist PHR is formed immediately above the region where the well region NWL is formed in the semiconductor substrate SUB regardless of the presence or absence of the separation insulating film SI.

Subsequently, n-type conductive impurities are introduced into the semiconductor substrate SUB by using a normal ion implantation technique using the pattern of photoresist PHR. Thereby, in the resistance element region RE and the transistor region TR, the semiconductor substrate SUB which is adjacent to the separation insulating films SI in the horizontal direction of FIGS. 15A and 15B (and whose height is the same as that of the separation insulating films SI) is formed as the active region AR containing n-type conductive impurities, and the well region NWL containing n-type conductive impurities is formed in a region below the lowest portion BTM of the separation insulating films SI in FIGS. 15A and 15B. Thereby, the well region NWL is formed so as to be in contact with the lower surfaces of the separation insulating films SI in the semiconductor substrate SUB, and the active region AR is formed so as to be in contact with the upper surface of the well region NWL in the semiconductor substrate SUB. From the above, the main surface S1 of the semiconductor substrate SUB becomes equal to the uppermost surface of the active region AR.

As a result, as shown in FIGS. 15A and 3, in the intermediate region, the separation insulating film SI and the active region AR are formed to have an elongated shape in plan view. In the intermediate region, a plurality of separation insulating films SI and a plurality of active regions AR are formed so that the separation insulating film SI and the active region AR are alternately and repeatedly arranged.

In the following drawings, the dashed line indicating the boundary between the active region AR and the well region NWL is omitted (the same goes for the drawings for explaining a manufacturing method in each embodiment described below).

Figure 16A:
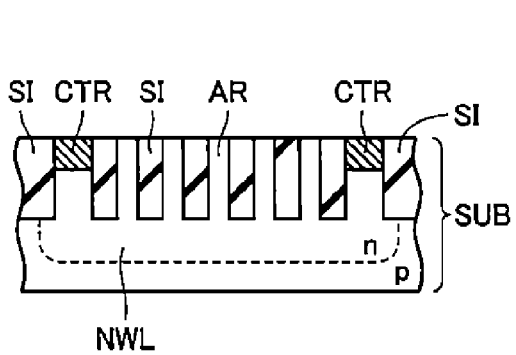
FIG. 16A is a schematic cross-sectional view showing an eighth process of the manufacturing method of the first embodiment in the region shown in the cross-sectional view in FIG. 4 in the region where the well resistance element should be formed.
Figure 16B:
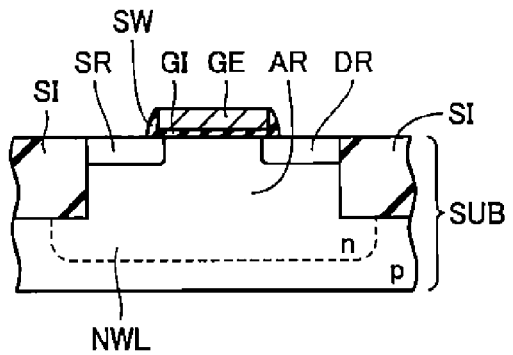
FIG. 16B is a schematic cross-sectional view showing the eighth process of the manufacturing method of the first embodiment in the region shown in the cross-sectional view in FIG. 8 in the region where the transistor should be formed.

With reference to FIG. 16B, in particular, in the transistor region TR, the gate insulating film GI and the gate electrode GE are formed over, for example, a part of the main surface of the semiconductor substrate SUB immediately above a region sandwiched by the separation insulating films SI, which is the well region NWL. Specifically, a silicon oxide film or the like is formed as a gate insulating film over the main surface of the semiconductor substrate SUB by, for example, a thermal oxidation processing method. A polycrystalline silicon film or the like to be the gate electrode is deposited over the gate insulating film. Thereafter, the gate insulating film and the polycrystalline silicon film or the like are patterned.

Thereafter, a region in which n-type conductive impurities are implanted into the active regions AR by a normal ion implantation technique by using the gate electrode GE as a mask and further using a mask which is not shown in FIG. 16A and which has openings immediately above part of the active regions AR in FIG. 16A (for example, in particular, the active regions AR at the left end and the right end shown in FIG. 16A). Thereby, the contact regions CTR are formed in the resistance element region in FIG. 16A, and the source region SR and the drain region DR are formed in the transistor region in FIG. 16B. It is preferable that the contact regions CTR, the source region SR, and the drain region DR are formed at the same time.

Thereafter, the side wall insulating film. SW that covers the side walls of the gate electrode GE and the gate insulating film GI in the transistor region is formed as needed and the ion implantation technique is further performed by using the side wall insulating film SW as a mask. Thereby, the impurity concentration in the source region SR and the drain region DR may be further increased.

Figure 17A:
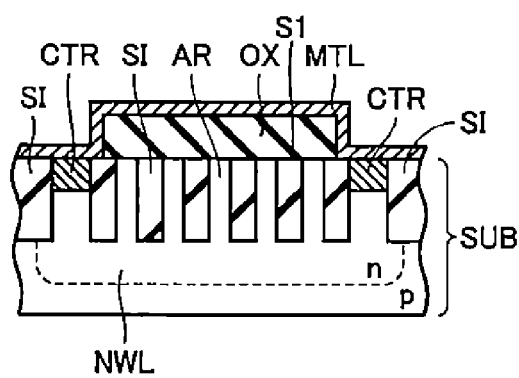
FIG. 17A is a schematic cross-sectional view showing a ninth process of the manufacturing method of the first embodiment in the region shown in the cross-sectional view in FIG. 4 in the region where the well resistance element should be formed.

With reference to FIG. 17A, a processing mask pattern OX formed of, for example, a silicon oxide film is formed so as to cover the active regions AR except for the active regions AR where the contact region CTR is formed and the separation insulating films SI in the intermediate region by a normal photoengraving technique and etching.

Figure 17B:
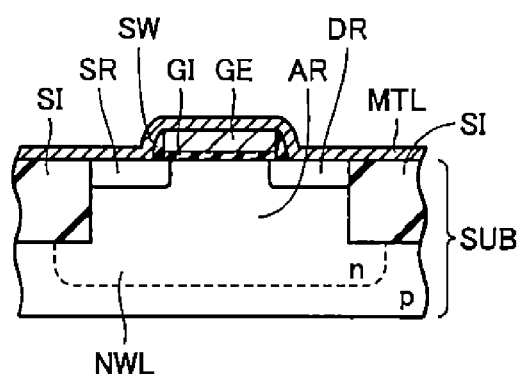
FIG. 17B is a schematic cross-sectional view showing the ninth process of the manufacturing method of the first embodiment in the region shown in the cross-sectional view in FIG. 8 in the region where the transistor should be formed.

With reference to FIGS. 17A and 17B, a metal film MTL is deposited over the main surface S1 of the semiconductor substrate SUB so as to cover the processing mask pattern OX in the resistance element region and the gate electrode GE and the side wall insulating film SW in the transistor region. The metal film MTL is formed by, for example, depositing a layered structure of cobalt and titanium nitride having a total thickness of more than several nm and less than several tens of nm by a metal thin film formation method such as a publicly known sputtering method. However, the material of the metal film MTL is not limited to the above material.

Figure 4:
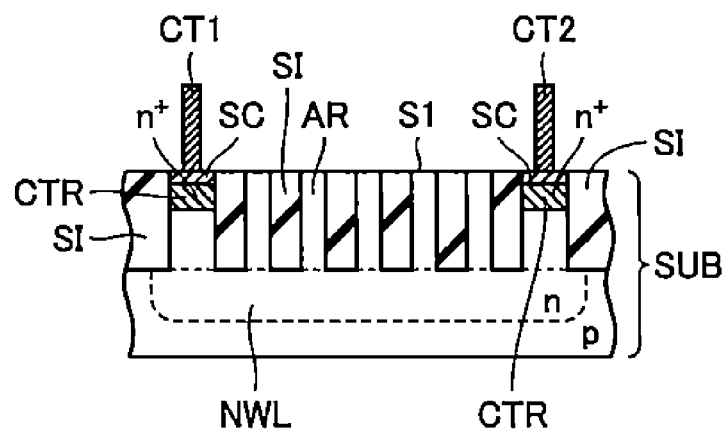
FIG. 4 is a schematic cross-sectional view taken along line IV-IV in FIG. 3.
Figure 5:
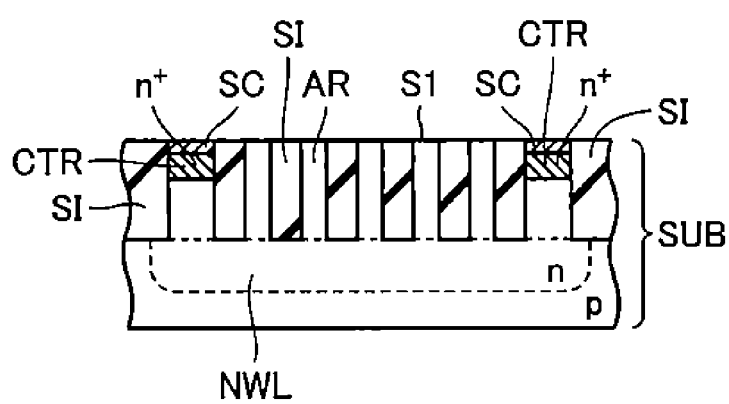
FIG. 5 is a schematic cross-sectional view taken along line V-V in FIG. 3.
Figure 6:
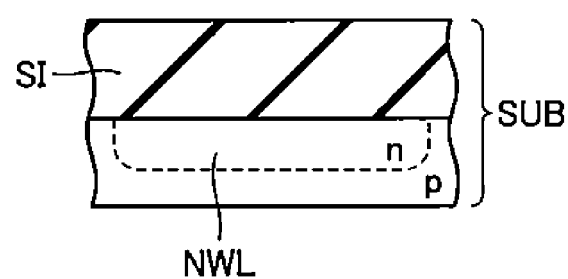
FIG. 6 is a schematic cross-sectional view taken along line VI-VI in FIG. 3.

With reference to FIGS. 4 and 8, subsequently, a so-called annealing treatment is performed in which the semiconductor substrate SUB is heated for tens of seconds to minutes at several hundreds of degrees in ° C. Then, atoms of silicon included in upper portions of the contact regions CTR including n-type impurities and upper portions of the source region SR and the drain region DR and atoms of cobalt and nickel included in the metal film MTL in contact with the contact regions CTR, the source region SR, and the drain region DR react together to form silicide layers SC. An unnecessary metal film MTL that has not reacted here is removed by etching.

Further, with reference to FIG. 4, in the resistance element region, the input-side contact CT1 and the output-side contact CT2 which are conductive thin film patterns are formed over, in particular, the upper surface of the silicide layers SC over the main surface S1 of the semiconductor substrate SUB by, for example, a sputtering method, a normal photoengraving technique, and etching. The input-side contact CT1 and the output-side contact CT2 are in contact with the silicide layer SC. The silicide layer SC, the contact region CTR, the active region AR immediately below the contact region CTR, and the well region NWL are in contact with each other. Therefore, the input-side contact CT1 and the output-side contact CT2 are formed to be electrically coupled to the well region NWL.

By the processes described above, the well resistance element is completed. The input-side contact CT1 and the output-side contact CT2 of the well resistance element are coupled to other electrode, terminal, and the like, so that a circuit in which an element including the other electrode and terminal is coupled to the well resistance element is formed.

Further, by the processes described above, the separation insulating film SI in the intermediate region is formed to extend in a direction crossing a direction connecting the input-side contact CT1 and the output-side contact CT2 in plan view. The contact region CTR is formed between the input-side contact CT1 and the well region NWL and between the output-side contact CT2 and the well region NWL.

Next, operation and effect of the present embodiment will be described with reference to comparative examples in FIGS. 71 to 81.

Figure 71:
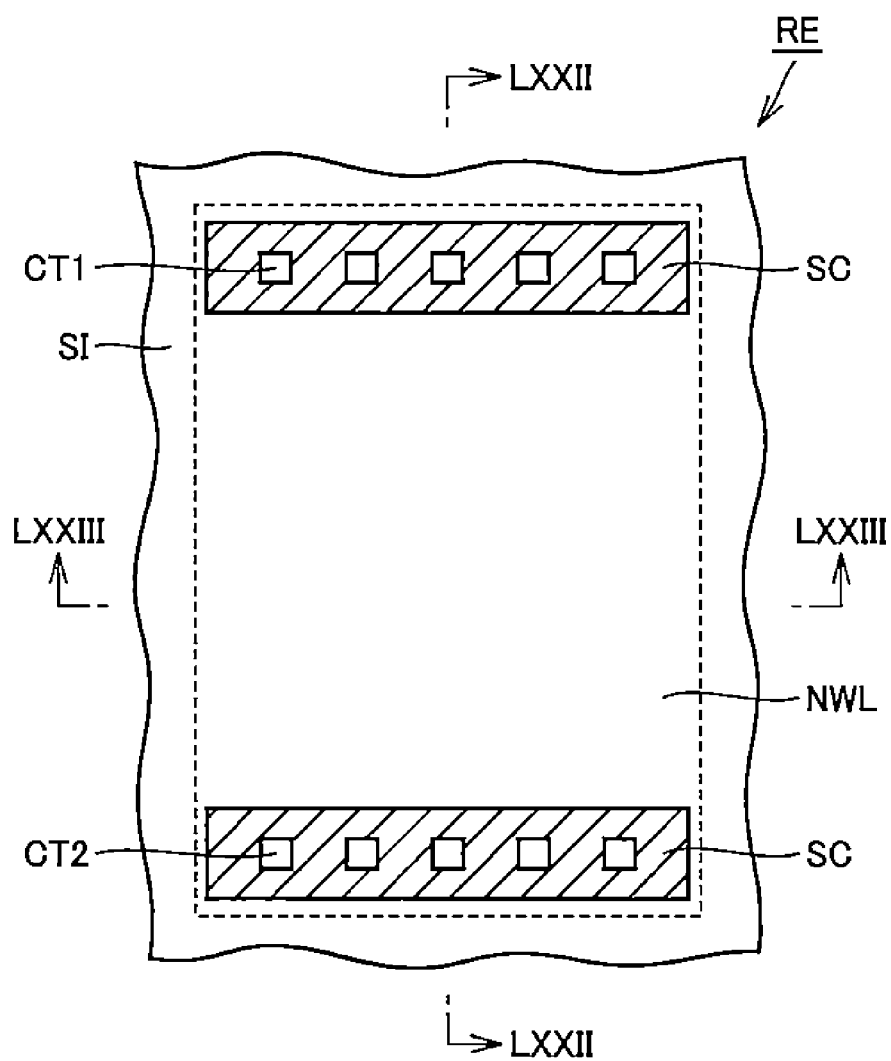
FIG. 71 is a schematic plan view showing a configuration of a resistance element region of a first comparative example.
Figure 72:
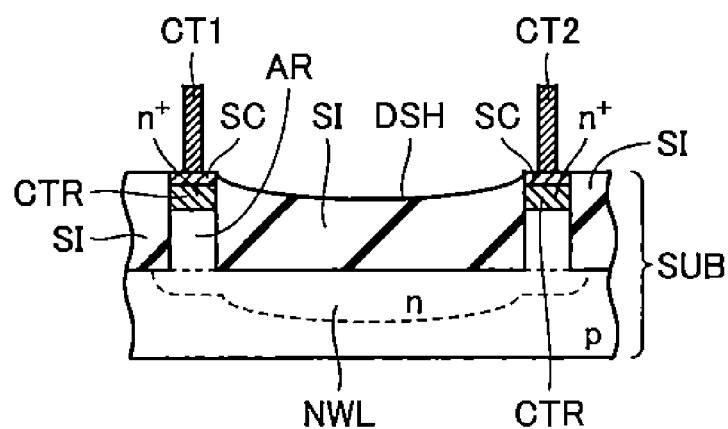
FIG. 72 is a schematic cross-sectional view taken along line LXXII-LXXII in FIG. 71.
Figure 73:
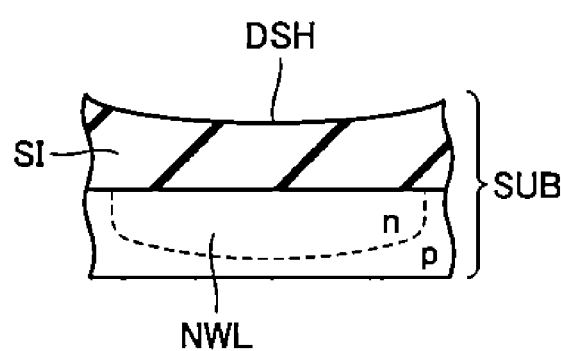
FIG. 73 is a schematic cross-sectional view taken along line LXXIII-LXXIII in FIG. 71.

With reference to FIGS. 71 to 73, a resistance element region RE of a first comparative example of the present embodiment is formed so that a p-type silicon semiconductor substrate SUB mainly includes the well region NWL, the contacts CT1 and CT2, the separation insulating film. SI, and the active region AR in the same manner as the resistance element region RE of the present embodiment. However, in the comparative example, no active region AR is arranged in the intermediate region between the input-side contact CT1 and the output-side contact CT2 (except for a region immediately below the silicide layer SC and the contact region CTR around the contacts CT1 and CT2 in plan view) and the entire surface of the region is covered by the separation insulating film SI.

In this case, as shown in FIGS. 72 and 73, in particular in the intermediate region, so-called dishing occurs in the uppermost surface DSH of the separation insulating film SI, so that the uppermost surface DSH may have a curved shape whose center portion is curved downward in the drawings as compared with the end portions. Here, a process in which in particular the curved uppermost surface DSH of the well resistance element of the first comparative example is formed will be described with reference to FIGS. 74 to 78.

Figure 74:
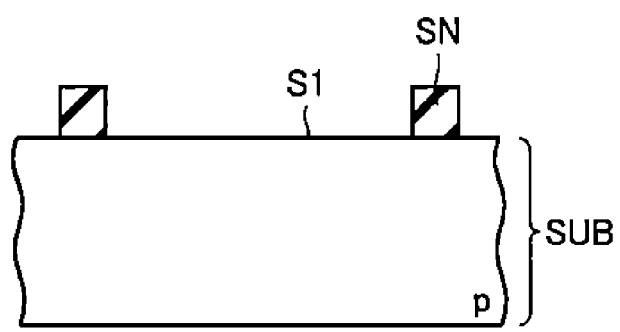
FIG. 74 is a schematic cross-sectional view showing a first process of a manufacturing method of the first comparative example in the region shown in the cross-sectional view in FIG. 72 in the region where a well resistance element should be formed.

With reference to FIG. 74, a plurality of mask patterns SN is formed over the main surface S1 of the semiconductor substrate SUB in the same manner as in the process of FIGS. 9A and 9B. Also here, the mask pattern SN is formed immediately above a region where the active region AR is finally formed. Therefore, the number of mask patterns SN is smaller than that of FIG. 9A, so that the distance between a pair of mask patterns SN adjacent to each other in FIG. 74 is significantly greater than that in FIG. 9A.

Figure 75:
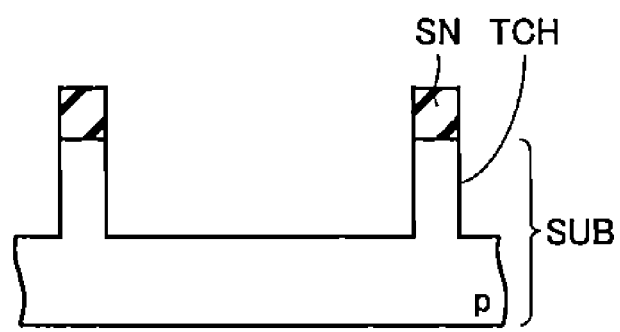
FIG. 75 is a schematic cross-sectional view showing a second process of the manufacturing method of the first comparative example in the region shown in the cross-sectional view in FIG. 72 in the region where the well resistance element should be formed.

With reference to FIG. 75, in the same manner as in the process of FIGS. 10A and 10B, normal etching is performed by using the mask patterns SN as an etching mask and a plurality of trenches TCH is formed in the semiconductor substrate SUB.

Figure 76:
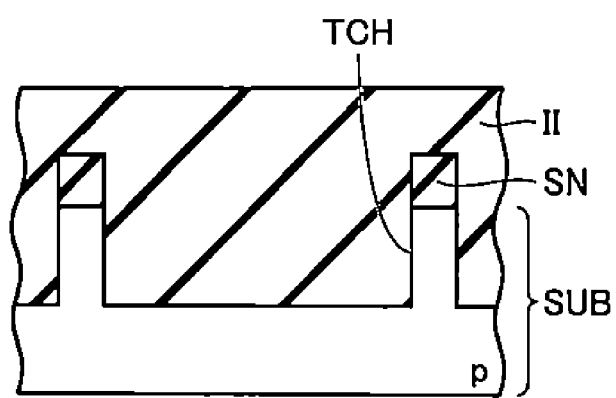
FIG. 76 is a schematic cross-sectional view showing a third process of the manufacturing method of the first comparative example in the region shown in the cross-sectional view in FIG. 72 in the region where the well resistance element should be formed.

With reference to FIG. 76, in the same manner as in the process of FIGS. 11A and 11B, the insulating film II is formed so as to fill the inside of the trenches TCH and cover the surface of the mask patterns SN.

Figure 77:
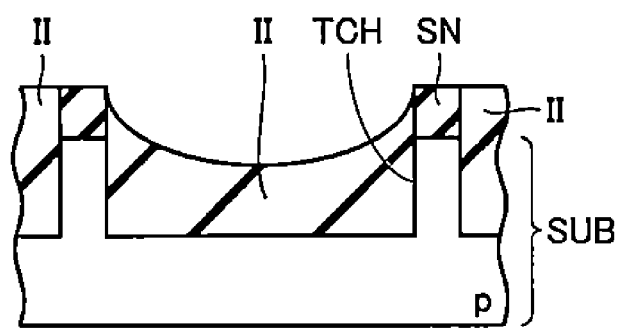
FIG. 77 is a schematic cross-sectional view showing a fourth process of the manufacturing method of the first comparative example in the region shown in the cross-sectional view in FIG. 72 in the region where the well resistance element should be formed.

With reference to FIG. 77, in the same manner as in the process of FIGS. 12A and 12B, the insulating film II is polished by, for example, the CMP until the upper surfaces of the mask patterns SN are exposed.

At this time, in a region between a pair of portions of the semiconductor substrate SUB which protrude upward in FIG. 77 (a region that will be the intermediate region later), the width of the region is large, so that the flatness of the uppermost surface of the insulating film II after polishing deteriorates due to a difference of polishing rate between the silicon oxide film of the insulating film II and the silicon nitride film of the mask pattern SN. Specifically, in the region described above, the uppermost surface of the insulating film II has a shape whose center portion is curved downward as compared with the end portions.

Figure 78:
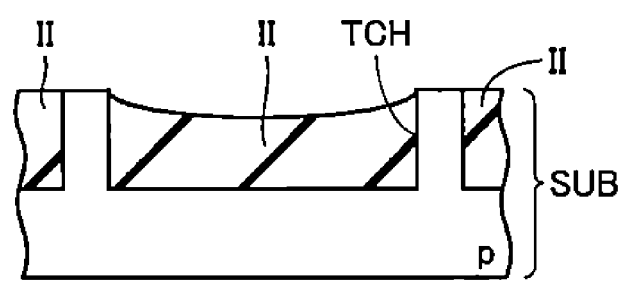
FIG. 78 is a schematic cross-sectional view showing a fifth process of the manufacturing method of the first comparative example in the region shown in the cross-sectional view in FIG. 72 in the region where the well resistance element should be formed.

With reference to FIG. 78, in the same manner as in the processes of FIGS. 13A, 13B, 14A, and 14B, subsequently, the insulating film II in a region whose height is the same as that of the mask pattern SN is removed by etching using hydrofluoric acid or the like. At this time, the uppermost surface has already been curved in the process of FIG. 77, so that if the amount etched downward from the uppermost surface is substantially the same in the entire region, the state in which the uppermost surface of the insulating film II is curved is maintained even after the etching.

Although not shown in the drawings, if the well region is formed by an ion implantation technique which is a post-process in the same manner as in the process of FIGS. 15A and 15B in a state in which the uppermost surface of the insulating film II is curved in a region to be the intermediate region, the shape of the well region to be formed varies. Specifically, in particular, the thickness (the depth in the vertical direction in FIG. 78) of the insulating film II varies for each position, so that the depth of the well region formed immediately below the insulating film II varies for each position. An electric current flows through the well region and thereby the well region functions as the well resistance element, so that if the cross-sectional shape such as the depth of the well region varies, the resistance value of the well resistance element varies and it is difficult to improve the accuracy of the resistance value of the well resistance element.

However, in the present embodiment, a plurality of separation insulating films SI and a plurality of active regions AR are formed so that the separation insulating film SI and the active region AR are alternately and repeatedly arranged in a region to be the intermediate region. Therefore, the width of the separation insulating film SI is smaller than that in the first comparative example. Thus, even when the uppermost surface of the separation insulating film SI is polished by the CMP in the manufacturing process as described above, the possibility that the uppermost surface of the separation insulating film SI forms dishing is reduced. Therefore, the variation of the depth of the well region formed immediately below the separation insulating film SI is also reduced, so that it is possible to improve the accuracy of the well resistance element.

Figure 79:
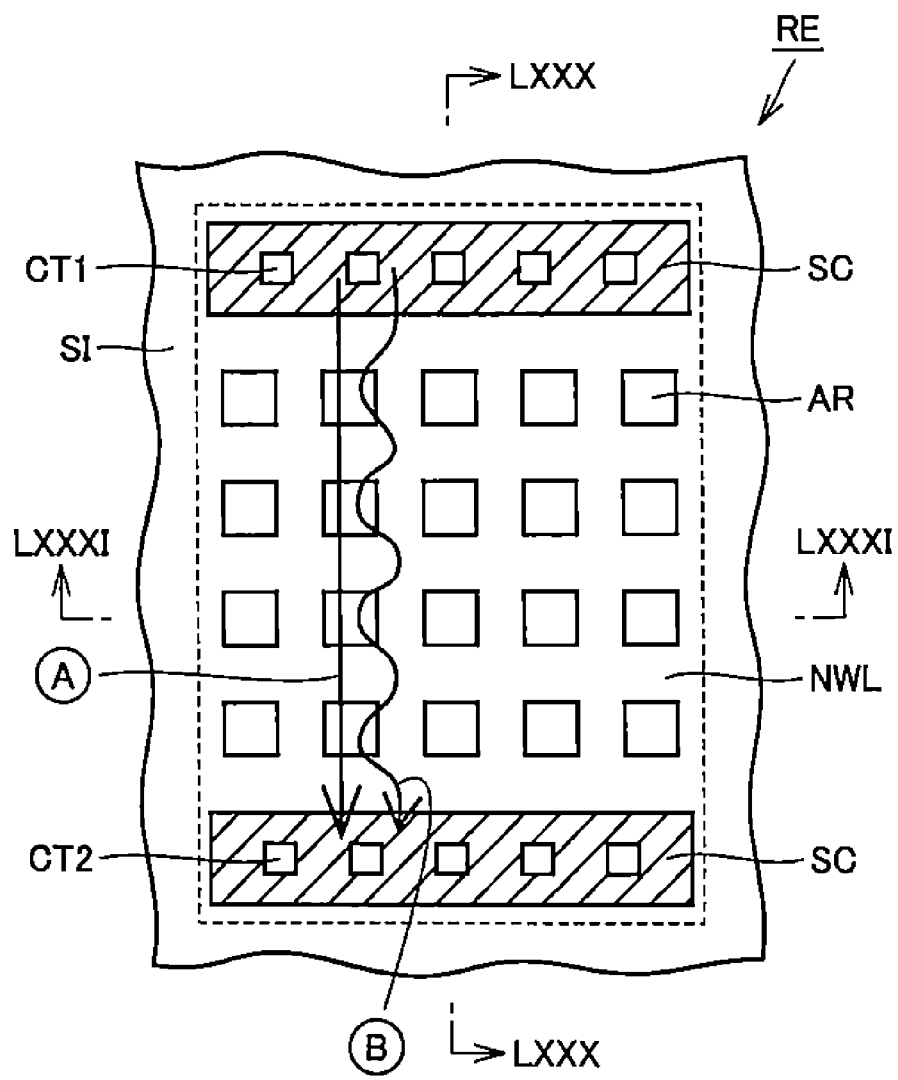
FIG. 79 is a schematic plan view showing a configuration of a resistance element region of a second comparative example.

Next, with reference to FIG. 79, in a resistance element region RE of a second comparative example of the present embodiment, a pattern of the small active regions AR are arranged in a matrix form with a gap between them in the intermediate region between the contact CT1 and the contact CT2. Five small active regions AR are arranged in both the vertical direction and the horizontal direction in FIG. 79, and a pattern of the small active regions AR has a square shape in plan view. However, the pattern of the small active regions AR is not limited to the above arrangement.

Figure 80:
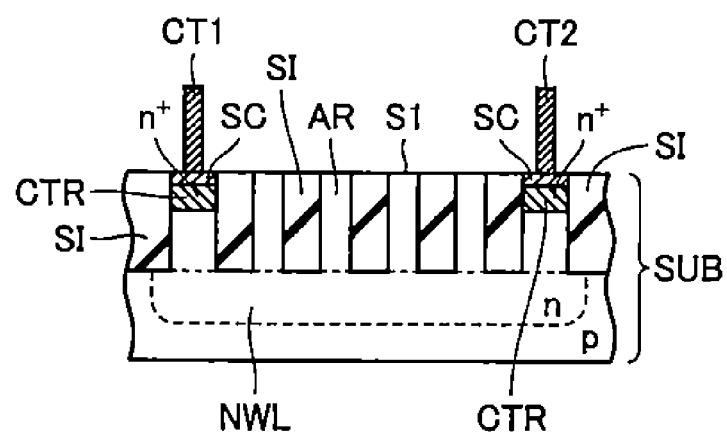
FIG. 80 is a schematic cross-sectional view taken along line LXXX-LXXX in FIG. 79.
Figure 81:
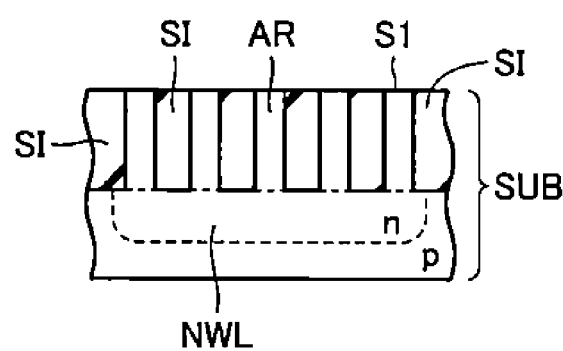
FIG. 81 is a schematic cross-sectional view taken along line LXXXI-LXXXI in FIG. 79.

With reference to FIGS. 80 and 81, the active region AR in the intermediate region is formed so as to extend from the main surface 51 of the semiconductor substrate SUB to the upper surface of the well region NWL in the vertical direction of FIGS. 80 and 81 in the same manner as the active region AR of the present embodiment and so as to be in contact with the separation insulating film SI adjacent to the active region AR, and is formed so as to contain, for example, n-type conductive impurities in the same manner as in the present embodiment.

In this case, as shown in FIGS. 80 and 81, the width of the separation insulating film SI in the intermediate region is smaller than that of the first comparative example in FIGS. 72 and 73. Therefore, even if the separation insulating film SI and the active regions AR in the intermediate region are formed by the same procedure as that of the first comparative example shown in FIGS. 74 to 78, the possibility that the dishing occurs in the uppermost surface of the insulating film II when the insulating film II is removed by the CMP is reduced. Therefore, the well resistance element of the second comparative example can reduce the variation of the shape (the depth) of the well region NWL more than the well resistance element of the first comparative example, so that it is possible to improve the accuracy.

However, with reference to FIG. 79, in the second comparative example, there is a possibility that the path of the electric current flowing through the well resistance element from the input-side contact CT1 varies. Specifically, for example, as indicated by an arrow represented by A in FIG. 79, normally, the electric current in the well resistance element flows from the input-side contact CT1 through the silicide layer SC immediately below the input-side contact CT1, the contact region CTR, the active region AR, and the well region NWL to the output-side contact CT2. The resistance value of the well resistance element is designed by assuming that the electric current flows through the well region NWL in this way.

However, there is a case in which a part of the electric current flowing from the input-side contact CT1 through the well resistance element does not pass through the path indicated by the aforementioned A, but passes through another path. Specifically, for example, as indicated by an arrow represented by B in FIG. 79, the electric current flows from the input-side contact CT1 through the silicide layer SC in the horizontal direction and thereafter flows to the separation insulating film SI in the intermediate region.

First, the electric current flows through the separation insulating film SI having a large resistance value. However, the electric current tends to flow through the small active region AR which is a region having a smaller resistance value, so that the electric current flows to a nearby active region AR. However, the active region AR is small, so that even when the electric current flows into the active region AR, there is a high probability that the electric current pass through the active region AR soon and flows through the separation insulating film SI.

The electric current repeats such a flow, so that the electric current may meander as indicated by an arrow B in FIG. 79 in plan view. Further, electric currents from a region surrounding the active region AR having a small square shape converge into the active region AR, so that the electric current density in the active region AR increases and the electric current density in the separation insulating film SI around the active region AR decreases. Therefore, unevenness of the electric current density occurs in the intermediate region. As a result, electric field concentration occurs in the active region AR and the withstand voltage of the entire well resistance element may decrease. The well resistance element is designed to have a function to realize high withstand voltage under high voltage environment, so that it is required to suppress the decrease of withstand voltage as described above.

Therefore, in the present embodiment, (as shown in FIG. 3), the separation insulating film SI and the active region AR (over the upper surface of the well region NWL) in the intermediate region have an elongated shape (a striped shape) in plan view, and the separation insulating film SI and the active region AR are formed to be alternately and repeatedly arranged. In particular, in the present embodiment, the separation insulating film SI in the intermediate region extends in a direction crossing a direction connecting the input-side contact CT1 and the output-side contact CT2 in plan view. Thereby, (on the upper surface) in the intermediate region, the separation insulating films SI are arranged in the entire region, where the separation insulating films SI are arranged, in the horizontal direction in FIG. 3, and the active regions AR are arranged in the entire region, where the active regions AR are arranged, in the horizontal direction in FIG. 3. Therefore, even when the electric current flowing out from the input-side contact CT1 flows out in a spreading manner from the silicide layer SC in any direction with respect to the horizontal direction of FIG. 3, (in a region above the well region NWL in FIGS. 4 and 5) the electric current inevitably flows through a path where the separation insulating film SI and the active region AR alternately appear.

In the present embodiment, when the electric current flows from the input-side contact CT1 to the output-side contact CT2 through a region above the well region NWL and spreads in a direction crossing the flowing direction, the electric current inevitably passes through the separation insulating film SI. Therefore, the electric current avoids passing through a region above the well region NWL and flows through the well region NWL with less resistance. Therefore, the function as an insulating film (a film that does not pass an electric current) of the separation insulating film SI is ensured, so that it is possible to increase the resistance value and the withstand voltage of the well resistance element. Further, when the electric current can be flown through only the well region, it is possible to accurately control the resistance value of the well resistance element by the design of the cross-sectional shape of the well region NWL.

Therefore, in the present embodiment, the occurrence of meandering of the electric current as indicated by the arrow B in FIG. 79 is suppressed. The path of the electric current becomes substantially constant regardless of the traveling direction of the electric current, so that it is possible to suppress extreme increase in the current density at a specific position and to suppress occurrence of electric field concentration following the extreme increase in the current density. Thereby, even when the well resistance element is used under the condition of high voltage, it is possible to maintain the withstand voltage of the well resistance element. Further, even when the plane area of the well resistance element is further reduced and the distance between the input-side contact CT1 and the output-side contact CT2 is shortened in the future, it is possible to suppress decrease in the withstand voltage of the well resistance element.

In the intermediate region, the uppermost surfaces of the separation insulating films SI and the active regions AR are formed to be the same surface (flush), so that, for example, the dimensions of the separation insulating films SI and the active regions AR in the vertical direction of FIG. 4 are substantially the same. For this reason, it is also possible to obtain an effect to suppress the electric field concentration in the vertical direction of FIG. 4.

The configuration as described above can be realized by performing a process in which in the process to form the separation insulating films, the insulating film II formed so as to cover the mask patterns SN and fill the trenches TCH is removed by polishing or the like until the mask patterns SN are exposed and thereafter the mask patterns SN and each insulating film II between the mask patterns SN are removed by etching or the like. When the separation insulating films are formed by the procedure as described above, the mask patterns SN and the insulating films II are not polished at the same time by the CMP, so that it is possible to suppress the occurrence of the dishing due to a difference of polishing rate of CMP or the like between the mask pattern SN and the separation insulating film SI in the above process.

Figure 18:
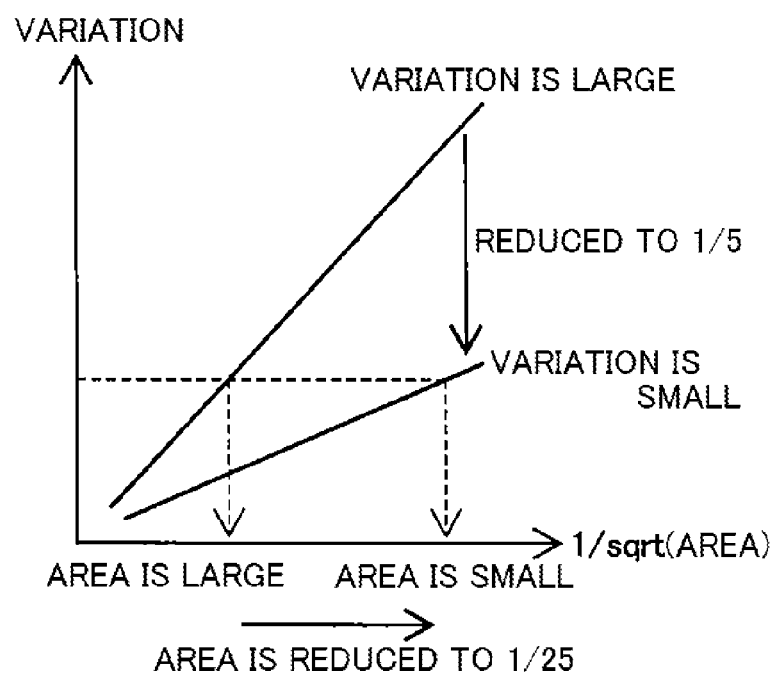
FIG. 18 is a graph showing a relationship between the area in plan view of the well resistance element and a variation of a resistance value of the well resistance element.

Here, a reduction effect of the variation of the resistance value of the well resistance element of the present embodiment and the well resistance element of the first comparative example will be described. With reference to FIG. 18, the horizontal axis of the graph represents the reciprocal of the square root of the area of the well resistance element in plan view and the vertical axis of the graph represents the variation of the resistance value of the well resistance element.

For example, in the case of the well resistance element of the first comparative example (FIG. 71), the variation of the resistance value is about ±7%. However, in the case of the well resistance element of the present embodiment (FIG. 3), the variation of the resistance value is +1.4%. Therefore, it is possible to reduce the variation of the resistance value of the well resistance element to about ⅕ by employing the present embodiment. Further, by employing the present embodiment, as the variation of the resistance value decreases, the value of local variation that represents a mismatch coefficient of the resistance value in the chip region IMC (see FIG. 1) where the well resistance element is formed is reduced to about ⅕ in the same manner as the above. Therefore, when the well resistance element of the present embodiment is employed, it is possible to reduce the area of the well resistance element to about 1/25 of the area of the well resistance element of the first comparative example.

As described above, in the present embodiment, the variation of the resistance value of the well resistance element can be reduced and the electric field concentration can be avoided. Therefore, it is possible to reduce the plane area of the well resistance element to obtain the same resistance value, so that it is possible to reduce the area of a chip region where the well resistance element is formed.

Second Embodiment

First, a well resistance element arranged in a resistance element region RE of the present embodiment will be described with reference to FIGS. 19 to 22.

With reference to FIGS. 19 to 22, in the resistance element region RE of the present embodiment, a well resistance element is arranged, which is formed so that a p-type silicon semiconductor substrate SUB mainly includes the well region NWL, the contacts CT1 and CT2, the separation insulating films SI, and the active regions AR basically in the same manner as the well resistance element of the first embodiment. In the intermediate region between the input-side contact CT1 and the output-side contact CT2, the separation insulating film SI and the active regions AR, each of which has an elongated shape in plan view, are alternately and repeatedly arranged to be in contact with the upper surface of the well region NWL.

Figure 22:
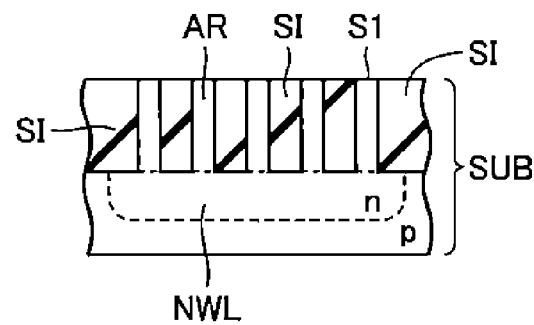
FIG. 22 is a schematic cross-sectional view taken along line XXII-XXII in FIG. 19.

However, in the present embodiment, the separation insulating film SI and the active region AR in the intermediate region extend in a direction (the vertical direction of FIG. 19) along the direction connecting the input-side contact CT1 and the output-side contact CT2 in plan view. As a result, in particular as shown in FIG. 22, the separation insulating film SI and the active region AR are alternately and repeatedly arranged over the upper surface of the well region NWL in the horizontal direction of FIG. 19.

Figure 19:
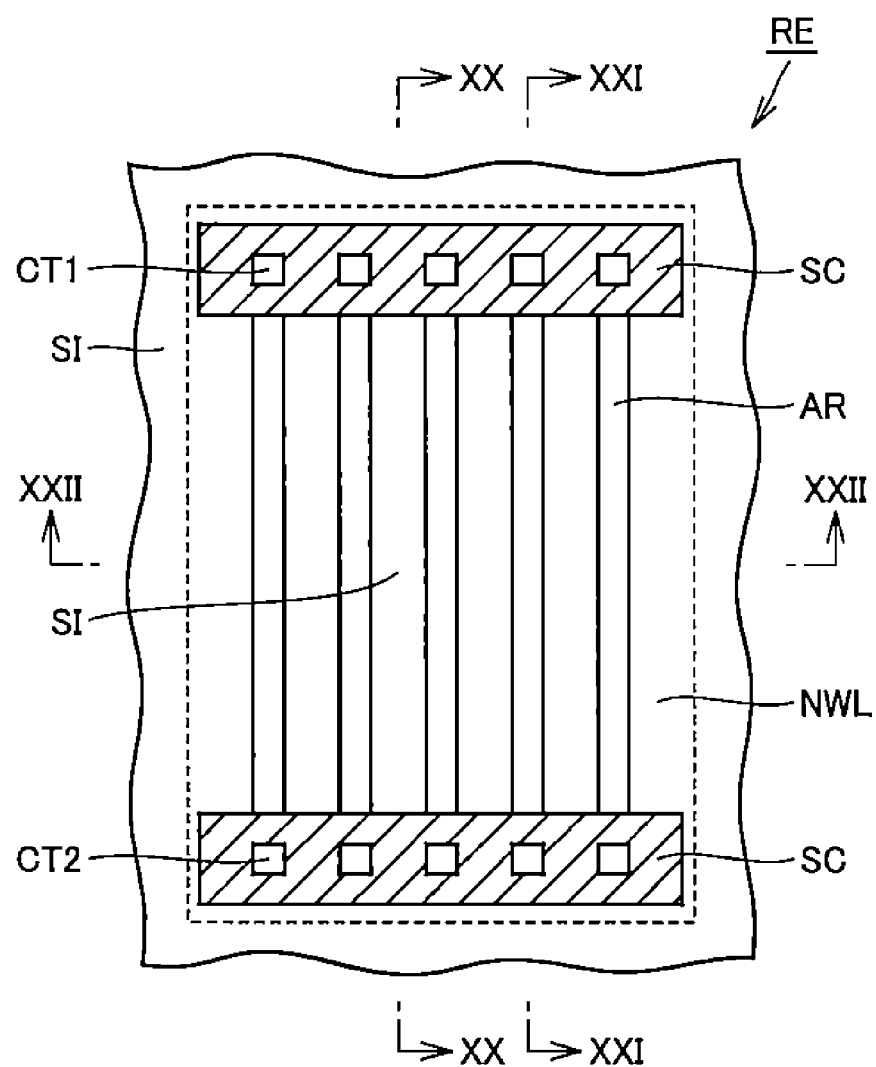
FIG. 19 is a schematic plan view showing a configuration of a resistance element region of a second embodiment.

A plurality of (here, five) input-side contacts CT1 and a plurality of (here, five) output-side contacts CT2 may be arranged in the horizontal direction of FIG. 19 with a gap between them. It is preferable that the number of the arranged input-side contacts CT1 and the number of the arranged output-side contacts CT2 are the same. Here, one of the input-side contacts CT1 and one of the output-side contacts CT2 are arranged to face each other in the vertical direction of FIG. 19. A plurality of (here, five) active regions AR is arranged to couple each of the input-side contacts CT1 to an output-side contact CT2 facing the input-side contact CT1. The active regions AR are arranged with a gap between them in the horizontal direction of FIG. 19 and the separation insulating film SI is arranged in each region between a pair of active regions AR adjacent to each other.

Figure 20:
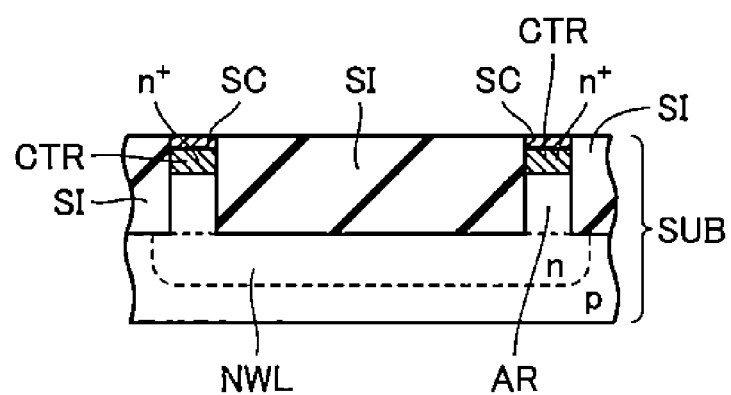
FIG. 20 is a schematic cross-sectional view taken along line XX-XX in FIG. 19.

In a region along the line XX-XX that does not pass through the contacts CT1 and CT2 and passes through the separation insulating film SI, as shown in FIG. 20, the entire upper surface of the well region NWL in the intermediate region between a pair of active regions AR (arranged immediately below the contact regions CTR) is covered by the separation insulating film SI. The uppermost surface of the active region AR (silicide layer SC) and the uppermost surface of the separation insulating film SI are the same surface (the same surface as the main surface of the semiconductor substrate SUB).

Figure 21:
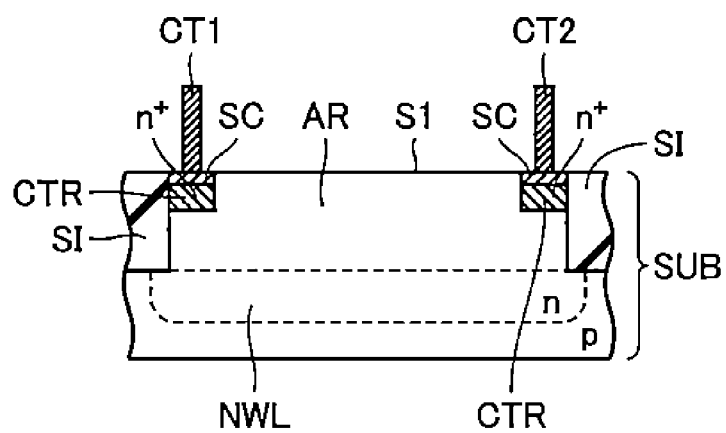
FIG. 21 is a schematic cross-sectional view taken along line XXI-XXI in FIG. 19.

In a region along the line XXI-XXI that passes through the contacts CT1 and CT2 and passes through the active region AR, as shown in FIG. 21, the entire upper surface of the well region NWL in the intermediate region between a pair of active regions AR (arranged immediately below the contact regions CTR) is covered by the active region AR. The active region AR in the intermediate region and the active regions AR immediately below the contact regions CTR are integrated together.

The configuration of the MOS transistor formed in the transistor region TR is the same as that of the first embodiment, so that the detailed description is omitted here (the same goes for embodiments described hereinafter).

The configuration of the present embodiment other than the above is substantially the same as the configuration of the first embodiment, so that the same components are denoted by the same reference symbols and the description thereof will not be repeated.

Next, a method of manufacturing a semiconductor device including the resistance element region RE of the present embodiment will be described with reference to FIGS. 23A to 26C.

Figure 23A:
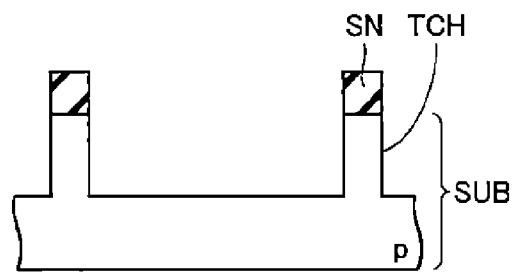
FIG. 23A is a schematic cross-sectional view showing a first process of a manufacturing method of the second embodiment in a region shown in the cross-sectional view in FIG. 20 in a region where a well resistance element should be formed.
Figure 23B:
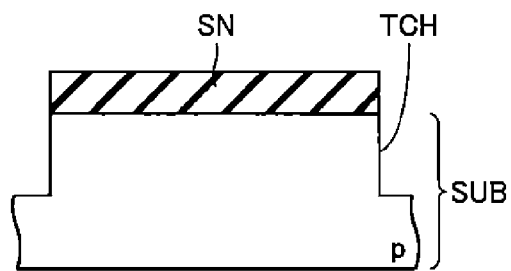
FIG. 23B is a schematic cross-sectional view showing the first process of the manufacturing method of the second embodiment in a region shown in the cross-sectional view in FIG. 21 in the region where the well resistance element should be formed.
Figure 23C:
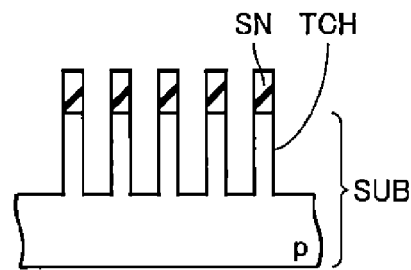
FIG. 23C is a schematic cross-sectional view showing the first process of the manufacturing method of the second embodiment in a region shown in the cross-sectional view in FIG. 22 in the region where the well resistance element should be formed.

With reference to FIGS. 23A, 23B, and 23C, the same processes as those of FIGS. 9A to 10B are performed, so that the mask patterns SN and the trenches TCH are formed at desired positions of the semiconductor substrate SUB.

Figure 24A:
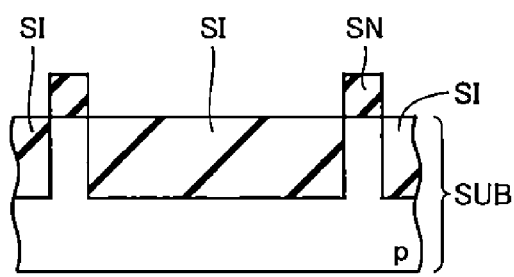
FIG. 24A is a schematic cross-sectional view showing a second process of the manufacturing method of the second embodiment in the region shown in the cross-sectional view in FIG. 20 in a region where the well resistance element should be formed.
Figure 24B:
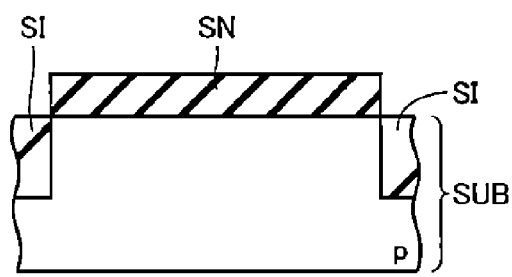
FIG. 24B is a schematic cross-sectional view showing the second process of the manufacturing method of the second embodiment in the region shown in the cross-sectional view in FIG. 21 in the region where the well resistance element should be formed.
Figure 24C:
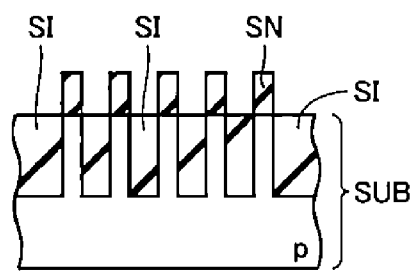
FIG. 24C is a schematic cross-sectional view showing the second process of the manufacturing method of the second embodiment in the region shown in the cross-sectional view in FIG. 22 in the region where the well resistance element should be formed.

With reference to FIGS. 24A, 24B, and 24C, the same processes as those of FIGS. 11A to 13B are performed, so that the insulating film II that is formed to cover the mask patterns SN and fill the inside of the trenches TCH is removed to the lowermost level of the mask pattern SN (the uppermost level of the semiconductor substrate SUB). Thereby, the separation insulating films SI are formed at desired positions of the semiconductor substrate SUB.

Figure 25A:
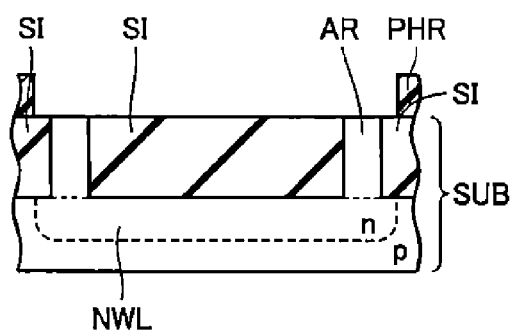
FIG. 25A is a schematic cross-sectional view showing a third process of the manufacturing method of the second embodiment in the region shown in the cross-sectional view in FIG. 20 in a region where the well resistance element should be formed.
Figure 25B:
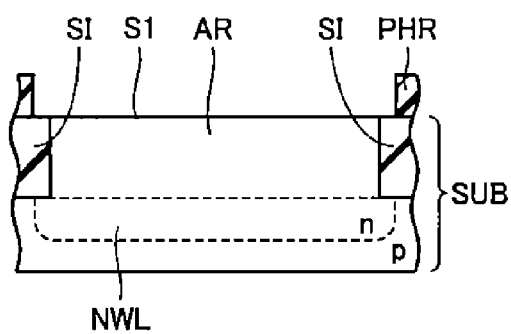
FIG. 25B is a schematic cross-sectional view showing the third process of the manufacturing method of the second embodiment in the region shown in the cross-sectional view in FIG. 21 in the region where the well resistance element should be formed.
Figure 25C:
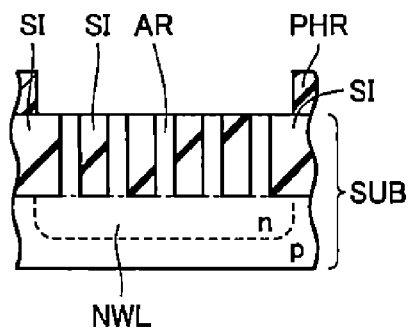
FIG. 25C is a schematic cross-sectional view showing the third process of the manufacturing method of the second embodiment in the region shown in the cross-sectional view in FIG. 22 in the region where the well resistance element should be formed.

With reference to FIGS. 25A, 25B, and 25C, the same processes as those of FIGS. 14A to 15B are performed, so that the mask patterns SN are removed and patterns of photoresist PHR are formed over the main surface S1 of the semiconductor substrate SUB. By a normal ion implantation technique using the patterns of photoresist PHR, n-type conductive impurities are introduced into the semiconductor substrate SUB, the active regions AR containing n-type conductive impurities are formed in a region whose height is the same as that of the separation insulating films SI, and the well region NWL containing n-type conductive impurities is formed in a region below the separation insulating films SI.

In FIG. 25A, that is, in the cross section along the separation insulating film SI having an elongated shape, the separation insulating film SI extending in the horizontal direction of FIG. 25A is formed and the active region AR having a small width is formed at both ends of the separation insulating film SI. On the other hand, in FIG. 25B, that is, in the cross section along the active region AR having an elongated shape, the active region AR extending in the horizontal direction of FIG. 25B is formed and the separation insulating film SI having a small width is formed at both ends of the active region AR. Further, in FIG. 25C, that is, in the cross section in a direction crossing the separation insulating films SI having an elongated shape, the separation insulating film SI and the active region AR are formed so as to be alternately and repeatedly arranged.

Figure 26A:
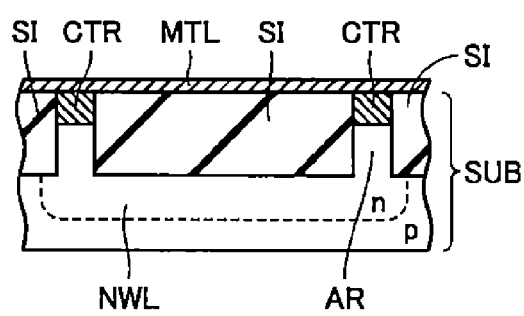
FIG. 26A is a schematic cross-sectional view showing a fourth process of the manufacturing method of the second embodiment in the region shown in the cross-sectional view in FIG. 20 in a region where the well resistance element should be formed.
Figure 26B:
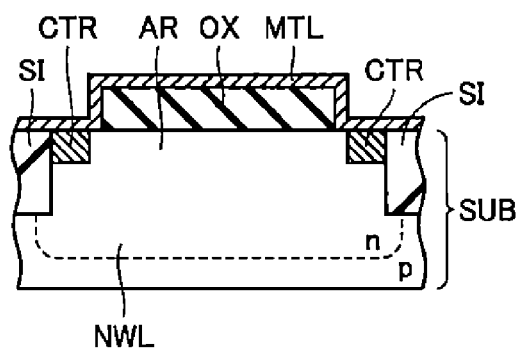
FIG. 26B is a schematic cross-sectional view showing the fourth process of the manufacturing method of the second embodiment in the region shown in the cross-sectional view in FIG. 21 in the region where the well resistance element should be formed.
Figure 26C:
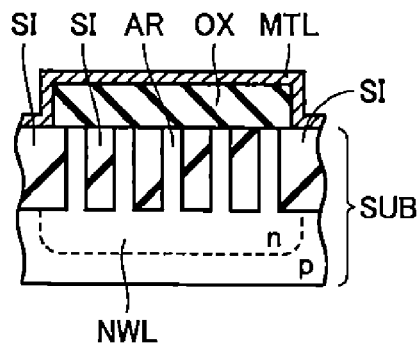
FIG. 26C is a schematic cross-sectional view showing the fourth process of the manufacturing method of the second embodiment in the region shown in the cross-sectional view in FIG. 22 in the region where the well resistance element should be formed.

With reference to FIGS. 26A, 26B, and 26C, the same processes as those of FIGS. 16A to 17B are performed, so that the contact region CTR is formed in portions which are the uppermost portions of the active region AR in FIG. 26A and the uppermost portions of the active region AR in FIG. 26B and which are end portions in the horizontal direction. Further, the metal film. MTL is formed over the main surface S1 of the semiconductor substrate SUB so as to cover the processing mask pattern OX that covers the intermediate region, and annealing treatment is performed.

With reference to FIGS. 20, 21, and 22, the silicide layer SC is formed over the contact region CTR by the annealing treatment. Further, the input-side contact CT1 and the output-side contact CT2 are formed in desired regions, so that the well resistance element is completed.

By the processes described above, the separation insulating film SI in the intermediate region is formed to extend in a direction along a direction connecting the input-side contact CT1 and the output-side contact CT2 in plan view.

Next, operation and effect of the present embodiment will be described. Also in the present embodiment, in the same manner as in the first embodiment, the separation insulating film SI and the active region AR are formed so as to be alternately and repeatedly arranged in a region to be the intermediate region. Therefore, it is possible to reduce the possibility that the separation insulating film SI in the intermediate region causes the dishing, so that it is possible to reduce the variation of resistance value of the well region NWL immediately below the separation insulating film SI. As a result, it is possible to reduce the well resistance element and the area of the chip region where the well resistance element is formed.

Further, in the present embodiment, the separation insulating film SI in the intermediate region is formed to extend in a direction along a direction in which the electric current flows. Therefore, as shown in FIG. 22, (in the intermediate region), the active region AR is arranged in some regions in a direction crossing the direction of the electric current, so that there is a possibility that some electric current meanders between the active region AR and the separation insulating film SI adjacent to each other. However, at least the active region AR is arranged along the separation insulating film. SI in the intermediate region and the electric current that passes above the well region NWL can consistently flow between the contacts CT1 and CT2 through the active region AR.

In other words, the electric current flowing between the contacts CT1 and CT2 can be rectified so as to almost stably flow through the well region NWL or the active region AR over the upper surface of the well region NWL except for some electric current that directly flows from the silicide layer SC to the separation insulating film SI in the intermediate region, at least, for example, as compared with a case in which a plurality of active regions AR is arranged in a matrix form as in the second comparative example in FIG. 79. For example, the electric current that once enters the active region AR in the intermediate region can thereafter consistently flow through the active region AR until the electric current reaches (the silicide layer SC or the like around) the contact CT2. Therefore, in the present embodiment, the possibility of the occurrence of meandering of the electric current as indicated by, for example, the arrow B in FIG. 79 is excluded as compared with the second comparative example, so that it is possible to alleviate the electric field concentration at the end portion of the separation insulating film. SI and it is possible to increase the resistance value and the withstand voltage of the well resistance element.

However, it is recommended that the well resistance element of the present embodiment is used for a device that does not require a withstand voltage as high as that of the well resistance element of the first embodiment because it is assumed that the electric current flows through the active region AR above the well region NWL.

Third Embodiment

First, a well resistance element arranged in a resistance element region RE of the present embodiment will be described with reference to FIGS. 27 to 30.

With reference to FIGS. 27 to 30, in the resistance element region RE of the present embodiment, a well resistance element that has basically the same configuration as that of the well resistance element of the second embodiment is formed. In other words, also in the present embodiment, the separation insulating film SI and the active region AR in the intermediate region extend in a direction (the vertical direction of FIG. 27) along the direction connecting the input-side contact CT1 and the output-side contact CT2 in plan view.

Figure 27:
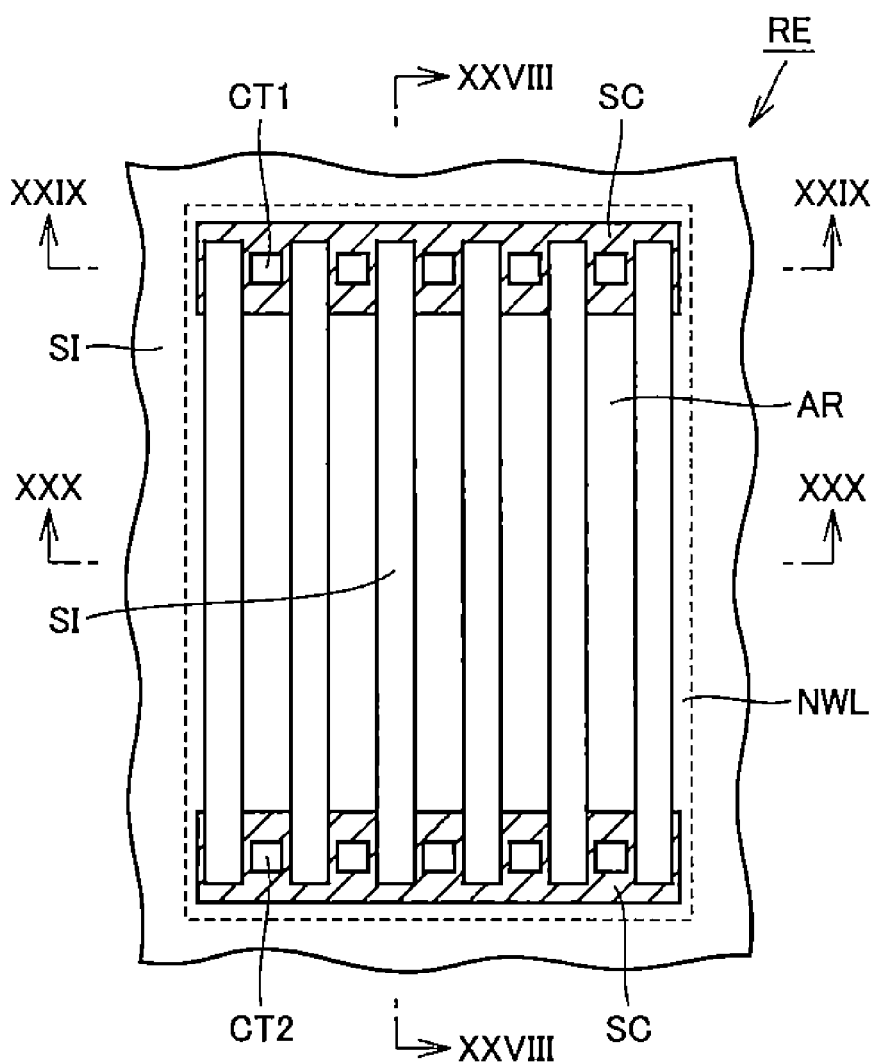
FIG. 27 is a schematic plan view showing a configuration of a resistance element region of a third embodiment.

Also in the present embodiment, a plurality of (here, five) input-side contacts CT1 and a plurality of (here, five) output-side contacts CT2 are arranged in the horizontal direction of FIG. 27 with a gap between them in plan view.

In the present embodiment, the separation insulating film SI, which extends in the intermediate region along a direction in which the electric current flows, extends from the intermediate region and reaches a region sandwiched in plan view by a pair of input-side contacts CT1 adjacent to each other among a plurality of input-side contacts CT1 and a region sandwiched in plan view by a pair of output-side contacts CT2 adjacent to each other among a plurality of output-side contacts CT2. In other words, the separation insulating film SI of the present embodiment is longer than the separation insulating film SI of the second embodiment and extends to (the regions where the silicide layer SC and the like are formed around) the regions where the contacts CT1 and CT2 are formed respectively.

Figure 28:
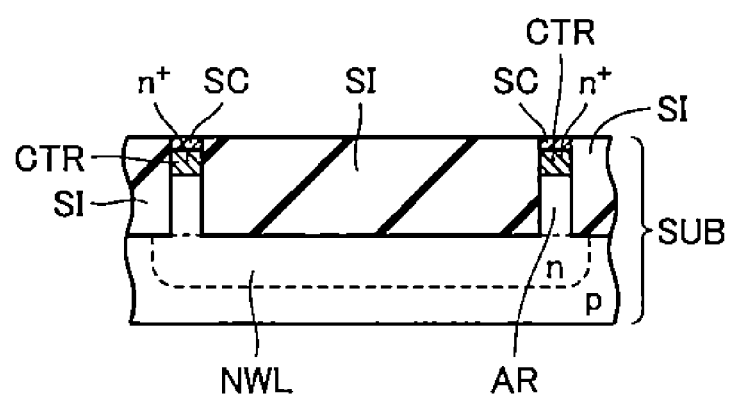
FIG. 28 is a schematic cross-sectional view taken along line XXVIII-XXVIII in FIG. 27.

Therefore, as shown in FIG. 28, in the cross section along the separation insulating film SI, the separation insulating film SI of the present embodiment extends longer in the horizontal direction of FIG. 28 than the separation insulating film SI in the cross section (FIG. 20) along the separation insulating film SI of the second embodiment. Accordingly, the width of the active region AR adjacent to the separation insulating film SI is smaller than that in FIG. 20 of the second embodiment.

Figure 29:
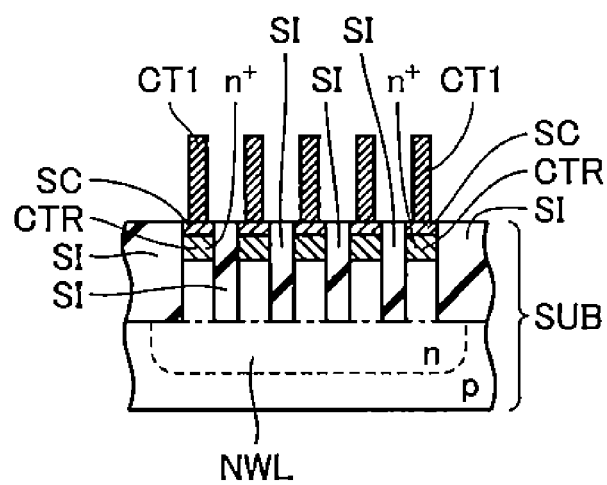
FIG. 29 is a schematic cross-sectional view taken along line XXIX-XXIX in FIG. 27.

As shown in FIG. 29, in the cross section in which a plurality of input-side contacts CT1 is arranged, the silicide layer SC, the contact region CTR, and the like are arranged immediately below the region where the input-side contact CT1 is arranged, and the separation insulating film SI is arranged in a region sandwiched by a pair of input-side contacts CT1 adjacent to each other. The separation insulating film SI is in contact with the active regions AR adjacent to each other and the contact regions CTR and the like formed over the active regions AR.

Figure 30:
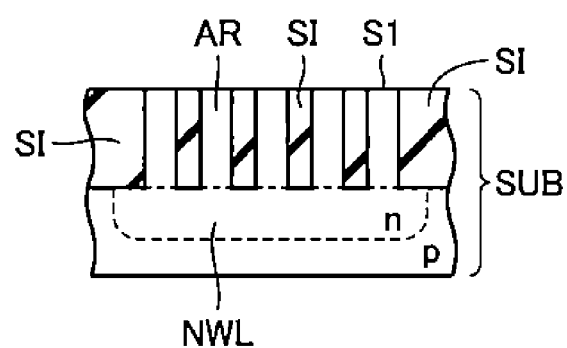
FIG. 30 is a schematic cross-sectional view taken along line XXX-XXX in FIG. 27.

Although FIG. 30 shows the same configuration as that shown in FIG. 22 of the second embodiment, the width of the active region AR may be smaller than that in FIG. 22.

The configuration of the present embodiment other than the above is substantially the same as the configuration of the second embodiment, so that the same components are denoted by the same reference symbols and the description thereof will not be repeated.

Next, a method of manufacturing a semiconductor device including the resistance element region RE of the present embodiment will be described with reference to FIGS. 31A to 34B.

Figure 31A:
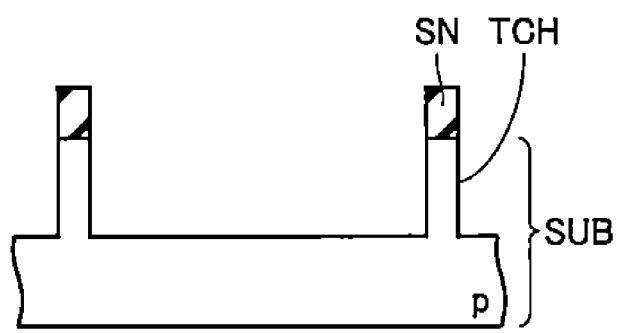
FIG. 31A is a schematic cross-sectional view showing a first process of a manufacturing method of the third embodiment in a region shown in the cross-sectional view in FIG. 28 in a region where a well resistance element should be formed.
Figure 31B:
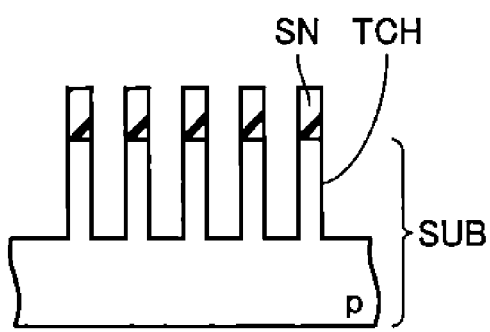
FIG. 31B is a schematic cross-sectional view showing the first process of the manufacturing method of the third embodiment in a region shown in the cross-sectional view in FIG. 29 in a region where the well resistance element should be formed.

With reference to FIGS. 31A and 31B, the same processes as those of FIGS. 23A to 23C of the second embodiment are performed, so that the mask patterns SN and the trenches TCH are formed at desired positions of the semiconductor substrate SUB. However, in FIG. 31A, the width of a portion protruding above the semiconductor substrate SUB and the mask pattern SN which are formed by the trenches TCH is smaller than the width of the same portions in FIG. 23A. FIG. 31B shows basically the same configuration as that shown in FIG. 23C.

Figure 32A:
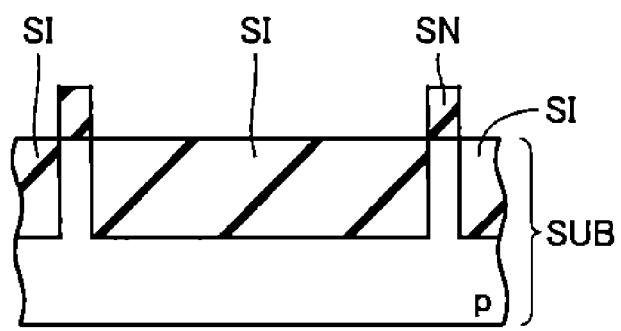
FIG. 32A is a schematic cross-sectional view showing a second process of the manufacturing method of the third embodiment in the region shown in the cross-sectional view in FIG. 28 in the region where the well resistance element should be formed.
Figure 32B:
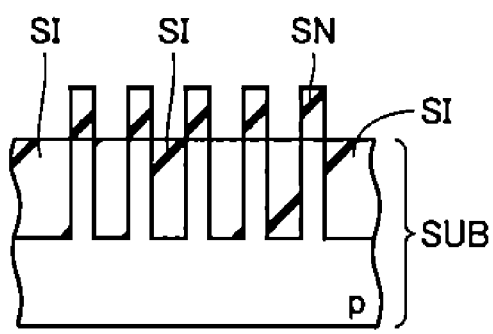
FIG. 32B is a schematic cross-sectional view showing the second process of the manufacturing method of the third embodiment in the region shown in the cross-sectional view in FIG. 29 in the region where the well resistance element should be formed.

With reference to FIGS. 32A and 32B, the same processes as those of FIGS. 24A to 24C of the second embodiment are performed, so that the insulating film II that is formed to cover the mask patterns SN and fill the inside of the trenches TCH is removed to the lowermost level of the mask pattern SN (the uppermost level of the semiconductor substrate SUB). Thereby, the separation insulating films SI are formed at desired positions of the semiconductor substrate SUB.

FIG. 32B shows basically the same configuration as that shown in FIG. 24C.

Figure 33A:
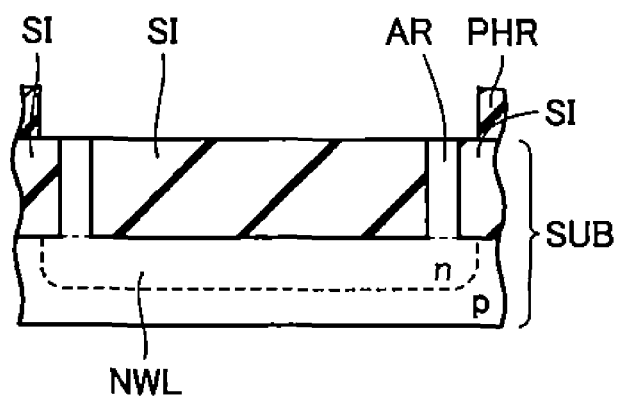
FIG. 33A is a schematic cross-sectional view showing a third process of the manufacturing method of the third embodiment in the region shown in the cross-sectional view in FIG. 28 in the region where the well resistance element should be formed.
Figure 33B:
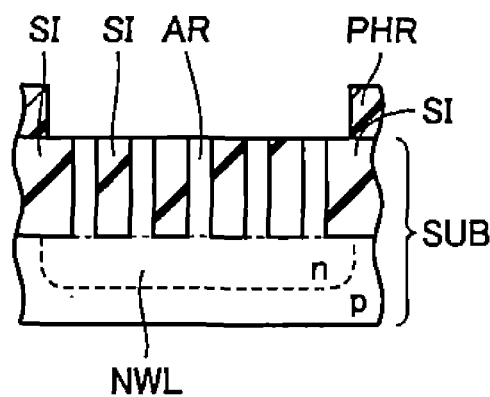
FIG. 33B is a schematic cross-sectional view showing the third process of the manufacturing method of the third embodiment in the region shown in the cross-sectional view in FIG. 29 in the region where the well resistance element should be formed.

With reference to FIGS. 33A and 33B, the same processes as those of FIGS. 25A to 25C of the second embodiment are performed, so that the active regions AR and the well region NWL are formed. FIG. 33B shows basically the same configuration as that shown in FIG. 25C.

Figure 34A:
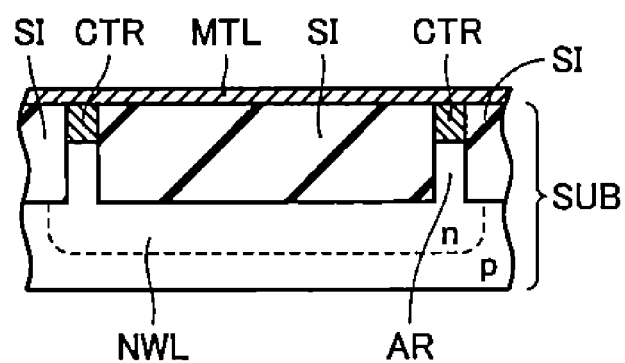
FIG. 34A is a schematic cross-sectional view showing a fourth process of the manufacturing method of the third embodiment in the region shown in the cross-sectional view in FIG. 28 in the region where the well resistance element should be formed.
Figure 34B:
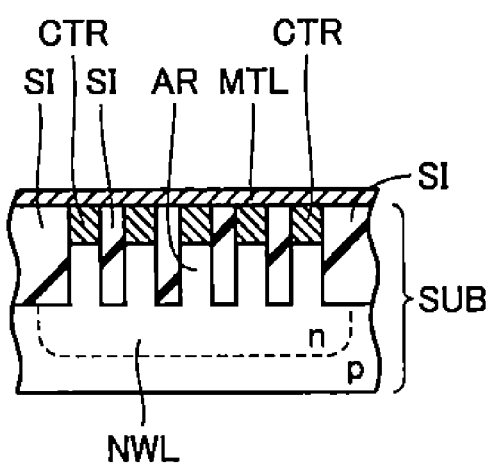
FIG. 34B is a schematic cross-sectional view showing the fourth process of the manufacturing method of the third embodiment in the region shown in the cross-sectional view in FIG. 29 in the region where the well resistance element should be formed.

With reference to FIGS. 34A and 34B, the same processes as those of FIGS. 26A to 26C of the second embodiment are performed, so that the contact regions CTR, the processing mask pattern OX (not shown in FIGS. 34A and 34B), and the metal film MTL are formed. In the region shown in FIG. 34B, in the same manner as in FIG. 34A, the metal film MTL is formed over the entire main surface S1 of the semiconductor substrate SUB so as to cover the regions where the contact region CTR is formed.

Thereafter, annealing treatment is performed and the contacts CT1 and CT2 are formed, so that the well resistance element having a cross-sectional shape shown in FIGS. 28 to 30 is completed.

By the processes described above, in the present embodiment, the separation insulating film SI is formed to extend and reach a region sandwiched by a pair of input-side contacts CT1 adjacent to each other among a plurality of input-side contacts CT1 formed with a gap between them in plan view and a region sandwiched by a pair of output-side contacts CT2 adjacent to each other among a plurality of output-side contacts CT2 formed with a gap between them in plan view.

Next, operation and effect of the present embodiment will be described. Also in the present embodiment, in the same manner as in the other embodiments described above, the separation insulating film SI and the active region AR are formed so as to be alternately and repeatedly arranged in a region to be the intermediate region. Therefore, it is possible to reduce the possibility that the separation insulating film SI in the intermediate region causes the dishing. The operation and effect as a result of the above are the same as those of the other embodiments described above.

In the present embodiment, the separation insulating film SI is formed to reach a region adjacent to each of a plurality of contacts CT1 and a plurality of contacts CT2 in the horizontal direction of FIG. 27. Therefore, both sides of the electric current flowing from the input-side contact CT1 to the output-side contact CT2 are blocked by the separation insulating films SI. Therefore, the possibility that the electric current meanders to flow to the separation insulating film SI is more reduced than in the second embodiment. This will be described in detail below.

In the second embodiment, some electric current enters from the input-side contact CT1 into the silicide layer SC (which is arranged between a pair of input-side contacts CT1 adjacent to each other in the horizontal direction of FIG. 19) and flows from the silicide layer SC to the separation insulating film SI. On the other hand, in the present embodiment, the separation insulating film SI is arranged between a pair of input-side contacts CT1 adjacent to each other in the horizontal direction of FIG. 27 and the amount of the silicide layer SC arranged between the pair of input-side contacts CT1 is small. Therefore, the electric current flowing out from the input-side contact CT1 does not enter into the separation insulating film SI having a high resistance value, and most of the electric current is guided to the active region AR or the well region NWL. Therefore, in the present embodiment, it is possible to more stabilize the electric current value, more alleviate the electric field concentration, and more increase the resistance value and the withstand voltage of the well resistance element than in the second embodiment.

Fourth Embodiment

First, a well resistance element arranged in a resistance element region RE of the present embodiment will be described with reference to FIGS. 35 to 38.

With reference to FIGS. 35 to 38, in the resistance element region RE of the present embodiment, a well resistance element is formed, in which the gate insulating film GI and the gate electrode GE are laminated in this order so as to cover the main surface of the semiconductor substrate SUB in the intermediate region of the well resistance element of the first embodiment (that is, the uppermost surfaces of a plurality of active regions AR and a plurality of separation insulating films SI, which have an elongated planar shape and which extend to be arranged alternately). A side wall insulating film SW may be formed on a side wall of the gate insulating film GI and the gate electrode GE.

Figure 35:
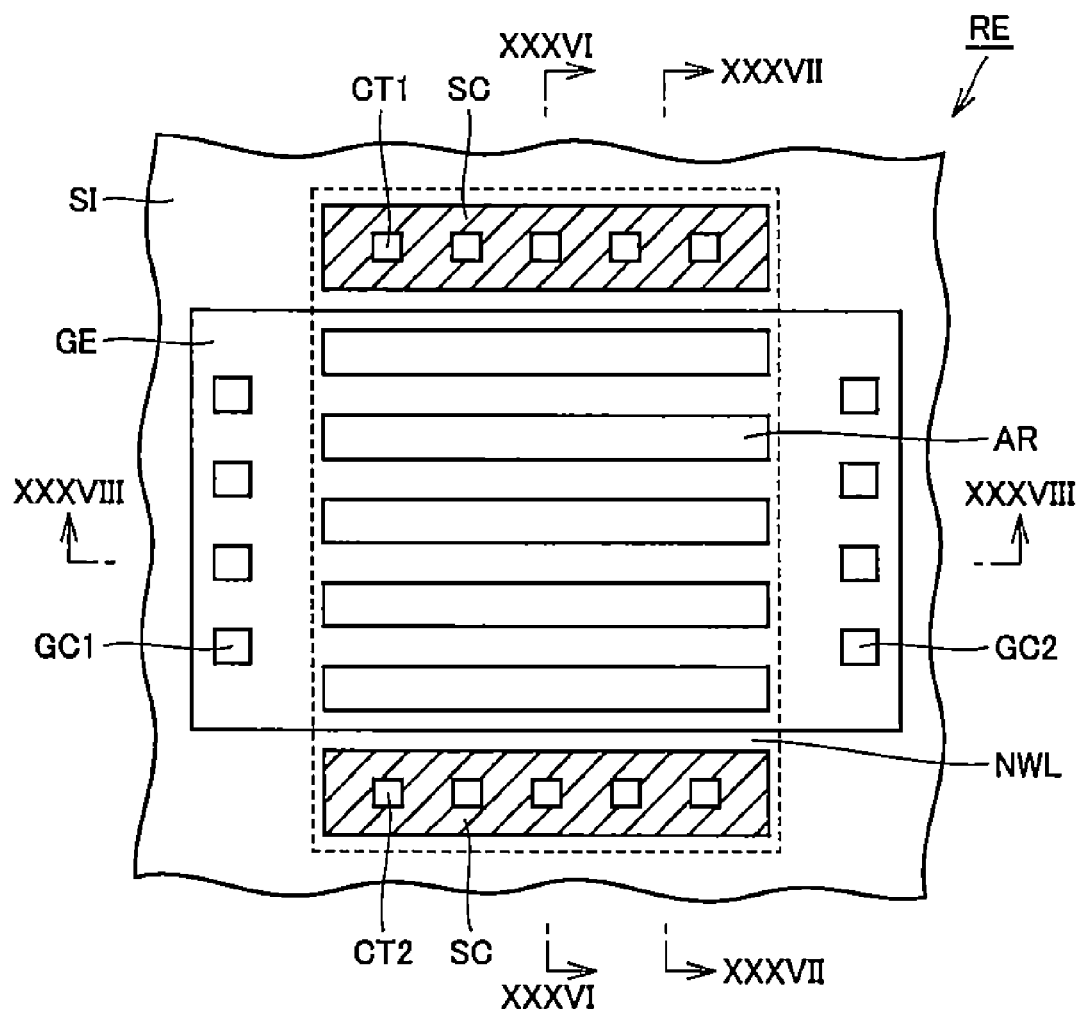
FIG. 35 is a schematic plan view showing a configuration of a resistance element region of a fourth embodiment.

In particular with reference to FIG. 35, the gate electrode GE is formed over the main surface of the semiconductor substrate SUB in the intermediate region through the gate insulating film GI. In FIG. 35, from a viewpoint of facilitating the description, the active regions AR and the separation insulating films SI are shown, which are actually covered by the gate insulating film GI and the gate electrode GE and cannot be visually observed from the above.

Although the gate electrode GE in FIG. 35 does not cover regions closest to the input-side contact CT1 and the output-side contact CT2 (the silicide layers SC in contact with these contacts) in the intermediate region, this arrangement may also be employed. Although the gate electrode GE in FIG. 35 is arranged to be partially protrude to the outside (the left and the right) of the well region NWL in the horizontal direction of FIG. 35, this arrangement may also be employed.

In FIG. 35, it is assumed that, while the electric current flows through the well resistance element in the vertical direction of FIG. 35 (from the contact CT1 to the contact CT2), the electric current flows through the gate electrode GE covering the well resistance element in the horizontal direction of FIG. 35. Specifically, a voltage is applied to the gate electrode GE by using gate contacts GC1 arranged over the left surface of the gate electrode GE and gate contacts GC2 arranged over the right surface of the gate electrode GE in FIG. 35. In FIG. 35, a plurality of (here, four) gate contacts GC1 and a plurality of (here, four) gate contacts GC2 are arranged outside the well region NWL with a gap between them so as not to overlap with the well region NWL in plan view. However, the gate electrode GE need not have such an arrangement.

The configuration of the present embodiment other than the above is substantially the same as the configuration of the first embodiment, so that the same components are denoted by the same reference symbols and the description thereof will not be repeated.

Next, a method of manufacturing a semiconductor device including the resistance element region RE of the present embodiment will be described with reference to FIGS. 39A to 41B.

Figure 39A:
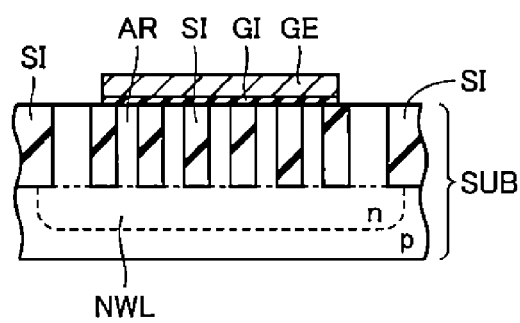
FIG. 39A is a schematic cross-sectional view showing a first process of a manufacturing method of the fourth embodiment in a region shown in the cross-sectional view in FIG. 36 in a region where a well resistance element should be formed.
Figure 39B:
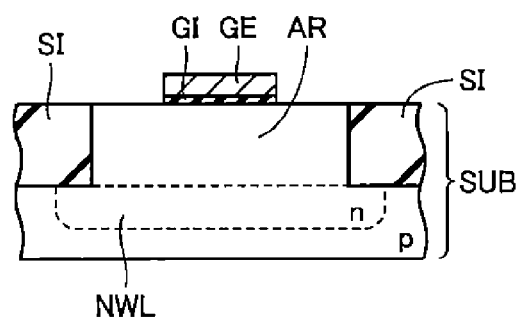
FIG. 39B is a schematic cross-sectional view showing the first process of the manufacturing method of the fourth embodiment in the region shown in the cross-sectional view in FIG. 8 in a region where a transistor should be formed.

With reference to FIGS. 39A and 39B, the same processes as those of FIGS. 9A to 15B of the first embodiment are performed and the patterns of photoresist PHR shown in FIG. 15 are removed, and thereafter the gate insulating film GI and the gate electrode GE are formed to be laminated in this order so as to cover the main surface of the semiconductor substrate SUB in a region to be the intermediate region (the uppermost surfaces of a plurality of separation insulating films SI and a plurality of active regions AR, which are arranged alternately). A method of forming the gate insulating film GI and the gate electrode GE is the same as the process of FIG. 16B.

It is preferable that the gate insulating film GI and the gate electrode GE in the resistance element region shown in 39A are formed at the same time as the gate insulating film GI and the gate electrode GE to form a MOS transistor in the transistor region shown in FIG. 39B. By doing so, it is possible to improve the efficiency of the process.

Figure 40A:
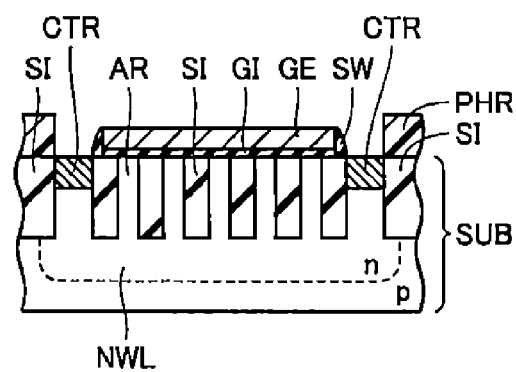
FIG. 40A is a schematic cross-sectional view showing a second process of the manufacturing method of the fourth embodiment in the region shown in the cross-sectional view in FIG. 36 in the region where the well resistance element should be formed.
Figure 40B:
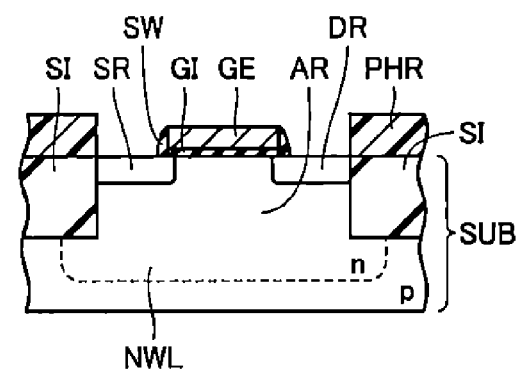
FIG. 40B is a schematic cross-sectional view showing the second process of the manufacturing method of the fourth embodiment in the region shown in the cross-sectional view in FIG. 8 in the region where the transistor should be formed.

With reference to FIGS. 40A and 40B, regions in which conductive impurities are further implanted into the active region AR are formed by a normal ion implantation technique using the gate electrode GE and patterns of photoresist PHR formed to cover the separation insulating film SI that is not covered by the gate electrode GE as a mask. Thereby, the contact regions CTR are formed in the resistance element region in FIG. 40A, and the source region SR and the drain region DR are formed in the transistor region in FIG. 40B. It is preferable that the contact regions CTR, the source region SR, and the drain region DR are formed at the same time.

Thereafter, the side wall insulating film. SW that covers the side walls of the gate electrode GE and the gate insulating film GI in the transistor region is formed as needed and the ion implantation technique is further performed by using the side wall insulating film SW as a mask. Thereby, the impurity concentration in the source region SR and the drain region DR may be further increased.

Figure 41A:
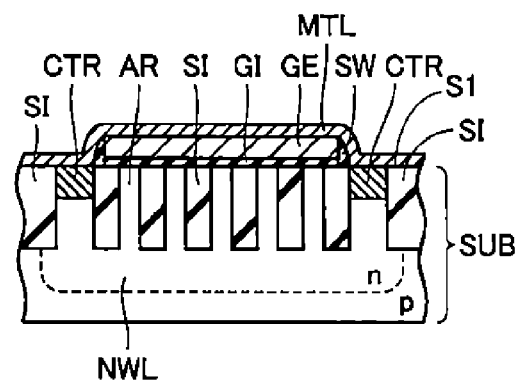
FIG. 41A is a schematic cross-sectional view showing a third process of the manufacturing method of the fourth embodiment in the region shown in the cross-sectional view in FIG. 36 in the region where the well resistance element should be formed.
Figure 41B:
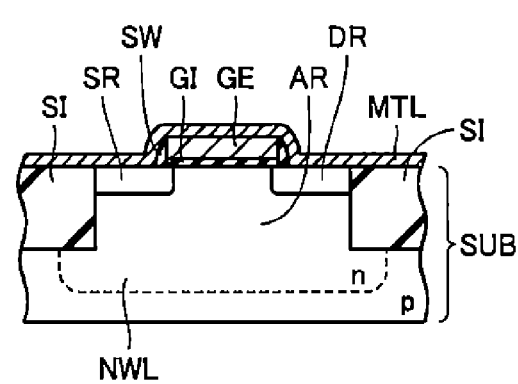
FIG. 41B is a schematic cross-sectional view showing the third process of the manufacturing method of the fourth embodiment in the region shown in the cross-sectional view in FIG. 8 in the region where the transistor should be formed.
Figure 42:
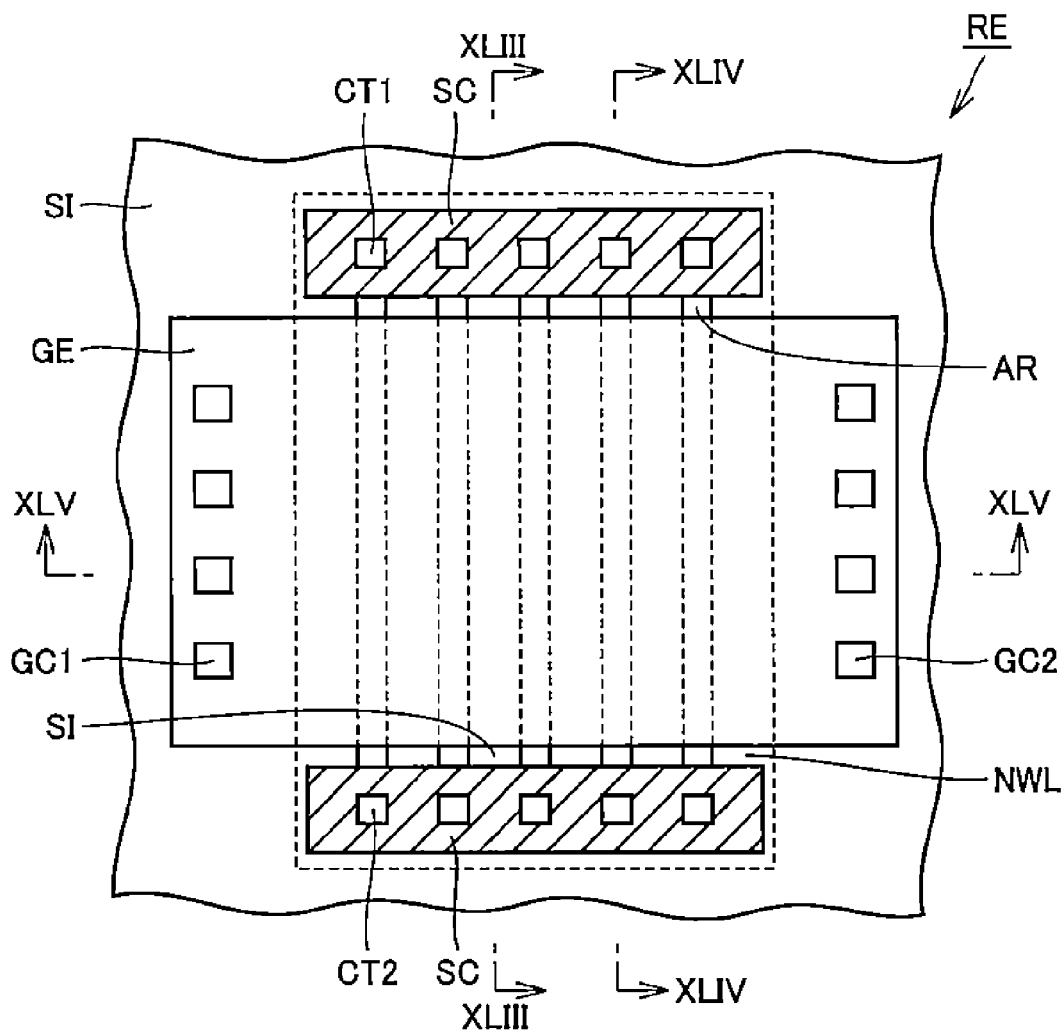
FIG. 42 is a schematic plan view showing a configuration of a resistance element region of a fifth embodiment.
Figure 43:
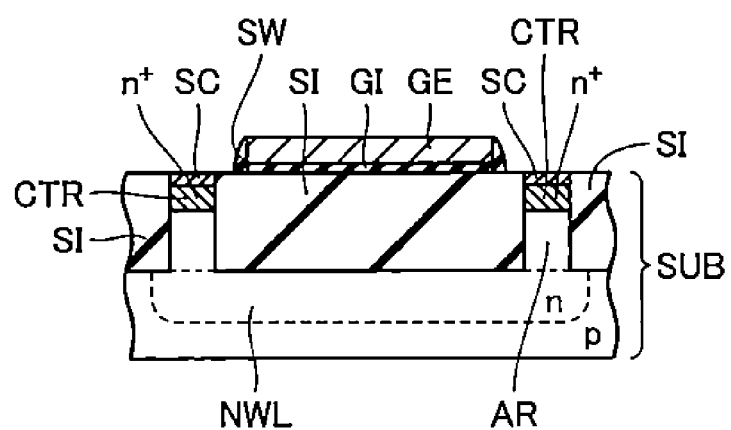
FIG. 43 is a schematic cross-sectional view taken along line XLIII-XLIII in FIG. 42.
Figure 44:
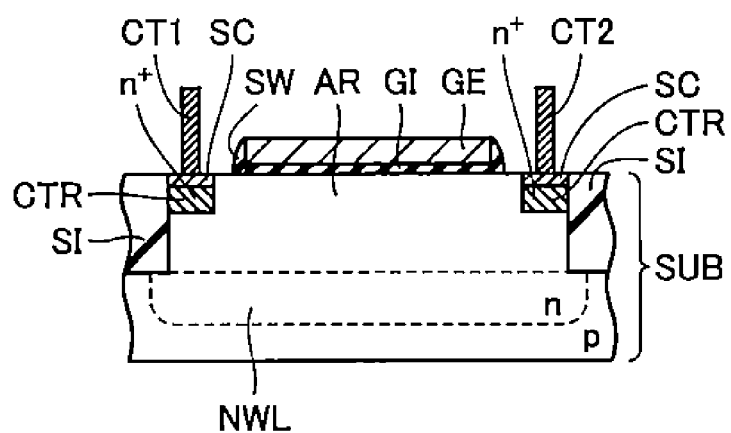
FIG. 44 is a schematic cross-sectional view taken along line XLIV-XLIV in FIG. 42.
Figure 45:
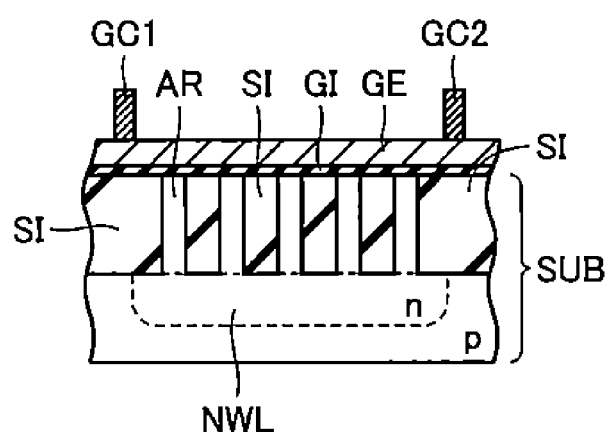
FIG. 45 is a schematic cross-sectional view taken along line XLV-XLV in FIG. 42.
Figure 46:
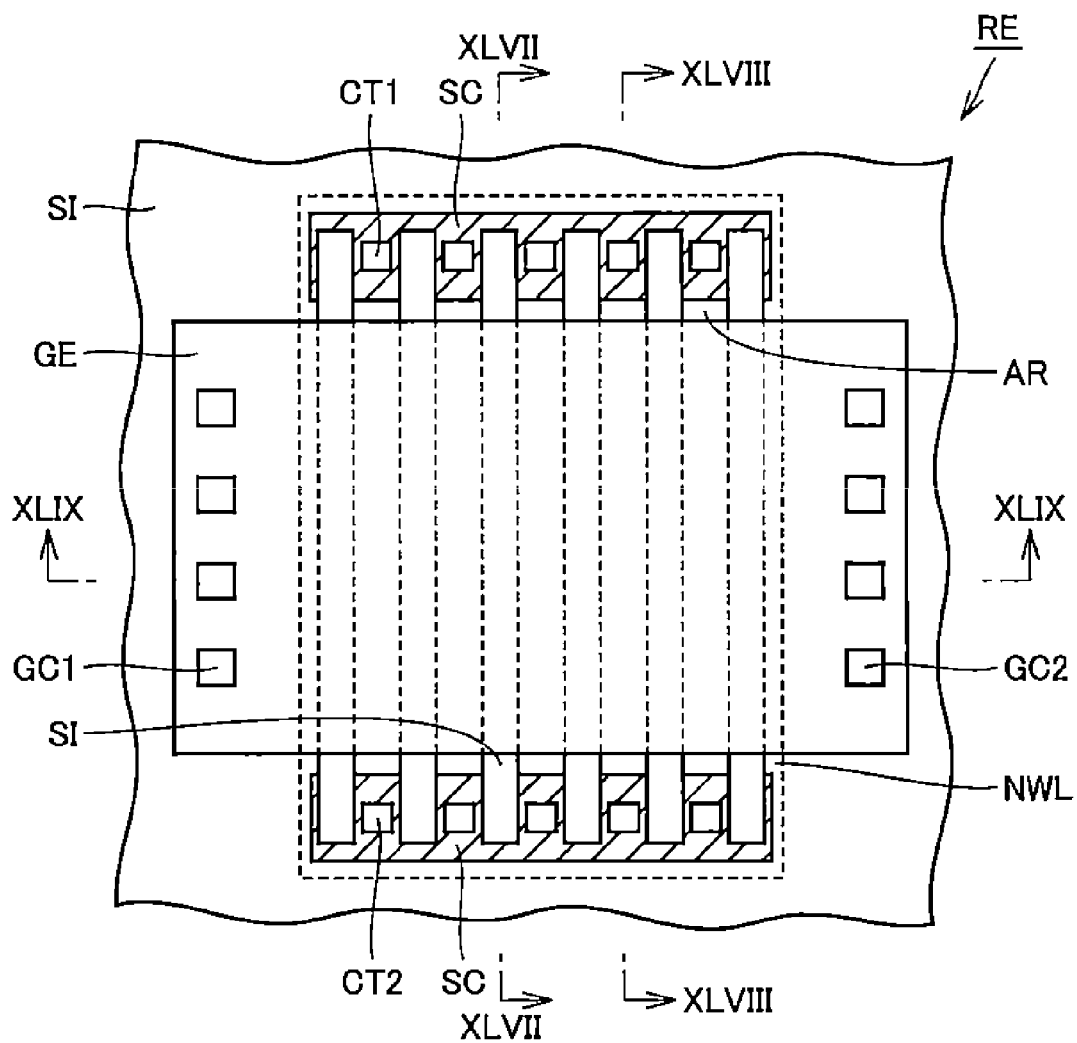
FIG. 46 is a schematic plan view showing a configuration of a resistance element region of a sixth embodiment.
Figure 47:
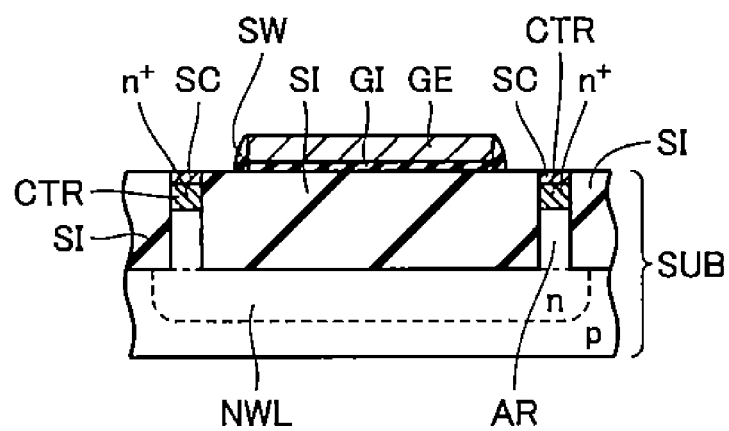
FIG. 47 is a schematic cross-sectional view taken along line XLVII-XLVII in FIG. 46.
Figure 48:
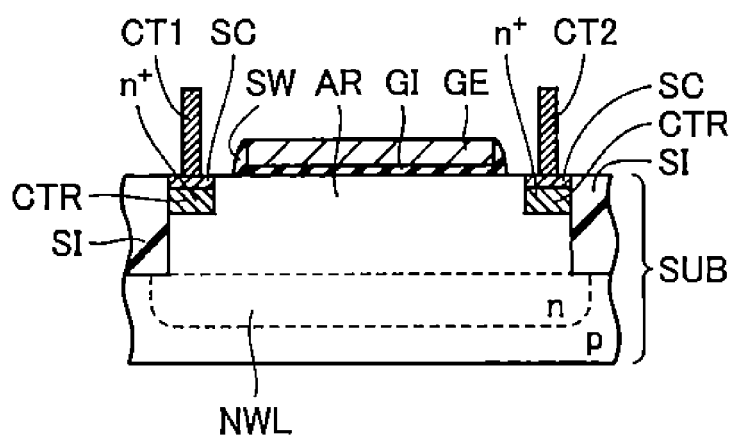
FIG. 48 is a schematic cross-sectional view taken along line XLVIII-XLVIII in FIG. 46.
Figure 49:
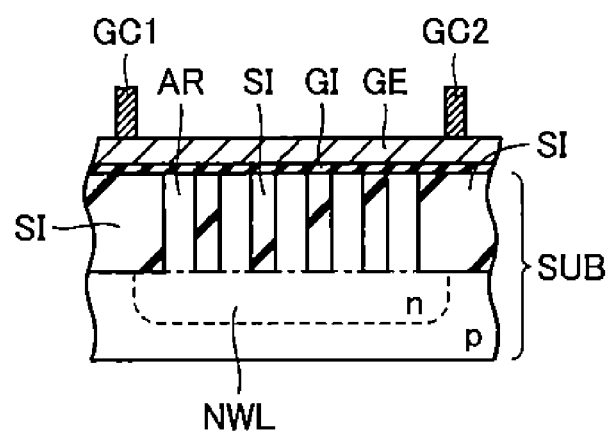
FIG. 49 is a schematic cross-sectional view taken along line XLIX-XLIX in FIG. 46.
Figure 50:
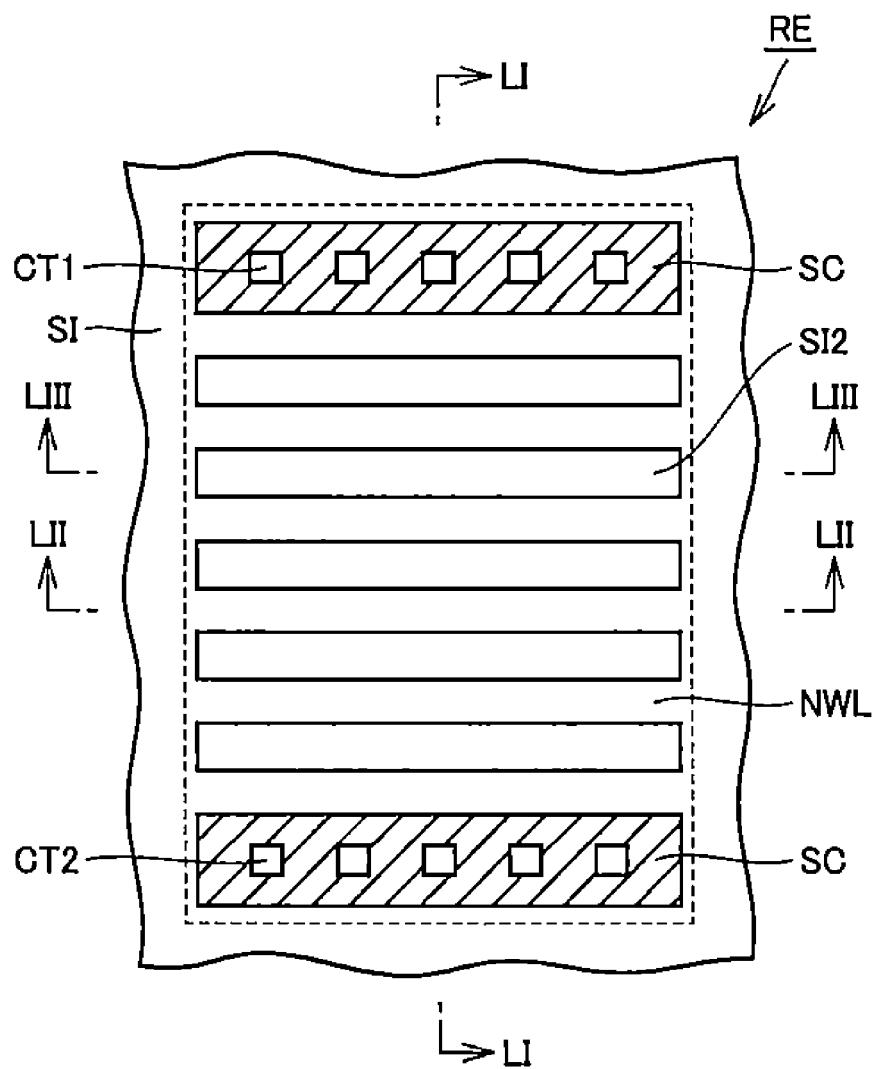
FIG. 50 is a schematic plan view showing a configuration of a resistance element region of a seventh embodiment.

With reference to FIGS. 41A and 41B, the patterns of photoresist PHR are removed from the structure formed by the process of FIGS. 40A and 40B, and thereafter, the metal film MTL is deposited over the main surface S1 of the semiconductor substrate SUB so as to cover the surface of the gate electrode GE and the like. The metal film MTL has the same configuration as that of the metal film MTL formed in the process of FIGS. 17A and 17B.

Figure 36:
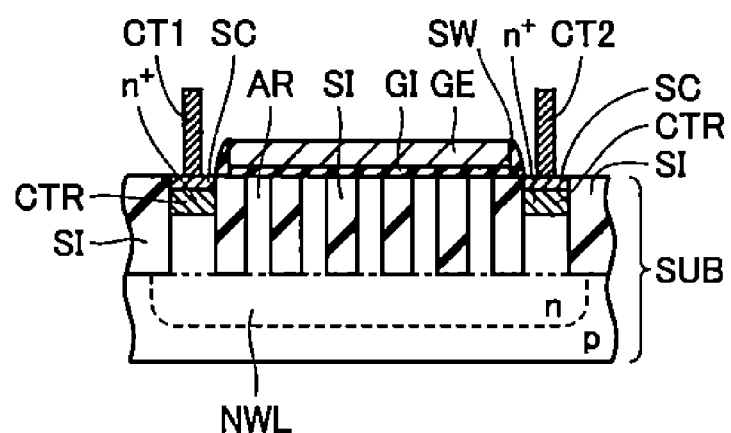
FIG. 36 is a schematic cross-sectional view taken along line XXXVI-XXXVI in FIG. 35.
Figure 37:
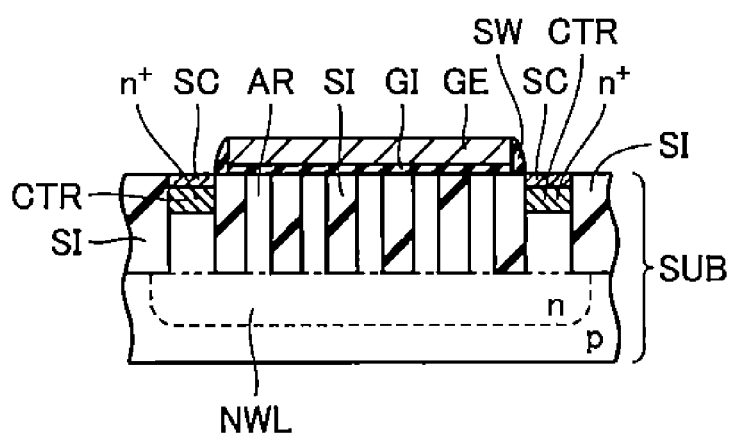
FIG. 37 is a schematic cross-sectional view taken along line XXXVII-XXXVII in FIG. 35.
Figure 38:
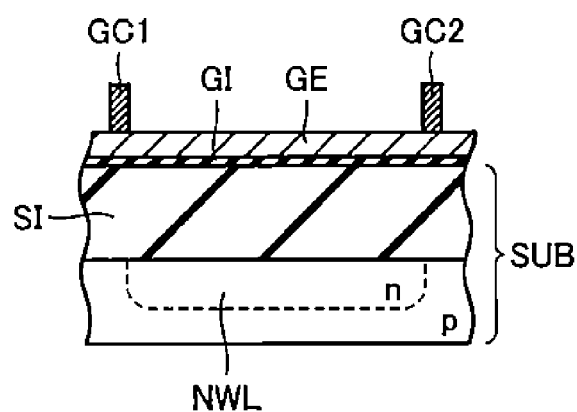
FIG. 38 is a schematic cross-sectional view taken along line XXXVIII-XXXVIII in FIG. 35.

With reference to FIG. 36, the silicide layer SC is formed by the annealing treatment in the same manner as in the first embodiment and an unnecessary metal film MTL is removed. Further, the input-side contacts CT1, the output-side contacts CT2, the gate contacts GC1, and the gate contacts GC2, which are conductive thin film patterns, are formed at any positions at the same time by, for example, a sputtering method, a normal photoengraving technique, and etching. The contacts CT1 and CT2 are electrically coupled to the contact region CTR immediately below the contacts CT1 and CT2 and the well region NWL, and the gate contacts GC1 and GC2 are electrically coupled to the gate electrode GE immediately below the gate contacts GC1 and GC2.

By the processes described above, the well resistance element is completed. After FIG. 17B, a MOS transistor is formed in the transistor region TR in the same manner as in the first embodiment.

Next, operation and effect of the present embodiment will be described. The present embodiment also exhibits an effect of suppressing the variation of resistance value by suppressing the dishing of the separation insulating film SI in the intermediate region, and further exhibits the operation and effect described below.

For example, in the first embodiment, the separation insulating films SI that extend in a direction crossing the direction connecting the input-side contact CT1 and the output-side contact CT2 in plan view are arranged over the upper surface of the well region NWL in the intermediate region, so that the electric current basically flows through the well region NWL as described above. However, in the first embodiment, the active regions AR are also arranged over the upper surface of the well region NWL in the intermediate region, so that there is a possibility that some of the electric current flowing through the well region NWL flows into the active region AR and meanders from there to the separation insulating film SI.

Therefore, in the present embodiment, the gate insulating film GI and the gate electrode GE are formed to cover the uppermost surfaces of the active regions AR and the separation insulating films SI in the intermediate region and a voltage can be applied to the gate electrode GE from the gate contacts GC1 and GC2. Thereby, for example, when a negative voltage is applied to the gate electrode GE that covers the active regions AR and the separation insulating films SI in the intermediate region, a depletion layer expands in the n-type active regions AR formed immediately below the gate electrode GE. Therefore, it is possible to more reliably reduce the possibility that the electric current flows through the active regions AR immediately below the gate electrode GE and the separation insulating films SI juxtaposed to the active regions AR, and it is possible for the electric current flowing between the input-side contact CT1 and the output-side contact CT2 to more reliably flow through the well region NWL. Thereby, it is possible to more easily control the electric current value flowing through the well resistance element, so that it is possible to more reliably suppress the variation of the resistance value as a whole. Further, it is possible to suppress the electric field concentration at a specific position, so that the withstand voltage of the well resistance element can be improved.

Fifth Embodiment

A well resistance element arranged in a resistance element region RE of the present embodiment will be described with reference to FIGS. 42 to 45.

With reference to FIGS. 42 to 45, in the resistance element region RE of the present embodiment, a well resistance element is formed, in which the gate insulating film. GI and the gate electrode GE are laminated in this order so as to cover the main surface of the semiconductor substrate SUB in the intermediate region of the well resistance element of the second embodiment (that is, the uppermost surfaces of a plurality of active regions AR and a plurality of separation insulating films SI, which have an elongated planar shape and which extend to be arranged alternately). A side wall insulating film SW may be formed on a side wall of the gate insulating film GI and the gate electrode GE. The configuration and the forming method of the gate insulating film. GI, the gate electrode GE, and the side wall insulating film SW described above are the same as those of the gate insulating film GI, the gate electrode GE, and the side wall insulating film SW of the fourth embodiment. In other words, the well resistance element of the present embodiment has a configuration in which the gate electrode GE and the like of the fourth embodiment are combined with the well resistance element of the second embodiment.

The configuration of the present embodiment other than the above is substantially the same as the configurations of the second and fourth embodiments, so that the same components are denoted by the same reference symbols and the description thereof will not be repeated.

Next, operation and effect of the present embodiment will be described. The present embodiment also has an effect to suppress the dishing of the separation insulating film SI in the same manner as the embodiments described above and has the same operation and effect as those of the second embodiment. Also in the present embodiment, in the same manner as in the fourth embodiment, for example, when a negative voltage is applied to the gate electrode GE, a depletion layer can be formed in the active regions AR immediately below the gate electrode GE, so that it is possible for the electric current flowing between the contacts CT1 and CT2 to more reliably flow through the well region NWL. From the above, also in the present embodiment, it is possible to improve the accuracy and the withstand voltage of the well resistance element.

Sixth Embodiment

A well resistance element arranged in a resistance element region RE of the present embodiment will be described with reference to FIGS. 46 to 49.

With reference to FIGS. 46 to 49, in the resistance element region RE of the present embodiment, a well resistance element is formed, in which the gate insulating film GI and the gate electrode GE are laminated in this order so as to cover the main surface of the semiconductor substrate SUB in the intermediate region of the well resistance element of the third embodiment (that is, the uppermost surfaces of a plurality of active regions AR and a plurality of separation insulating films SI, which have an elongated planar shape and which extend to be arranged alternately). A side wall insulating film SW may be formed on a side wall of the gate insulating film GI and the gate electrode GE. The configuration and the forming method of the gate insulating film GI, the gate electrode GE, and the side wall insulating film SW described above are the same as those of the gate insulating film GI, the gate electrode GE, and the side wall insulating film SW of the fourth embodiment. In other words, the well resistance element of the present embodiment has a configuration in which the gate electrode GE and the like of the fourth embodiment are combined with the well resistance element of the third embodiment.

The configuration of the present embodiment other than the above is substantially the same as the configurations of the third and fourth embodiments, so that the same components are denoted by the same reference symbols and the description thereof will not be repeated.

Next, operation and effect of the present embodiment will be described. The present embodiment also has an effect to suppress the dishing of the separation insulating film SI in the same manner as the embodiments described above and has the same operation and effect as those of the third embodiment. Also in the present embodiment, in the same manner as in the fourth embodiment, for example, when a negative voltage is applied to the gate electrode GE, a depletion layer can be formed in the active regions AR immediately below the gate electrode GE, so that it is possible for the electric current flowing between the contacts CT1 and CT2 to more reliably flow through the well region NWL. From the above, also in the present embodiment, it is possible to improve the accuracy and the withstand voltage of the well resistance element.

Seventh Embodiment

First, a well resistance element arranged in a resistance element region RE of the present embodiment will be described with reference to FIGS. 50 to 53.

With reference to FIGS. 50 to 53, in the resistance element region RE of the present embodiment, a well resistance element that has basically the same configuration as that of the well resistance element of the first embodiment is formed. However, in the well resistance element of the present embodiment, in the intermediate region, the uppermost surfaces of the active regions AR arranged to be in contact with the upper surface of the well region NWL are not the same surface as the main surface of the semiconductor substrate SUB.

Figure 51:
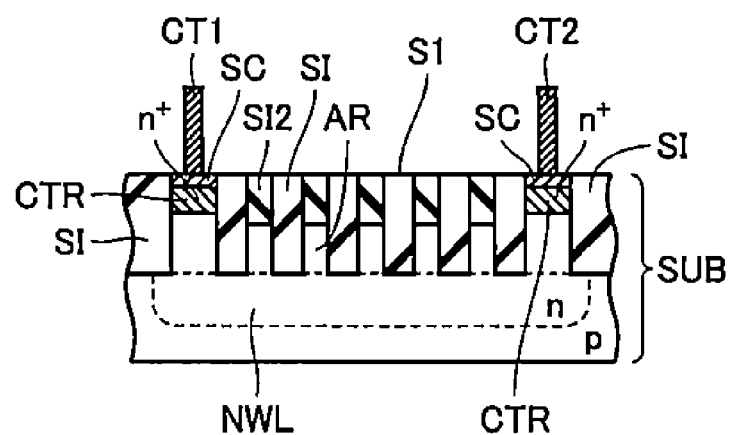
FIG. 51 is a schematic cross-sectional view taken along line LI-LI in FIG. 50.
Figure 52:
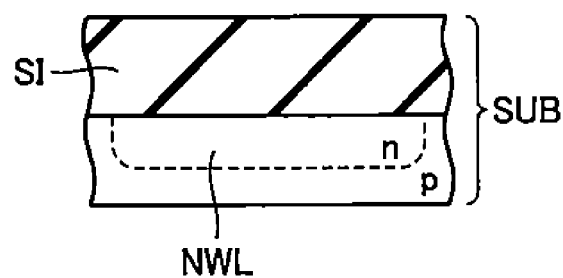
FIG. 52 is a schematic cross-sectional view taken along line LII-LII in FIG. 50.
Figure 53:
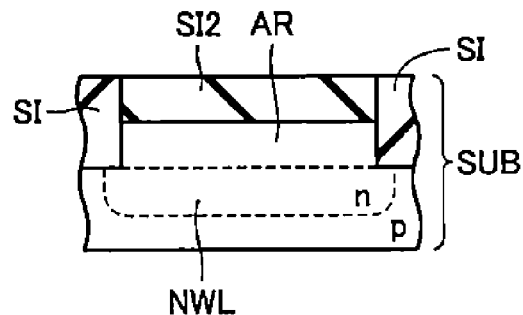
FIG. 53 is a schematic cross-sectional view taken along line LIII-LIII in FIG. 50.

Specifically, in the present embedment, in the intermediate region, the height of the active regions AR in the vertical direction of FIGS. 51 and 53 is lower than that of the separation insulating films SI arranged alternately with the active regions AR. Insulating films SI2 (other separation insulating films) are formed to be in contact with the upper surfaces of the lowered active regions AR. The insulating film SI2 is formed of, for example, a silicon oxide film. In the intermediate region, the insulating film SI2 extends upward from the uppermost surface of the active region AR so as to include the same surface as the main surface S1 of the semiconductor substrate SUB (so as to reach the same surface as the main surface S1 of the semiconductor substrate SUB). Therefore, a plurality of insulating films SI2 is alternately arranged with a plurality of separation insulating films SI and has the same surfaces as the main surface S1 of the semiconductor substrate SUB. Further, the insulating film SI2 overlaps with the active region AR immediately below the insulating film SI2 in plan view, so that it can be said that the separation insulating film SI and the active region AR are alternately and repeatedly arranged.

The configuration of the present embodiment other than the above is substantially the same as the configuration of the first embodiment, so that the same components are denoted by the same reference symbols and the description thereof will not be repeated.

Next, a method of manufacturing a semiconductor device including the resistance element region RE of the present embodiment will be described with reference to FIGS. 54A to 56C.

Figure 54A:
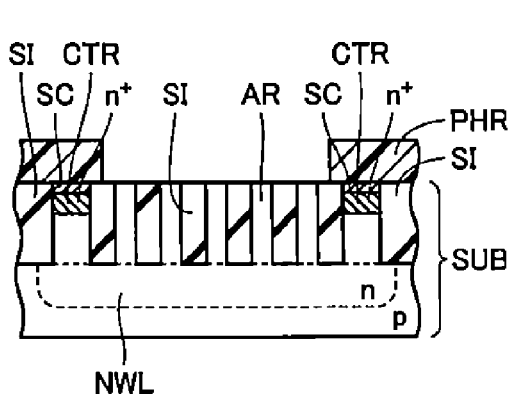
FIG. 54A is a schematic cross-sectional view showing a first process of a manufacturing method of the seventh embodiment in a region shown in the cross-sectional view in FIG. 51 in a region where a well resistance element should be formed.
Figure 54B:
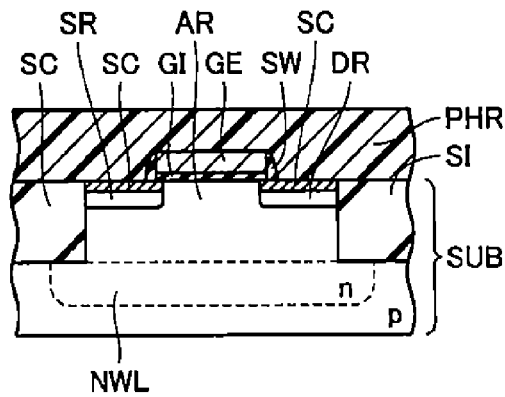
FIG. 54B is a schematic cross-sectional view showing the first process of the manufacturing method of the seventh embodiment in the region shown in the cross-sectional view in FIG. 8 in a region where a transistor should be formed.
Figure 54C:
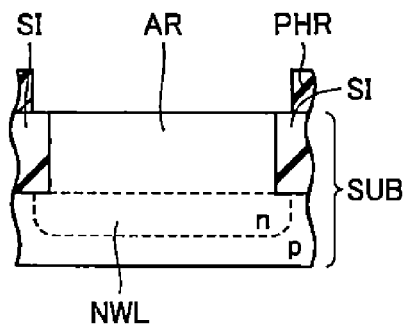
FIG. 54C is a schematic cross-sectional view showing the first process of the manufacturing method of the seventh embodiment in a region shown in the cross-sectional view in FIG. 53 in the region where the well resistance element should be formed.

With reference to FIGS. 54A, 54B, and 54C, the following processing is performed in a state in which the well resistance element and the MOS transistor of the first embodiment are completed (except for the input-side contact CT1 and the output-side contact CT2). A pattern of photoresist PHR is formed, which has an opening in a region overlapping with the active regions AR and the separation insulating films SI in the intermediate region in plan view except for a region overlapping with the contact regions CTR in plan view.

Figure 55A:
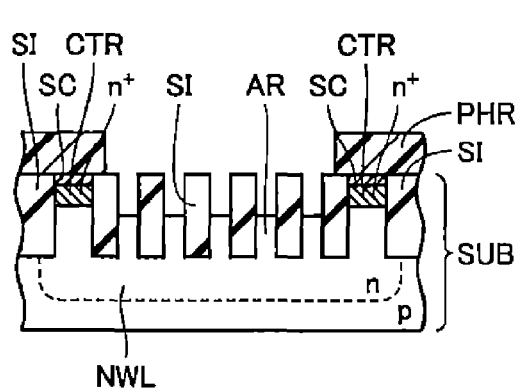
FIG. 55A is a schematic cross-sectional view showing a second process of the manufacturing method of the seventh embodiment in the region shown in the cross-sectional view in FIG. 51 in the region where the well resistance element should be formed.
Figure 55B:
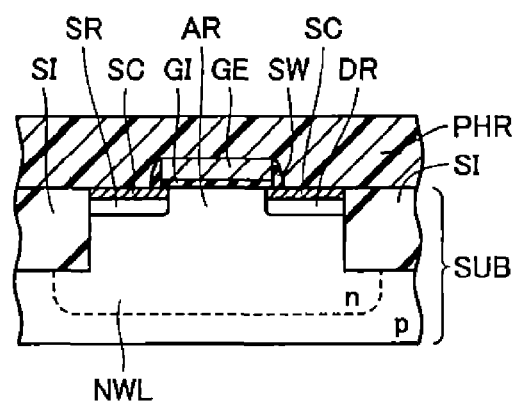
FIG. 55B is a schematic cross-sectional view showing the second process of the manufacturing method of the seventh embodiment in the region shown in the cross-sectional view in FIG. 8 in the region where the transistor should be formed.
Figure 55C:
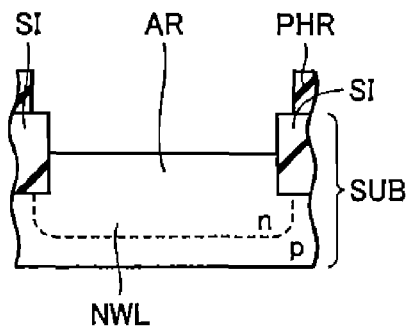
FIG. 55C is a schematic cross-sectional view showing the second process of the manufacturing method of the seventh embodiment in the region shown in the cross-sectional view in FIG. 53 in the region where the well resistance element should be formed.

With reference to FIGS. 55A, 55B, and 55C, the active region AR in the intermediate region is removed from the uppermost surface thereof, that is, the same surface as the main surface of the semiconductor substrate SUB, in the depth direction (the vertical direction of FIGS. 55A, 55B, and 55C) by normal silicon selective etching using the pattern of photoresist PHR. In other words, apart of the active region AR in the intermediate region is removed so that the active region AR remains in a relatively lower region close to the well region NWL.

Figure 56A:
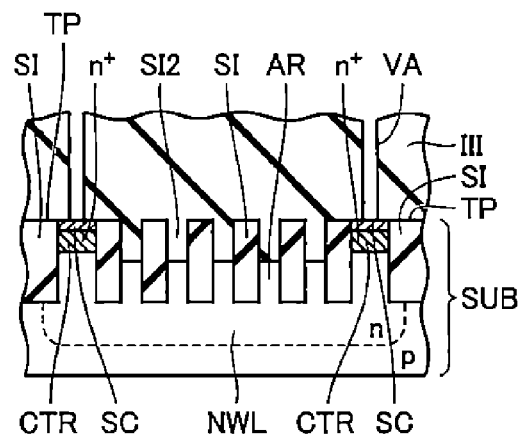
FIG. 56A is a schematic cross-sectional view showing a third process of the manufacturing method of the seventh embodiment in the region shown in the cross-sectional view in FIG. 51 in the region where the well resistance element should be formed.
Figure 56B:
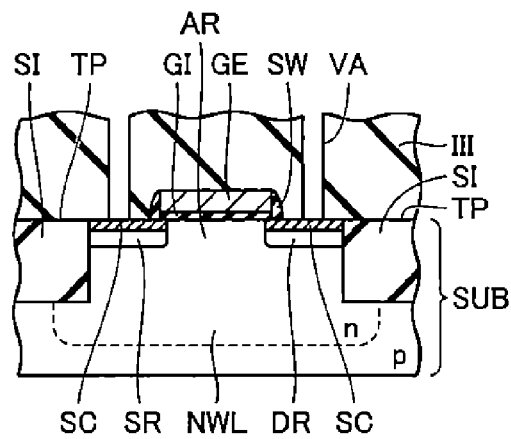
FIG. 56B is a schematic cross-sectional view showing the third process of the manufacturing method of the seventh embodiment in the region shown in the cross-sectional view in FIG. 8 in the region where the transistor should be formed.
Figure 56C:
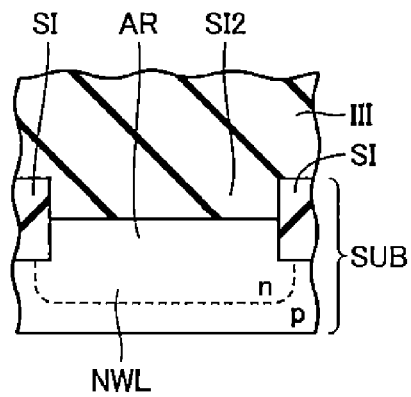
FIG. 56C is a schematic cross-sectional view showing the third process of the manufacturing method of the seventh embodiment in the region shown in the cross-sectional view in FIG. 53 in the region where the well resistance element should be formed.

With reference to FIGS. 56A, 56B, and 56C, an interlayer insulating film III formed of, for example, silicon oxide film is formed over the main surface of the semiconductor substrate SUB so as to fill an opening formed by removing a relatively upper region of the active region AR in the process of FIGS. 55A, 55B, and 55C. The interlayer insulating film III is formed so as to cover the upper surface of the active region AR in contact with the upper surface of the well region NWL, and in particular so as to fill the opening in a region sandwiched by a pair of separation insulating films SI adjacent to each other in the intermediate region. Therefore, the interlayer insulating film III corresponds to the insulating film SI2 defined as the other separation insulating film in FIGS. 50, 51, and 53.

In FIGS. 50 to 53, regarding the insulating film SI2, only a region of the interlayer insulating film III, which is lower than the same surface as the main surface of the semiconductor substrate SUB, which corresponds to the uppermost surface TP of the separation insulating film SI, is shown.

Thereafter, by a normal photoengraving technique and etching, vias VA, which are holes to form the input-side contact CT1, the output-side contact CT2, and the like described in each embodiment described above, are formed immediately above the contact regions CTR of the resistance element region, immediately above the source region SR and the drain region DR of the transistor region, and the like in the interlayer insulating film III. By the processes described above, the well resistance element is completed.

Next, operation and effect of the present embodiment will be described. The present embodiment also exhibits an effect of suppressing the variation of resistance value by suppressing the dishing of the separation insulating film SI in the intermediate region, and further exhibits the operation and effect described below.

For example, in the first embodiment, not only the separation insulating films SI, but also the active regions AR are arranged over the upper surface of the well region NWL in the intermediate region as describe above, so that there is a possibility that some of the electric current flowing through the well region NWL flows into the active region AR and meanders from there to the separation insulating film SI.

Therefore, in the present embodiment, a part of the plurality of active regions AR, each of which is formed to be juxtaposed with the separation insulating film SI in the intermediate region, is removed and the removed portions are filled with the insulating film SI2, so that it is possible to more reliably increase the ratio of the electric current flowing through the well region NWL to the total electric current flowing from the input-side contact CT1 to the output-side contact CT2. In the intermediate region of the well resistance element, most regions other than the well region NWL are occupied by the separation insulating films SI and the insulating films SI2, so that it is possible to further increase the resistance value of the entire well resistance element. Therefore, it is possible to provide a high withstand voltage well resistance element where the variation of resistance value is further reduced and the resistance value is further increased.

In the present embodiment, regarding the well resistance element that is finally formed, in the intermediate region, the entire surface that is the same as the uppermost surface TP of the separation insulating films SI in FIGS. 56A to 56C is formed of a silicon oxide film (the separation insulating film SI or the insulating film SI2), which is an insulating film. In this point, the configuration of the present embodiment is the same as that of the first comparative example described above.

However, the insulating film SI2 in the intermediate region in the present embodiment is formed by filling the opening that is formed by removing the active region AR having an elongated shape which has been formed in advance. The insulating film SI2 is formed as a part of the interlayer insulating film III, and after the insulating film SI2 is formed, a process does not occur in which a surface, which is the same as the uppermost surface TP of the separation insulating film SI and which is formed by the separation insulating films SI and the insulating films SI2, is polished by the CMP. Therefore, in the present embodiment, even when the entire surface of the uppermost surface of the intermediate region of the well resistance element is formed by the separation insulating films SI and the insulating films SI2 (silicon oxide films), the possibility that a problem such as the dishing occurs is excluded.

Eighth Embodiment

A well resistance element arranged in a resistance element region RE of the present embodiment will be described with reference to FIGS. 57 to 59.

Figure 57:
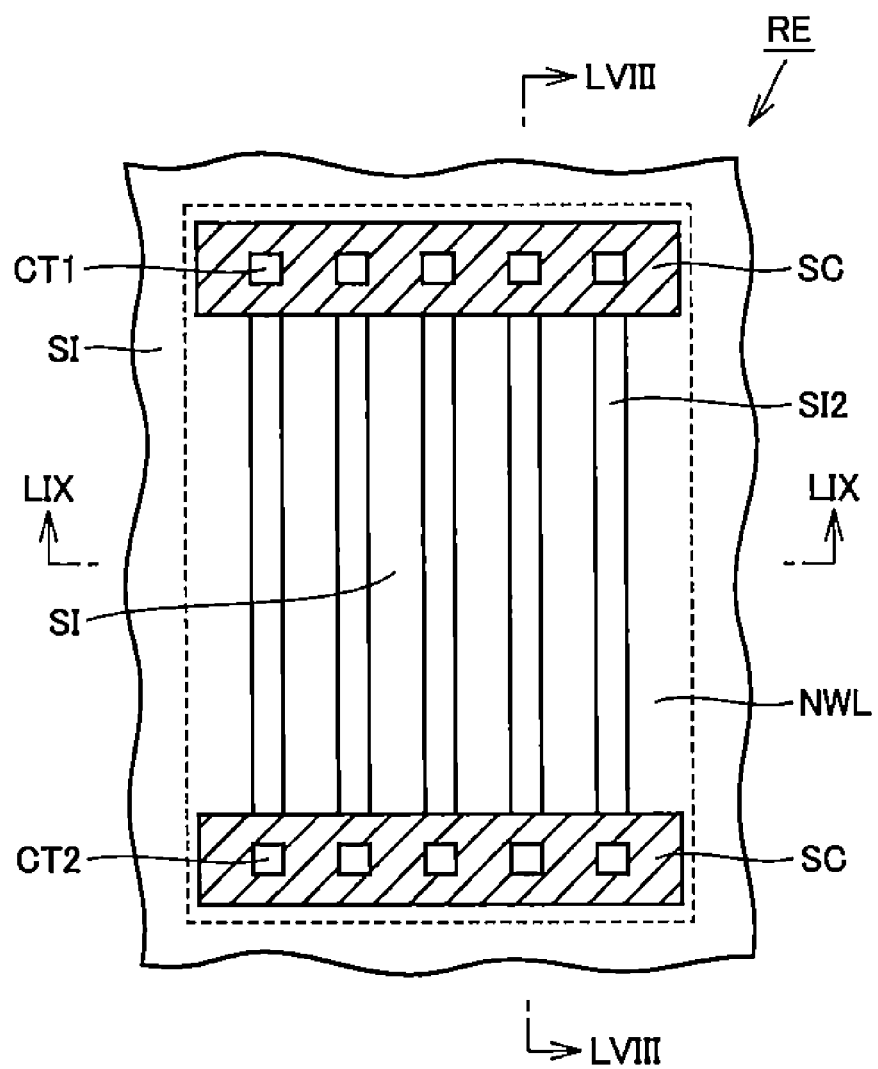
FIG. 57 is a schematic plan view showing a configuration of a resistance element region of an eighth embodiment.
Figure 58:
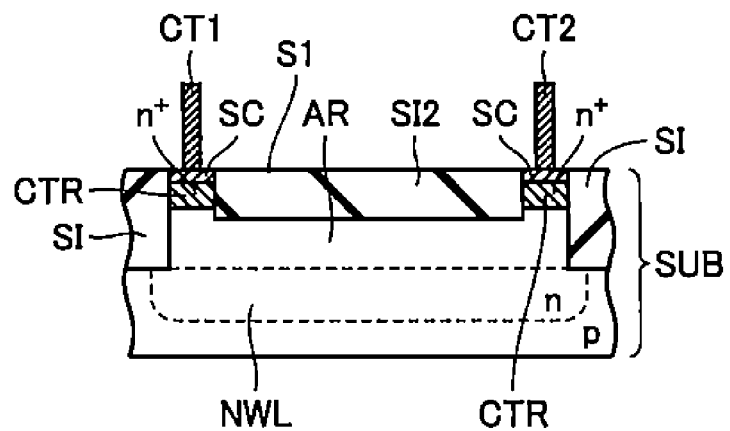
FIG. 58 is a schematic cross-sectional view taken along line LVIII-LVIII in FIG. 57.
Figure 59:
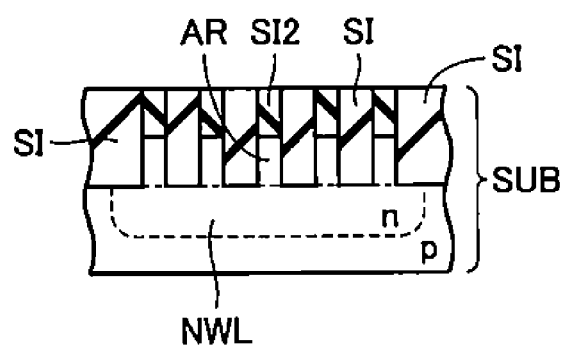
FIG. 59 is a schematic cross-sectional view taken along line LIX-LIX in FIG. 57.
Figure 60A:
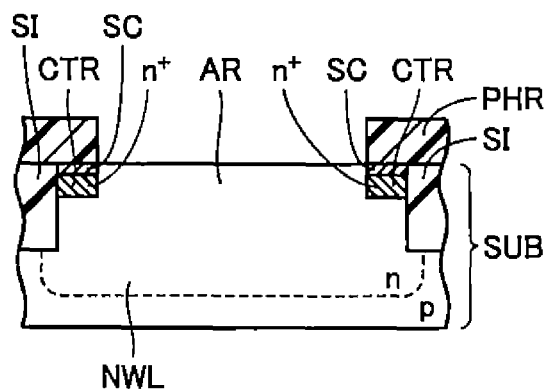
FIG. 60A is a schematic cross-sectional view showing a first process of a manufacturing method of the eighth embodiment in a region shown in the cross-sectional view in FIG. 58 in a region where a well resistance element should be formed.
Figure 60B:
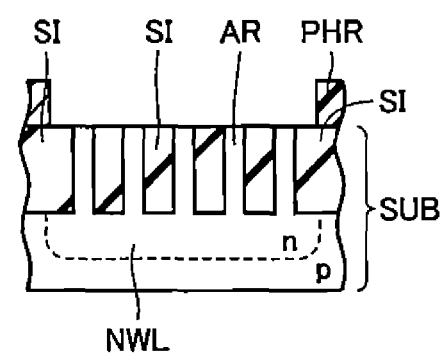
FIG. 60B is a schematic cross-sectional view showing the first process of the manufacturing method of the eighth embodiment in a region shown in the cross-sectional view in FIG. 59 in a region where a transistor should be formed.
Figure 61A:
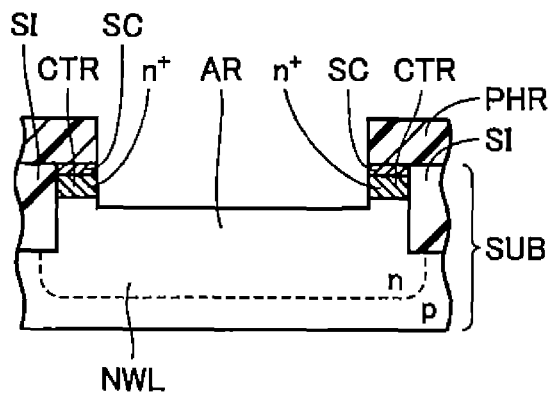
FIG. 61A is a schematic cross-sectional view showing a second process of the manufacturing method of the eighth embodiment in the region shown in the cross-sectional view in FIG. 58 in the region where the well resistance element should be formed.
Figure 61B:
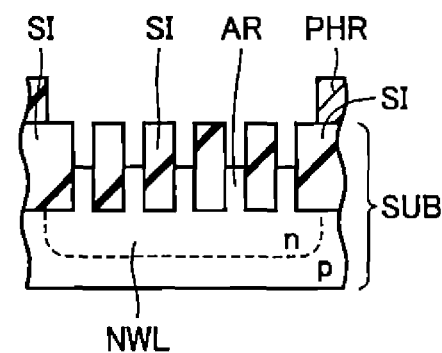
FIG. 61B is a schematic cross-sectional view showing the second process of the manufacturing method of the eighth embodiment in the region shown in the cross-sectional view in FIG. 59 in the region where the transistor should be formed.
Figure 62A:
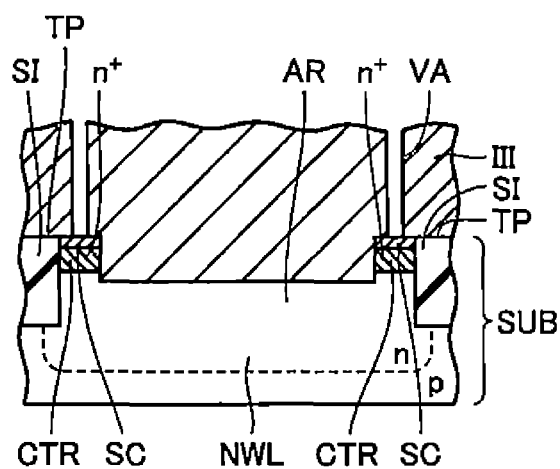
FIG. 62A is a schematic cross-sectional view showing a third process of the manufacturing method of the eighth embodiment in the region shown in the cross-sectional view in FIG. 58 in the region where the well resistance element should be formed.
Figure 62B:
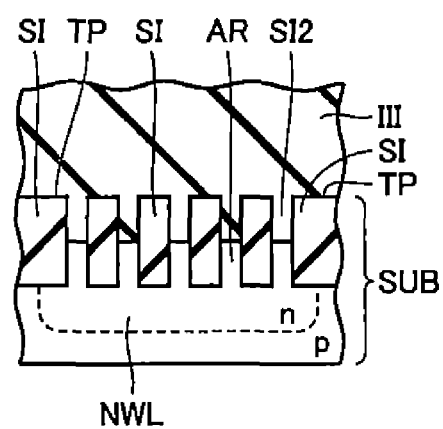
FIG. 62B is a schematic cross-sectional view showing the third process of the manufacturing method of the eighth embodiment in the region shown in the cross-sectional view in FIG. 59 in the region where the transistor should be formed.

With reference to FIGS. 57 to 59, in the resistance element region RE of the present embodiment, a well resistance element that has basically the same configuration as that of the well resistance element of the second embodiment is formed. However, in the well resistance element of the present embodiment, in the same manner as in the seventh embodiment, the insulating films SI2 (other separation insulating films) are formed so as to be in contact with the upper surface of the active region AR in the intermediate region. The insulating film SI2 is formed to include the same surface as the main surface S1 of the semiconductor substrate SUB. In other words, the well resistance element of the present embodiment has a configuration in which a configuration where the other separation insulating films in contact with the upper surface of the active region AR in the intermediate region of the seventh embodiment are arranged is combined with the well resistance element of the second embodiment.

The configuration of the present embodiment other than the above is substantially the same as the configurations of the second and seventh embodiments, so that the same components are denoted by the same reference symbols and the description thereof will not be repeated. With reference to FIGS. 60A to 62B, the method of manufacturing the configuration in which the insulating films SI2 are formed over, in particular, the active region AR in the intermediate region of the present embodiment is basically the same as the manufacturing method in the seventh embodiment shown in FIGS. 54A to 56C, so that the description thereof will not be repeated.

Next, operation and effect of the present embodiment will be described. The present embodiment also has an effect to suppress the dishing of the separation insulating film SI in the same manner as the embodiments described above and has the same operation and effect as those of the second embodiment. Further, also in the present embodiment, in the same manner as in the seventh embodiment, it is possible to further increase the resistance value of the entire well resistance element by the insulating films SI2 over the active region AR in the intermediate region. From the above, also in the present embodiment, it is possible to provide a high withstand voltage well resistance element where the variation of resistance value is further reduced and the resistance value is further increased.

Ninth Embodiment

A well resistance element arranged in a resistance element region RE of the present embodiment will be described with reference to FIG. 63.

Figure 63:
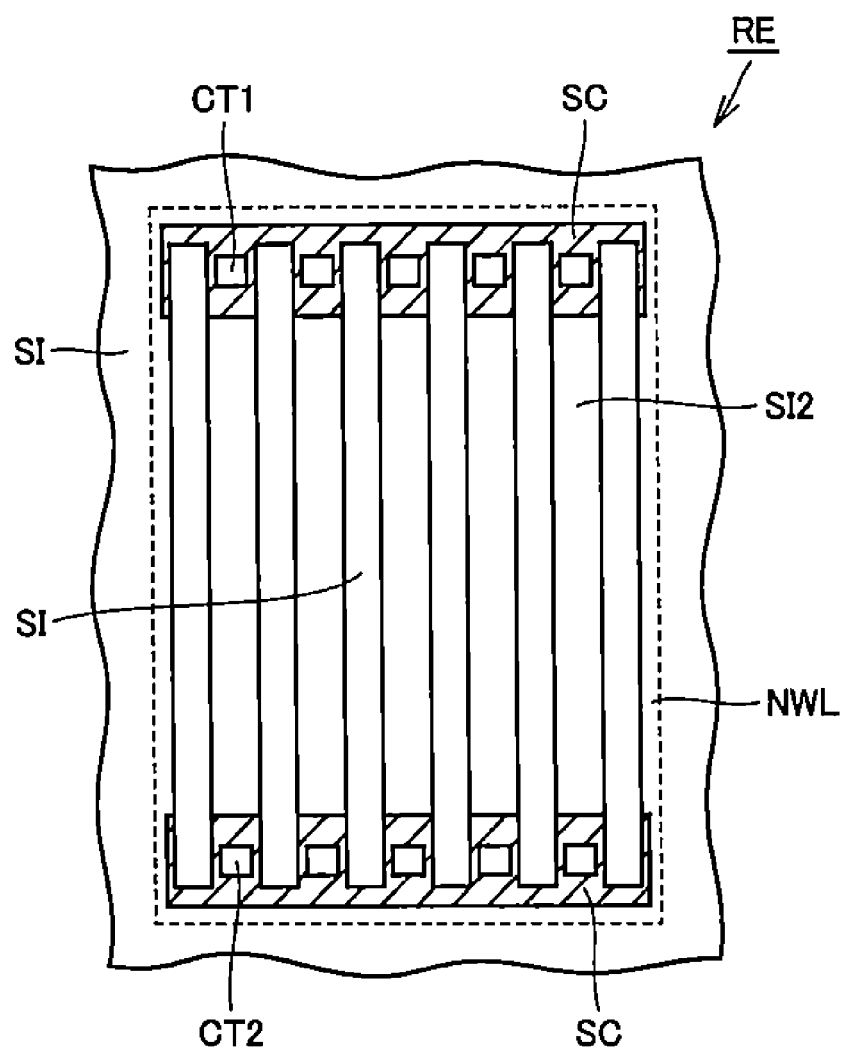
FIG. 63 is a schematic plan view showing a configuration of a resistance element region of a ninth embodiment.

With reference to FIG. 63, in the resistance element region RE of the present embodiment, a well resistance element that has basically the same configuration as that of the well resistance element of the third embodiment is formed. However, in the well resistance element of the present embodiment, in the same manner as in the seventh embodiment, the insulating films SI2 (other separation insulating films) are formed so as to be in contact with the upper surface of the active region AR in the intermediate region. The insulating film SI2 is formed to include the same surface as the main surface S1 of the semiconductor substrate SUB. In other words, the well resistance element of the present embodiment has a configuration in which a configuration where the other separation insulating films in contact with the upper surface of the active region AR in the intermediate region of the seventh embodiment are arranged is combined with the well resistance element of the third embodiment.

The configuration of the present embodiment other than the above is substantially the same as the configurations of the third and seventh embodiments, so that the same components are denoted by the same reference symbols and the description thereof will not be repeated. Further, the method of manufacturing the configuration in which the insulating films SI2 are formed over, in particular, the active region AR in the intermediate region of the present embodiment is basically the same as the manufacturing method in the seventh embodiment shown in FIGS. 54A to 56C, so that the description thereof will not be repeated.

Next, operation and effect of the present embodiment will be described. The present embodiment also has an effect to suppress the dishing of the separation insulating film SI in the same manner as the embodiments described above and has the same operation and effect as those of the third embodiment. Further, also in the present embodiment, in the same manner as in the seventh embodiment, it is possible to further increase the resistance value of the entire well resistance element by the insulating films SI2 over the active region AR in the intermediate region. From the above, also in the present embodiment, it is possible to provide a high withstand voltage well resistance element where the variation of resistance value is further reduced and the resistance value is further increased.

Tenth Embodiment

Figure 64:
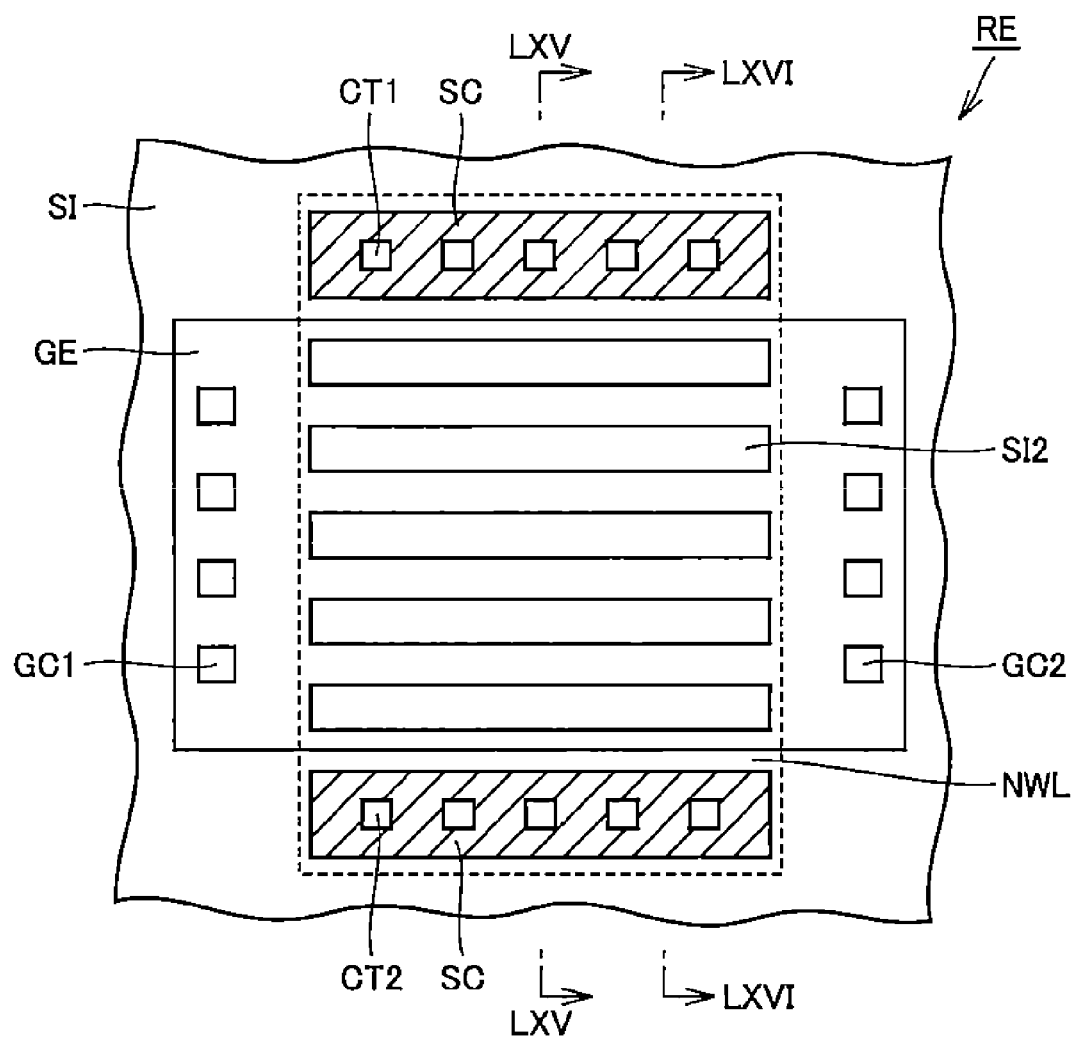
FIG. 64 is a schematic plan view showing a configuration of a resistance element region of a tenth embodiment.
Figure 65:
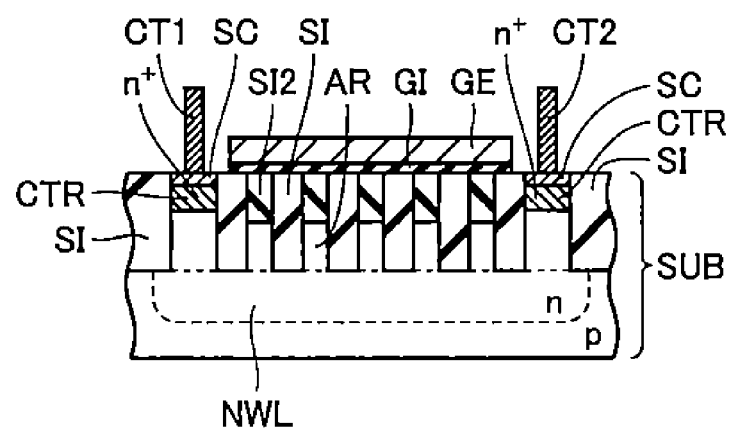
FIG. 65 is a schematic cross-sectional view taken along line LXV-LXV in FIG. 64.
Figure 66:
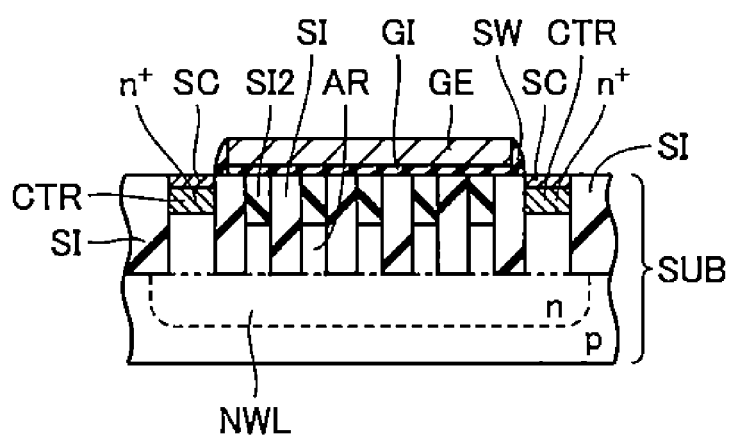
FIG. 66 is a schematic cross-sectional view taken along line LXVI-LXVI in FIG. 64.

With reference to FIGS. 64 to 66, the present embodiment is a combination of the configuration in which the insulating films SI2 (interlayer insulating films) are arranged over the active region AR described in the seventh embodiment and the configuration in which the gate electrode GE and the like are formed in the intermediate region described in the fourth embodiment. Even in such a configuration, in the same manner as in the other embodiments, it is possible to provide a high withstand voltage well resistance element which has the effect to suppress the dishing of the separation insulating film SI and in which the variation of resistance value is further reduced and the resistance value is further increased.

Eleventh Embodiment

Figure 67:
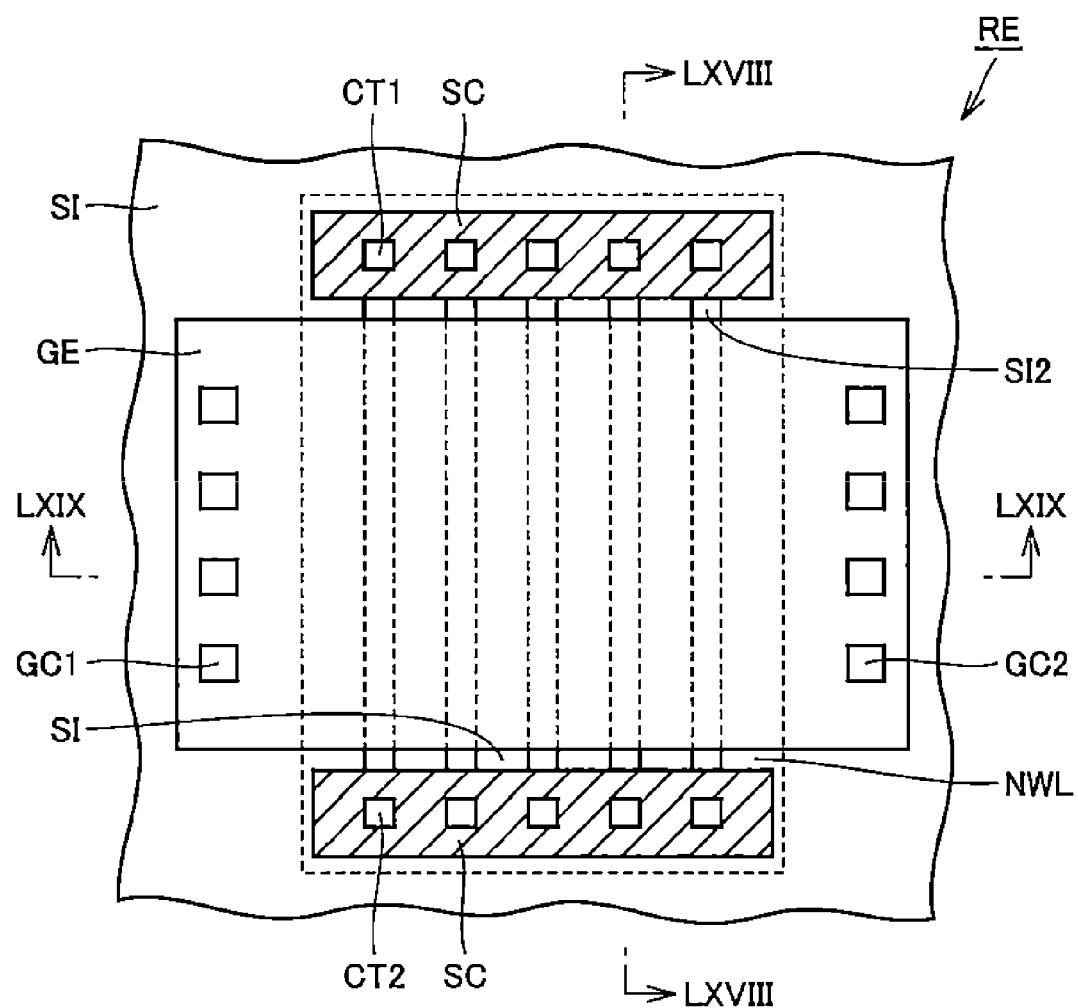
FIG. 67 is a schematic plan view showing a configuration of a resistance element region of an eleventh embodiment.
Figure 68:
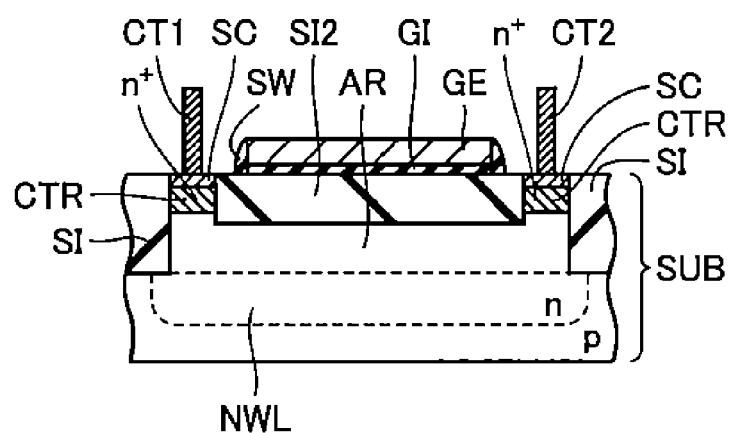
FIG. 68 is a schematic cross-sectional view taken along line LXVIII-LXVIII in FIG. 67.
Figure 69:
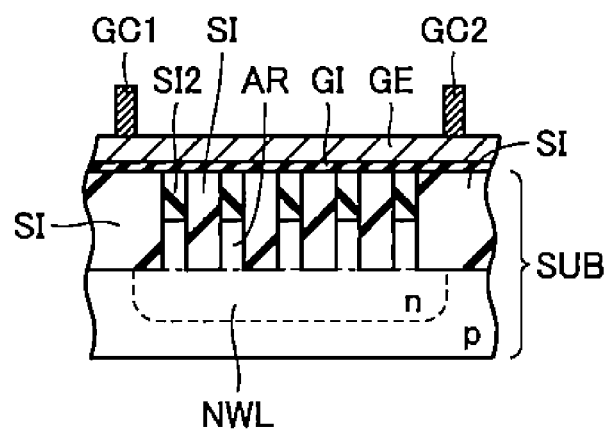
FIG. 69 is a schematic cross-sectional view taken along line LXIX-LXIX in FIG. 67.

With reference to FIGS. 67 to 69, the present embodiment is a combination of the configuration in which the insulating films SI2 (interlayer insulating films) are arranged over the active region AR described in the eighth embodiment and the configuration in which the gate electrode GE and the like are formed in the intermediate region described in the fifth embodiment. Even in such a configuration, in the same manner as in the other embodiments, it is possible to provide a high withstand voltage well resistance element which has the effect to suppress the dishing of the separation insulating film SI and in which the variation of resistance value is further reduced and the resistance value is further increased.

Twelfth Embodiment

Figure 70:
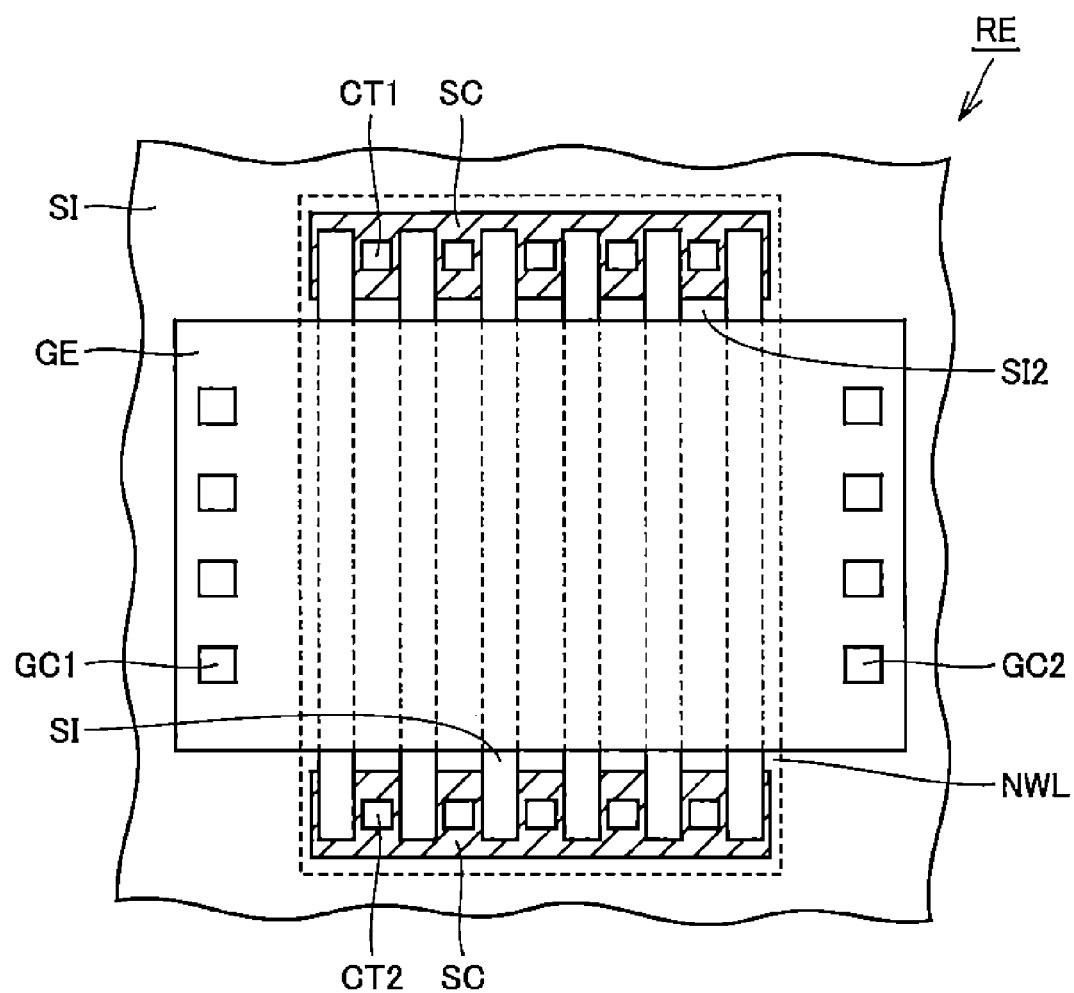
FIG. 70 is a schematic plan view showing a configuration of a resistance element region of a twelfth embodiment.

With reference to FIG. 70, the present embodiment is a combination of the configuration in which the insulating films SI2 (interlayer insulating films) are arranged over the active region AR described in the ninth embodiment and the configuration in which the gate electrode GE and the like are formed in the intermediate region described in the sixth embodiment. Even in such a configuration, in the same manner as in the other embodiments, it is possible to provide a high withstand voltage well resistance element which has the effect to suppress the dishing of the separation insulating film SI and in which the variation of resistance value is further reduced and the resistance value is further increased.

Some of the contents described in the embodiments are described below.

(1) A semiconductor device includes a semiconductor substrate, a well region, an input terminal and an output terminal, a separation insulating film, and an active region. The semiconductor substrate has a main surface. The well region is formed in the semiconductor substrate. The input terminal and the output terminal are arranged over the semiconductor substrate so as to be electrically coupled to the well region. The separation insulating film is arranged to be in contact with the upper surface of the well region in an intermediate region between the input terminal and the output terminal in a direction along the main surface. The active region is arranged to be in contact with the upper surface of the well region in the semiconductor substrate. The separation insulating film and the active region in the intermediate region have an elongated shape in plan view. In the intermediate region, a plurality of separation insulating films and a plurality of active regions are arranged so that the separation insulating film and the active region are alternately and repeatedly arranged. Other separation insulating films are arranged so as to be in contact with the upper surface of the active region in the intermediate region, and the separation insulating film and the other separation insulating film are alternately and repeatedly arranged in the intermediate region, so that the other separation insulating films are formed so as to include the same surface as the main surface of the semiconductor substrate. A gate insulating film and a gate electrode are laminated in this order so as to cover the main surface of the semiconductor substrate in the intermediate region.

(2) In the semiconductor device of (1), the separation insulating film in the intermediate region extends in a direction crossing a direction connecting the input terminal and the output terminal in plan view.

(3) In the semiconductor device of (1), the separation insulating film in the intermediate region extends in a direction along a direction connecting the input terminal and the output terminal in plan view.

(4) In the semiconductor device of (1), a plurality of input terminals and a plurality of output terminals are respectively arranged with a gap between them in plan view. The separation insulating film in the intermediate region extends so as to reach a region sandwiched by a pair of input terminals adjacent to each other in plan view among the plurality of input terminals and a region sandwiched by a pair of output terminals adjacent to each other in plan view among the plurality of output terminals.

(5) In a method of manufacturing a semiconductor device, first, a plurality of grooves each having an elongated shape in plan view is formed with a gap between them in a main surface of the semiconductor device by using a plurality of mask patterns. A separation insulating film is formed by burying an insulating film into the groove. A well region in contact with the lower surface of the separation insulating film in the semiconductor substrate and an active region in contact with the upper surface of the well region are formed. An input terminal and an output terminal are formed over the semiconductor substrate so as to be electrically coupled to the well region. In an intermediate region between the input terminal and the output terminal, the separation insulating film and the active region have an elongated shape in plan view. In the intermediate region, a plurality of separation insulating films and a plurality of active regions are formed so that the separation insulating film SI and the active region AR are alternately and repeatedly arranged. A part of the active region is removed from the uppermost surface of the active region in the depth direction. Another separation insulating film is formed by filling an opening formed by removing the active region. The other separation insulating film is formed to include the same surface as the main surface of the semiconductor substrate. A gate insulating film and a gate electrode are laminated in this order so as to cover the main surface of the semiconductor substrate in the intermediate region.

(6) In the method of manufacturing a semiconductor device of (5), the separation insulating film in the intermediate region is formed to extend in a direction crossing a direction connecting the input terminal and the output terminal in plan view.

(7) In the method of manufacturing a semiconductor device of (5), the separation insulating film in the intermediate region is formed to extend in a direction along a direction connecting the input terminal and the output terminal in plan view.

(8) In the method of manufacturing a semiconductor device of (5), a plurality of input terminals and a plurality of output terminals are formed with a gap between them in plan view.

The separation insulating film in the intermediate region is formed to extend so as to reach a region sandwiched by a pair of input terminals adjacent to each other in plan view among the plurality of input terminals and a region sandwiched by a pair of output terminals adjacent to each other in plan view among the plurality of output terminals.

While the invention made by the inventor has been specifically described based on the embodiments, the invention is not limited to the embodiments, but it is needless to say that the invention may be modified in various ways without departing from the scope of the invention.

What is claimed is:
1. A semiconductor device comprising:
   a semiconductor substrate including a main surface;
   a well region formed in the semiconductor substrate;
   a plurality of input terminals and a plurality of output terminals that are arranged over the semiconductor substrate so as to be electrically coupled to the well region;
   separation insulating films arranged in an intermediate region between the plurality of input terminals and the plurality of output terminals in a first direction along the main surface, the separation insulating films being in contact with an upper surface of the well region; and
   active regions arranged between two outmost separation insulating films of the separation insulating films in the intermediate region and being in contact with the upper surface of the well region in the semiconductor sub- strate, a distance between the two outmost separation insulating films being greater than distances of any other two of the separation insulating films, and the separation insulating films and the active regions being alternately arranged, wherein each of the separation insulating films and each of the active regions in the intermediate region have an elongated shape in plan view.

2. The semiconductor device according to claim 1, wherein the separation insulating films and the active regions form the same surface as the main surface of the semiconductor substrate.

3. The semiconductor device according to claim 1, wherein the first direction is a direction connecting the plurality of input terminals and the plurality of output terminals across the intermediate region in plan view, each active region in the intermediate region extends in a second direction crossing the first direction, and in the second direction, a length of each active region is greater than a greatest distance between any two of the plurality of input terminals or greater than a greatest distance between any of two of the plurality of output terminals.

4. The semiconductor device according to claim 1, wherein the first direction crosses a direction connecting the plurality of input terminals and the plurality of output terminals across the intermediate region in plan view, and each active region in the intermediate region extends in a second direction crossing the first direction and contacts with first and second conductive layers respectively disposed below the plurality of input terminals and the plurality of output terminals.

5. The semiconductor device according to claim 4, wherein the plurality of input terminals are spaced apart from each other, and the plurality of the output terminals are spaced apart from each other, and each separation insulating film in the intermediate region extends so as to reach a region sandwiched by a pair of input terminals adjacent to each other in plan view among the plurality of input terminals and a region sandwiched by a pair of output terminals adjacent to each other in plan view among the plurality of output terminals.

6. The semiconductor device according to claim 1, wherein each of the plurality of input terminals and the plurality of output terminals is electrically coupled with the well region by a contact region.

7. The semiconductor device according to claim 6, wherein the contact region has a conductivity type the same as the active regions and an impurity concentration greater than that of the active regions.

8. The semiconductor device according to claim 1, wherein additional separation insulating films are arranged to be in contact with upper surfaces of the active regions in the intermediate region, and the separation insulating films and the additional separation insulating films are alternately arranged in the intermediate region, so that the additional separation insulating films are formed to include the same surface as the main surface of the semiconductor substrate.

9. The semiconductor device according to claim 1, wherein the well region and the active regions are one integral layer.

10. The semiconductor device according to claim 9, wherein the well region and the active regions have the same impurities.

11. A semiconductor device comprising:
a semiconductor substrate including a main surface;
a well region formed in the semiconductor substrate;
an input terminal and an output terminal that are arranged over the semiconductor substrate so as to be electrically coupled to the well region;
separation insulating films arranged in an intermediate region between the input terminal and the output terminal in a direction along the main surface, the separation insulating films being in contact with an upper surface of the well region; and
active regions arranged between two outmost separation insulating films of the separation insulating films in the intermediate region and being in contact with the upper surface of the well region in the semiconductor substrate, a distance between the two outmost separation insulating films being greater than distances of any other two of the separation insulating films, and the separation insulating films and the active regions being alternately arranged,
wherein each of the separation insulating films and each of the active regions in the intermediate region have an elongated shape in plan view, and
a gate insulating film and a gate electrode are laminated in this order so as to cover the main surface of the semiconductor substrate in the intermediate region.

* * * * *